(12) United States Patent
Nagasaka

(10) Patent No.: US 7,782,442 B2
(45) Date of Patent: Aug. 24, 2010

(54) EXPOSURE APPARATUS, EXPOSURE METHOD, PROJECTION OPTICAL SYSTEM AND DEVICE PRODUCING METHOD

(75) Inventor: Hiroyuki Nagasaka, Kumagaya (JP)

(73) Assignee: Nikon Corporation, Tokyo (JP)

( * ) Notice: Subject to any disclaimer, the term of this patent is extended or adjusted under 35 U.S.C. 154(b) by 532 days.

(21) Appl. No.: 11/633,508

(22) Filed: Dec. 5, 2006

(65) Prior Publication Data

US 2007/0153247 A1 Jul. 5, 2007

Related U.S. Application Data

(60) Provisional application No. 60/750,795, filed on Dec. 16, 2005.

(30) Foreign Application Priority Data

Dec. 6, 2005 (JP) ............................. 2005-351658
Dec. 28, 2005 (JP) ............................. 2005-379137
Apr. 24, 2006 (JP) ............................. 2006-119212

(51) Int. Cl.
  *G03B 27/42* (2006.01)
(52) U.S. Cl. ..................... 355/67; 355/46; 355/53; 355/55; 355/77; 356/399
(58) Field of Classification Search ................ 355/30, 355/53, 40, 46, 67, 55, 77; 356/252, 399–401; 359/373; 250/491.1, 492.2, 548; 378/34
  See application file for complete search history.

(56) References Cited

U.S. PATENT DOCUMENTS

| | | | | |
|---|---|---|---|---|
| 3,950,094 | A | * | 4/1976 | Kano et al. .................... 355/45 |
| 4,054,386 | A | * | 10/1977 | Suzuki ........................ 356/153 |
| 4,367,046 | A | * | 1/1983 | Lacombat .................... 356/400 |
| 5,473,410 | A | | 12/1995 | Nishi |
| 5,825,043 | A | | 10/1998 | Suwa |
| 5,940,528 | A | | 8/1999 | Tanaka et al. |
| 5,969,441 | A | | 10/1999 | Loopstra et al. |
| 6,195,153 | B1 | | 2/2001 | Shimizu |

(Continued)

FOREIGN PATENT DOCUMENTS

EP 1 420 298 5/2004

(Continued)

*Primary Examiner*—Edward J Glick
*Assistant Examiner*—Colin Kreutzer
(74) *Attorney, Agent, or Firm*—Oliff & Berridge, PLC

(57) ABSTRACT

An exposure apparatus includes an optical unit which defines a first exposure area and a second exposure area at different positions in a first direction and which radiates exposure light beams onto the first and second exposure areas respectively; and a first movement system which moves the first exposure area and the second exposure area relative to a substrate in the first direction. The exposure light beams are radiated by the optical unit onto the first and second exposure areas respectively while moving the first and second exposure areas relative to a predetermined area on the substrate. Accordingly, the predetermined area on the substrate is subjected to multiple exposure with an image of a first pattern formed by the exposure light beam radiated onto the first exposure area and an image of a second pattern formed by the exposure light beam radiated onto the second exposure area. The deterioration of the throughput can be suppressed, and the substrate can be subjected to the multiple exposure efficiently.

52 Claims, 18 Drawing Sheets

U.S. PATENT DOCUMENTS

| | | | |
|---|---|---|---|
| 6,341,007 B1 | 1/2002 | Nishi et al. | |
| 6,400,441 B1 | 6/2002 | Nishi et al. | |
| 6,549,269 B1 | 4/2003 | Nishi et al. | |
| 6,590,634 B1 | 7/2003 | Nishi et al. | |
| 6,611,316 B2 * | 8/2003 | Sewell | 355/46 |
| 6,710,848 B2 * | 3/2004 | Taniguchi | 355/53 |
| 6,721,034 B1 | 4/2004 | Horikawa | |
| 6,778,257 B2 | 8/2004 | Bleeker et al. | |
| 6,819,405 B2 | 11/2004 | Mulkens et al. | |
| 6,897,963 B1 | 5/2005 | Taniguchi et al. | |
| 6,952,253 B2 | 10/2005 | Lof et al. | |
| 6,995,833 B2 | 2/2006 | Kato et al. | |
| 7,023,610 B2 | 4/2006 | Ohtsuki et al. | |
| 7,088,425 B2 | 8/2006 | Tanaka et al. | |
| 2002/0123012 A1 | 9/2002 | Sewell | |
| 2002/0180943 A1 | 12/2002 | Mulkens et al. | |
| 2003/0231663 A1 * | 12/2003 | Ohtsuki et al. | 372/22 |
| 2004/0165159 A1 | 8/2004 | Lof et al. | |
| 2004/0233405 A1 | 11/2004 | Kato et al. | |
| 2005/0248856 A1 | 11/2005 | Omura et al. | |
| 2005/0280791 A1 | 12/2005 | Nagasaka et al. | |
| 2006/0055907 A1 | 3/2006 | Kato et al. | |
| 2006/0121364 A1 | 6/2006 | Omura | |
| 2006/0231206 A1 | 10/2006 | Nagasaka et al. | |
| 2007/0013890 A1 | 1/2007 | Loopstra et al. | |

FOREIGN PATENT DOCUMENTS

| | | |
|---|---|---|
| JP | A 59-123230 | 7/1984 |
| JP | A 05-175102 | 7/1993 |
| JP | A 6-124873 | 5/1994 |
| JP | A 07-057986 | 3/1995 |
| JP | A 08-130179 | 5/1996 |
| JP | A 8-313842 | 11/1996 |
| JP | A 09-045603 | 2/1997 |
| JP | A 10-163099 | 6/1998 |
| JP | A 10-214783 | 8/1998 |
| JP | A 10-232497 | 9/1998 |
| JP | A 10-303114 | 11/1998 |
| JP | A 11-135400 | 5/1999 |
| JP | A 2000-021742 | 1/2000 |
| JP | A 2000-505958 | 5/2000 |
| JP | A 2000-164504 | 6/2000 |
| JP | A 2000-284492 | 10/2000 |
| JP | A 2001-510577 | 7/2001 |
| JP | A 2001-291654 | 10/2001 |
| JP | A 2001-297976 | 10/2001 |
| JP | A 2003-045797 | 2/2003 |
| JP | A 2004-519850 | 7/2004 |
| JP | A 2004-289126 | 10/2004 |
| JP | A 2004-304135 | 10/2004 |
| JP | A 2005-039211 | 2/2005 |
| WO | WO 99/23692 A1 | 5/1999 |
| WO | WO 99/28790 A1 | 6/1999 |
| WO | WO 99/46835 | 9/1999 |
| WO | WO 99/49504 A1 | 9/1999 |
| WO | WO 02/069049 A1 | 9/2002 |
| WO | WO 2004/019128 A2 | 3/2004 |
| WO | WO 2004/055803 A1 | 7/2004 |
| WO | WO 2004/057590 A1 | 7/2004 |
| WO | WO 2004/086468 A1 | 10/2004 |
| WO | WO 2004/090634 A2 | 10/2004 |
| WO | WO 2004/107011 A1 | 12/2004 |
| WO | WO 2005/029559 A1 | 3/2005 |
| WO | WO 2005/059617 A2 | 6/2005 |
| WO | WO 2005/059618 A2 | 6/2005 |

* cited by examiner

AREA IRRADIATED WITH DETECTING LIGHT BEAM

IMAGE OF SECOND ALIGNMENT MARK, IMAGE OF ($RM2_7$)

IMAGE OF FIRST ALIGNMENT MARK, IMAGE OF ($RM1_7$)

EXPOSURE APPARATUS, EXPOSURE METHOD, PROJECTION OPTICAL SYSTEM AND DEVICE PRODUCING METHOD

CROSS-REFERENCES TO RELATED APPLICATIONS

This application claims the benefit of priority of Japanese Patent Application No. 2005-351658 filed on Dec. 6, 2005, Japanese Patent Application No. 2005-379137 filed on Dec. 28, 2005, Japanese Patent Application No. 2006-119212 filed on Apr. 24, 2006, and U.S. Provisional Application No. 60/750,795 filed on Dec. 16, 2005, the entire disclosures of which are incorporated herein by reference.

BACKGROUND OF THE INVENTION

1. Field of the Invention

The present invention relates to an exposure apparatus and an exposure method for exposing a substrate, a device producing method, and a projection optical system.

2. Description of the Related Art

An exposure apparatus, which performs the multiple exposure for the substrate, is known as disclosed, for example, in Japanese Patent Application Laid-open No. 10-214783 in relation to the exposure apparatus to be used in the photolithography steps.

When the multiple exposure is performed, then a plurality of masks are prepared to execute the exposure with each of the masks in some cases, and a plurality of illumination conditions are prepared to execute the exposure under the different illumination conditions with each of the masks in other cases. In such situations, it is necessary to provide the period of time in which the mask is changed and/or the period of time in which the illumination condition or the like is changed. Therefore, the rate of operation of the exposure apparatus may be possibly lowered, and the throughput may be possibly lowered.

SUMMARY OF THE INVENTION

The present invention has been made taking the foregoing situations into consideration, an object of which is to provide an exposure apparatus, an exposure method, a device producing method, and a projection optical system, in which the deterioration of the throughput is suppressed, and the substrate can be subjected to the multiple exposure efficiently.

In order to achieve the object as described above, the present invention adopts the following constructions corresponding to respective drawings as illustrated in embodiments. However, parenthesized reference numerals affixed to respective elements merely exemplify the elements by way of example, with which it is not intended to limit the respective elements.

According to a first aspect of the present invention, there is provided an exposure apparatus which exposes a substrate; the exposure apparatus comprising an optical unit which defines a first exposure area and a second exposure area at different positions in a first direction and which radiates exposure light beams onto the first exposure area and the second exposure area respectively; and a first movement system which moves the first exposure area and the second exposure area relative to the substrate in the first direction; wherein the exposure light beams are radiated by the optical unit onto the first exposure area and the second exposure area respectively while moving the first exposure area and the second exposure area relative to a predetermined area on the substrate to thereby perform multiple exposure for the predetermined area on the substrate with a first pattern image which is formed by the exposure light beam radiated onto the first exposure area and a second pattern image which is formed by the exposure light beam radiated onto the second exposure area and which is different from the first pattern image.

According to the first aspect of the present invention, the substrate can be subjected to the multiple exposure efficiently.

According to a second aspect of the present invention, there is provided a method for producing a device, comprising using the exposure apparatus as defined in the foregoing aspect.

According to the second aspect of the present invention, the device can be produced by using the exposure apparatus with which the substrate can be subjected to the multiple exposure efficiently.

According to a third aspect of the present invention, there is provided an exposure method for exposing a substrate, the exposure method comprising radiating exposure light beams onto a first exposure area and a second exposure area defined at different positions in a first direction respectively; and moving the substrate in the first direction so that a predetermined area on the substrate is moved relative to the first exposure area and the second exposure area to thereby perform multiple exposure for the predetermined area on the substrate with a first pattern image which is formed by the exposure light beam radiated onto the first exposure area and a second pattern image which is formed by the exposure light beam radiated onto the second exposure area and which is different from the first pattern image.

According to the third aspect of the present invention, the substrate can be subjected to the multiple exposure efficiently.

According to a fourth aspect of the present invention, there is provided a projection optical system which projects an image of a predetermined pattern onto a substrate, the projection optical system comprising a first optical system which forms a first conjugate position optically conjugate with a first pattern based on an exposure light beam via the first pattern; a second optical system which forms a second conjugate position optically conjugate with a second pattern based on an exposure light beam via the second pattern; a third optical system which optically conjugates the substrate and the first conjugate position and which optically conjugates the substrate and the second conjugate position based on the exposure light beam from the first optical system and the exposure light beam from the second optical system; and an intermediate optical system which is arranged in an optical path between the first optical system and the third optical system and in an optical path between the second optical system and the third optical system so as to introduce the exposure light beam from the first optical system and the exposure light beam from the second optical system into the third optical system.

According to the fourth aspect of the present invention, it is possible to miniaturize the projection optical system which radiates, onto the substrate, each of the exposure light beam via the first pattern and the exposure light beam via the second pattern.

According to a fifth aspect of the present invention, there is provided an exposure apparatus which exposes a substrate, the exposure apparatus comprising an optical unit which defines a first exposure area and a second exposure area at different positions in a first direction and which radiates exposure light beams onto the first exposure area and the second exposure area respectively; and a first movement system which moves the first exposure area and the second exposure area relative to the substrate in the first direction; wherein the optical unit includes the projection optical system as defined in the foregoing aspect; and the exposure light beams are radiated by the optical unit onto the first exposure area and the second exposure area respectively while moving the first exposure area and the second exposure area relative to a predetermined area on the substrate to thereby perform multiple exposure for the predetermined area on the substrate with a first pattern image which is formed by the exposure light beam radiated onto the first exposure area and a second pattern image which is formed by the exposure light beam radiated onto the second exposure area and which is different from the first pattern image.

According to the fifth aspect of the present invention, the substrate can be subjected to the multiple exposure efficiently by using the projection optical system as defined in the foregoing aspect.

According to a sixth aspect of the present invention, there is provided an exposure apparatus which exposes a substrate, the exposure apparatus comprising an optical unit which radiates a first exposure light beam from a first area disposed on a first predetermined surface onto a first exposure area and which radiates a second exposure light beam from a second area disposed on a second predetermined surface onto a second exposure area; and a detecting system having a light-receiving unit which receives a detecting light beam via the first predetermined surface and the second predetermined surface and which obtains information about a positional relationship between a first pattern arranged in the first area and a second pattern arranged in the second area based on a light-receiving result of the light-receiving unit.

According to the sixth aspect of the present invention, the substrate can be subjected to the multiple exposure efficiently by using the obtained information about the positional relationship between the first pattern and the second pattern.

According to a seventh aspect of the present invention, there is provided a method for producing a device, comprising using the exposure apparatus as defined in the foregoing aspect.

According to the seventh aspect of the present invention, the device can be produced by using the exposure apparatus with which the substrate can be subjected to the multiple exposure efficiently.

According to an eighth aspect of the present invention, there is provided an exposure method for exposing a substrate, the exposure method comprising radiating a first exposure light beam from a first area disposed on a first predetermined surface onto a first exposure area and radiating a second exposure light beam from a second area disposed on a second predetermined surface onto a second exposure area; detecting a light beam via the first predetermined surface and the second predetermined surface; and obtaining information about a positional relationship between a first pattern arranged in the first area and a second pattern arranged in the second area based on a detection result.

According to the eighth aspect of the present invention, the substrate can be subjected to the multiple exposure efficiently by using the obtained information about the positional relationship between the first pattern and the second pattern.

According to a ninth aspect of the present invention, there is provided a method for producing a device, comprising performing multiple exposure for a substrate by using the exposure method as defined in the third or eighth aspect; developing the substrate for which the multiple exposure has been performed; and processing the developed substrate.

According to the ninth aspect of the present invention, it is possible to produce the device by using the exposure method with which the substrate can be subjected to the multiple exposure efficiently.

According to the present invention, the deterioration of the throughput can be suppressed, the substrate can be subjected to the multiple exposure efficiently, and it is possible to improve the productivity of the device.

DESCRIPTION OF THE PREFERRED EMBODIMENTS

Embodiments of the present invention will be explained below with reference to the drawings. However, the present invention is not limited thereto. In the following description, XYZ rectangular coordinates system is assumed. The positional relationship concerning respective members will be explained with reference to the XYZ rectangular coordinates system. The X axis direction is a predetermined direction in a horizontal plane. The Y axis direction is a direction which is perpendicular to the X axis direction in the horizontal plane. The Z axis direction is a direction which is perpendicular to the X axis direction and the Y axis direction respectively (i.e., the vertical direction). The directions of rotation (inclination) about the X axis, the Y axis, and the Z axis are designated as the θX, θY, and θZ directions respectively.

First Embodiment

Figure 1:
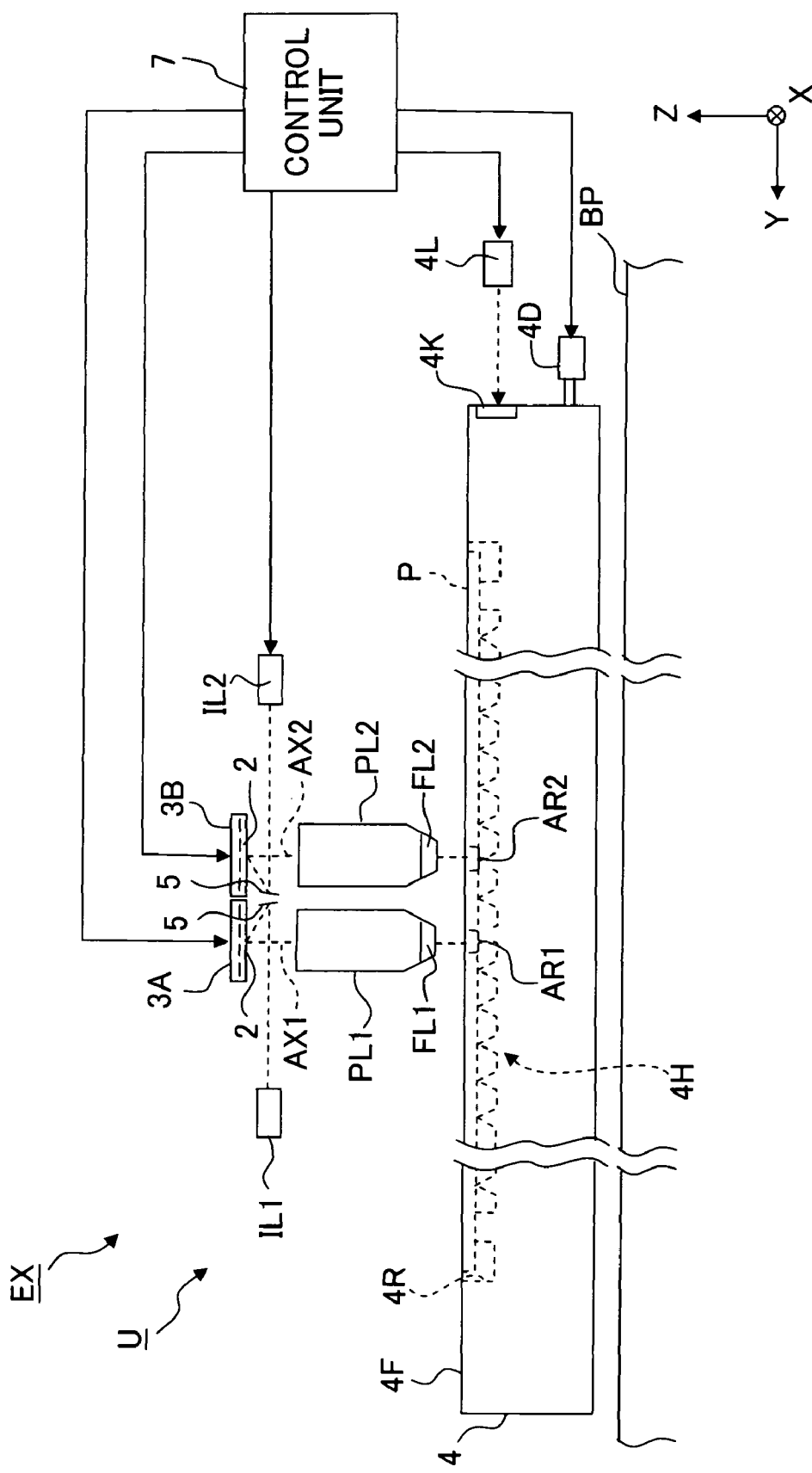
FIG. 1 shows a schematic arrangement view illustrating an exposure apparatus according to a first embodiment.

A first embodiment will be explained. FIG. 1 shows a schematic arrangement view illustrating an exposure apparatus EX according to a first embodiment. The exposure apparatus EX of this embodiment includes an optical unit U which defines a first exposure area AR1 and a second exposure area AR2 at mutually different positions on a predetermined surface (XY plane) and which radiates exposure light beams EL onto the first exposure area AR1 and the second exposure area AR2 respectively; a substrate stage 4 which is movable while holding a substrate P in a predetermined area including the first exposure area AR1 and the second exposure area AR2 to be irradiated with the exposure light beams EL; and a control unit 7 which controls the operation of the entire exposure apparatus EX. In this embodiment, the optical unit U defines the first exposure area AR1 and the second exposure area AR2 at the different positions in the Y axis direction. The substrate referred to herein includes those in which a base material, including, for example, a semiconductor wafer such as a silicon wafer is coated with various films such as photosensitive materials (photoresists) and protective films (top coat films).

The substrate stage 4 is movable while holding the substrate P in the predetermined area including the first exposure area AR1 onto which the exposure light beam EL is radiated and the second exposure area AR2 onto which the exposure light beam EL is radiated.

The optical unit U is capable of forming an image of a first pattern with the exposure light beam EL which is radiated onto the first exposure area AR1. The optical unit U is capable of forming an image of a second pattern with the exposure light beam EL which is radiated onto the second exposure area AR2. In this embodiment, the first pattern and the second pattern are different from each other.

The exposure apparatus EX includes a first pattern-forming unit 3A which forms the image of the first pattern (first pattern image) on the substrate P, and a first illumination system IL1 which has a light source unit (not shown) capable of radiating the exposure light beam EL and an illumination optical system (not shown) including a plurality of optical members and which radiates the first pattern-forming unit 3A with the exposure light beam EL via the illumination optical system. The optical unit U includes a first projection system (optical system) PL1 which projects, onto the substrate P, the image of the pattern formed by the first pattern-forming unit 3A in a first illumination area IA1 (not shown in FIG. 1) to be irradiated with the exposure light beam EL.

The illumination optical system of the first illumination system IL1 includes, for example, a shaping optical system which varies the illumination condition of the first pattern-forming unit 3A, an illuminance-uniformizing member (for example, an inner surface reflection type integrator or a fly's eye lens) which uniformizes the illuminance distribution of the exposure light beam EL in the first pattern-forming unit 3A, a mask blind system (also referred to as "masking system" or "variable field diaphragm") which defines the first illumination area IA1 on the first pattern-forming unit 3A, a relay optical system, and the like.

The shaping optical system includes, for example, an exchangeable diffraction optical element, a plurality of prisms having variable spacing distances (for example, an axicon), and a zoom optical system (afocal system). The intensity distribution of the exposure light beam EL, which is obtained on the pupil plane of the illumination optical system optically conjugate with the pupil plane of the first projection system PL1, is changed by at least one of the exchange of the diffraction optical element, the movement of the prism or prisms (change of the spacing distance or distances), and the movement of the zoom optical system (in other words, the shape and/or the size of the secondary light source formed on the pupil plane of the illumination optical system is changed). Accordingly, the illumination condition of the first pattern-forming unit 3A is changed. Therefore, the illumination optical system can set the illumination condition corresponding to the pattern formed by the first pattern-forming unit 3A. Further, it is also possible to change the illumination condition corresponding to the change of the pattern.

At least a part or parts of the mask blind system, for example, a plurality of shield plates (masking blades) which are movable independently are arranged on a plane which is substantially optically conjugate with the surface of the first pattern-forming unit 3A in the illumination optical system. For example, the size (width) of the first illumination area IA1 on the first pattern-forming unit 3A is changed by moving at least one of the plurality of shield plates. Therefore, the mask blind system can be used to adjust, for example, the size (width) of the first exposure area AR1 (projection area of the image of the first pattern conjugate with the first illumination area in relation to the first projection system PL1). That is, it is possible to control the start and the end of the scanning exposure for the substrate performed with the exposure light beam EL radiated onto the first exposure area AR1. Accordingly, any unnecessary exposure is avoided for shot areas other than one shot area on the substrate P to be subjected to the multiple exposure by performing the scanning exposure operation one time. The unnecessary exposure may be avoided also by controlling the light source unit.

The exposure apparatus EX further includes a second pattern-forming unit 3B which forms the image of the second pattern (second pattern image) on the substrate P, and a second illumination system IL2 which has a light source unit (not shown) capable of radiating the exposure light beam EL and an illumination optical system (not shown) including a plurality of optical members and which radiates the second pattern-forming unit 3B with the exposure light beam EL via the illumination optical system. The optical unit U includes a second projection system (optical system) PL2 which projects, onto the substrate P, the image of the pattern formed by the second pattern-forming unit 3B in a second illumination area IA2 (not shown in FIG. 1) to be irradiated with the exposure light beam EL. In this embodiment, the illumination optical system of the second illumination system IL2 is constructed in the same manner as the illumination optical system of the first illumination system IL1. Therefore, any detailed explanation thereof is omitted. The exposure apparatus EX of this embodiment includes the first and second illumination systems IL1, IL2 each of which has the illumination optical system including, for example, the shaping optical system and the mask blind system. Therefore, the illumination conditions can be set independently for the first pattern-forming unit 3A and the second pattern-forming unit 3B respectively. Further, the widths of the first and second exposure areas AR1, AR2 in the scanning direction (Y axis direction) can be adjusted mutually independently in synchronization with the movement of the substrate P during the scanning exposure. That is, it is possible to independently control the start and the end of each of the first scanning exposure for the substrate by using the exposure light beam EL radiated onto the first exposure area AR1 and the second scanning exposure for the substrate by using the exposure light beam EL radiated onto the second exposure area AR2.

A part or parts of the first illumination system IL1 and the second illumination system IL2 may be commonly used. For example, the exposure light beam EL may be supplied from a single light source unit to the illumination optical systems of the first and second illumination systems IL1, IL2 respectively. Further, a part or parts of the illumination optical system may be used commonly. In the exposure apparatus EX of this embodiment, for example, it is preferable that the first optical system, which is included in the illumination optical system and which is arranged on the upstream side as compared with the shaping optical system, is commonly used for the first and second illumination systems IL1, IL2, and the shaping optical systems and the second optical systems including the optical members arranged on the downstream side thereof are provided for each of the first and second illumination systems IL1, IL2. In this arrangement, the light source unit may be used commonly. Each of the first and second pattern-forming units 3A, 3B is illuminated with the exposure light beam EL by the light source unit and the illumination system having the illumination optical system including the first optical system and the pair of second optical systems.

The first and second illumination systems IL1, IL2 illuminates the first and second pattern-forming units 3A, 3B, respectively, with the exposure light beam EL. Light beams usable as the exposure light beam EL to be radiated from each of the first and second illumination systems IL1, IL2 include, for example, emission lines (g-ray, h-ray, i-ray) radiated, for example, from a mercury lamp, far ultraviolet light beams (DUV light beams) such as the KrF excimer laser beam (wavelength: 248 nm), and vacuum ultraviolet light beams (VUV light beams) such as the ArF excimer laser beam (wavelength: 193 nm) and the $F_2$ laser beam (wavelength: 157 nm). In this embodiment, the ArF excimer laser beam is used as the exposure light beam EL.

The first pattern-forming unit 3A has an electronic mask (variably shaped mask) which generates a variable pattern to be projected onto the first exposure area AR1. In this embodiment, DMD (Deformable Micro-mirror Device or Digital Micro-mirror Device), which is one type of the no light-emitting image display device (also referred to as "spatial light modulator" (SLM)), is used as the variably shaped mask. DMD has a plurality of reflecting elements (micromirrors) 2 which are driven on the basis of predetermined electronic data. The plurality of reflecting elements 2 are arranged in a two-dimensional matrix form on a surface of DMD, and are driven in the element unit to reflect and deflect the exposure light beam EL. Each of the reflecting elements 2 has a reflecting surface for which the angle thereof is adjusted. In this embodiment, for example, the exposure light beam EL to be reflected is allowed to come into the first projection optical system PL1 in the first state (ON state) in which the reflecting surface is set while being inclined with respect to the object plane of the first projection system PL1. The exposure light beam EL to be reflected is not allowed to come into the first projection optical system PL1 in the second state (OFF state) in which the reflecting surface is set substantially in parallel to the object plane.

The operation of the first pattern-forming unit 3A including DMD is controlled by the control unit 7. The control unit 7 drives the reflecting elements 2 of DMD on the basis of the electronic data (pattern information) corresponding to the first pattern to be formed on the substrate P so that the exposure light beam EL radiated by the first illumination system IL1 is patterned with the reflecting elements 2. That is, a reflection pattern is generated on at least a part (for example, in the first illumination area) of DMD. The first pattern-forming unit 3A has the surface which is arranged on the object plane of the first projection optical system PL1. The exposure light beam EL, which is patterned by the plurality of reflecting elements 2 of the first pattern-forming unit 3A, is radiated onto the substrate P via the first projection system PL1 to form an image of the pattern (pattern image) in the first exposure area AR1 described above.

The control unit 7 is capable of changing the reflection pattern (display pattern) to be generated on DMD on the basis of the pattern information described above. Accordingly, it is possible to appropriately change the pattern generated on DMD in synchronization with the movement of the substrate P during the scanning exposure. The scroll velocity (display speed) of the pattern generated on DMD is determined by the control unit 7 as a part of the parameter for the scanning exposure including, for example, the movement velocity of the substrate P. In this embodiment, it is possible to adjust, for example, not only the generation of the pattern but also the size (width) of the first exposure area AR1 on which the generated pattern image is formed, by driving the reflecting elements 2 of DMD. That is, it is possible to control the start and the end of the scanning exposure for the substrate with the exposure light beam EL to be radiated onto the first exposure area AR1.

The second pattern-forming unit 3B is constructed in approximately the same manner as the first pattern-forming unit 3A, which includes DMD (Digital Micro-mirror Device) provided with a plurality of reflecting elements 2. The control unit 7 drives the reflecting elements 2 of DMD on the basis of the electronic data (pattern information) corresponding to the second pattern to be formed on the substrate P so that the exposure light beam EL illuminated by the second illumination system IL2 is patterned with the reflecting elements 2. The arrangement and the operation of DMD of the second pattern-forming unit 3B are exactly the same as those of DMD of the first pattern-forming unit 3A. Therefore, any detailed explanation thereof is omitted. The second pattern-forming unit 3B has the surface which is arranged on the object plane of the second projection optical system PL2. The exposure light beam EL, which is patterned by the plurality of reflecting elements 2 of the second pattern-forming unit 3B, is radiated onto the substrate P via the second projection system PL2 to form a pattern image in the second exposure area AR2 described above.

In this embodiment, each of the first and second pattern-forming units 3A, 3B has the variably shaped mask, and DMD is used as the variably shaped mask. Accordingly, it is unnecessary to perform the operation for exchanging the mask and the operation for positionally adjusting the mask on the mask stage when the pattern is changed, as compared with a case in which the exposure is performed by using any mask (reticle) on which the pattern is formed. Therefore, it is possible to perform the multiple exposure more efficiently. The exposure apparatus based on the use of DMD is disclosed, for example, in Japanese Patent Application Laid-open Nos. 8-313842 and 2004-304135 and U.S. Pat. No. 6,778,257. The disclosure of U.S. Pat. No. 6,778,257 is incorporated herein by reference within a range of permission of the domestic laws and ordinances of the designated or selected state.

Each of the first and second projection optical systems PL1, PL2 projects the image of the pattern generated by each of the first and second pattern-forming units 3A, 3B at a predetermined projection magnification onto the substrate P. Each of the first and second projection optical systems PL1, PL2 has a plurality of optical elements. The optical elements are held by a barrel. In this embodiment, the optical axes AX1, AX2 of the first and second projection systems PL1, PL2 are parallel to the Z axis direction. Each of the first and second projection systems PL1, PL2 of this embodiment is the reduction system which has the projection magnification of, for example, ¼, ⅕, ⅛, or the like. When DMD is used, the projection magnification of each of the first and second projection systems PL1, PL2 may be within a range of 1/500 to 1/100. Each of the first and second projection systems PL1, PL2 is not limited to the reduction system, and may be any one of the 1× magnification system and the magnifying system. Each of the first and second projection systems PL1, PL2 may be based on any one of the dioptric system including no catoptric optical element, the catoptric system including no dioptric optical element, and the catadioptric system including dioptric and catoptric optical elements. It is also allowable to use the so-called inline type catadioptric system in which a plurality of reflecting surfaces are provided, an optical system (catoptric or catadioptric system) for forming an intermediate image at least once is provided at a part thereof, and a single optical axis is provided, as disclosed, for example, in International Publication No. 2004/107011 (corresponding to United States Patent Application Publication No. 2006/0121364). Each of the first and second projection optical systems PL1, PL2 may form any one of an inverted image and an erecting image. It is also allowable that the projection magnification of the first projection system PL1 is different from the projection magnification of the second projection system PL2.

The surface of the substrate P held by the substrate stage 4 is arranged opposite to (facing) the lower surface (light-exit surface) of an end optical element (last optical element) FL1 which is closest to the image plane of the first projection system PL1 among the plurality of optical elements of the first projection system PL1. The exposure light beam EL, which is patterned by the first pattern-forming unit 3A, is allowed to exit from the lower surface of the end optical element FL1 of the first projection system PL1.

Similarly, the surface of the substrate P held by the substrate stage 4 is arranged opposite to (facing) the lower surface (light-exit surface) of an end optical element FL2 which is closest to the image plane of the second projection system PL2 among the plurality of optical elements of the second projection system PL2. The exposure light beam EL, which is patterned by the second pattern-forming unit 3B, is allowed to exit from the lower surface of the end optical element FL2 of the second projection system PL2.

The substrate stage 4 has a substrate holder 4H which holds the substrate P. The substrate stage 4 is movable in directions of six degrees of freedom of the X axis, Y axis, Z axis, θX, θY, and θZ directions on a base member BP in a state in which the substrate P is held by the substrate holder 4H, in accordance with the driving operation of a substrate stage-driving unit 4D including an actuator such as a linear motor. In this embodiment, the substrate holder 4H is arranged in a recess 4R provided on the substrate stage 4. An upper surface 4F of the substrate stage 4 except for the recess 4R is a flat surface which has approximately a same height as (is flush with) the surface of the substrate P held by the substrate holder 4H. It is allowable that there is any difference in height between the surface of the substrate P held by the substrate holder 4H and the upper surface 4F of the substrate stage 4. The substrate holder 4H may be formed integrally with the substrate stage 4. However, in this embodiment, the substrate holder 4H and the substrate stage 4 are constructed separately from each other, and the substrate holder 4H is fixed to the recess R, for example, by the vacuum attraction.

The position information of the substrate stage 4 (as well as the substrate P) is measured by a laser interferometer 4L. The laser interferometer 4L measures the position information about the substrate stage 4 in relation to the X axis direction, the Y axis direction, and the θZ direction by using a reflecting mirror 4K (or a reflecting surface formed on a side surface thereof) provided on the substrate stage 4. The surface position information (position information in relation to the Z axis direction, the θX direction, and the θY direction) of the surface of the substrate P held by the substrate stage 4 is detected by an unillustrated focus/leveling-detecting system. The control unit 7 drives the substrate stage-driving unit 4D on the basis of the result of the measurement performed by the laser interferometer 4L and the result of the detection performed by the focus/leveling-detecting system to control the position of the substrate P held by the substrate stage 4.

The focus/leveling-detecting system measures the position information of the substrate P in the Z axis direction at a plurality of measuring points to detect the surface position information. In this embodiment, at least a part or parts of the plurality of measuring points are set in the first and second exposure areas AR1, AR2. However, for example, in the case of a liquid immersion exposure apparatus of a second embodiment described later on (FIG. 3), all of the measuring points may be set outside the first and second exposure areas AR1, AR2 (or first and second liquid immersion areas LR1, LR2). It is also allowable that the laser interferometer 4L is capable of measuring the position information of the substrate stage 4 in the Z axis direction, the θX direction, and the θY direction of the substrate stage 4 as well. Details thereof are disclosed, for example, in Published Japanese Translation of PCT International Publication for Patent Application No. 2001-510577 (corresponding to International Publication No. 1999/28790). In this case, it is also allowable that the focus/leveling-detecting system is not provided.

The exposure apparatus EX is capable of radiating the exposure light beams EL onto the first exposure area AR1 and the second exposure area AR2 under mutually different exposure conditions respectively. The exposure condition includes the radiation condition of the exposure light beam EL with respect to the substrate P. The radiation condition of the exposure light beam EL with respect to the substrate P is optimized, for example, in accordance with the images of the first and second patterns respectively, which includes, for example, the illumination condition described above, the numerical apertures of the projection systems PL1, PL2, and the like.

When the exposure light beam EL is radiated onto the first exposure area AR1, the control unit 7 allows the exposure light beam EL to exit from the first illumination system IL1. The exposure light beam EL, which is allowed to exit from the first illumination system IL1, is reflected by the reflecting mirror 5, and then the exposure light beam EL is radiated onto the first pattern-forming unit 3A including DMD. The control unit 7 drives the reflecting elements 2 of the first pattern-forming unit 3A in accordance with the image of the first pattern to be formed on the substrate P. The exposure light beam EL, which is reflected by the reflecting elements 2, is allowed to exit from the lower surface of the end optical element FL1 via the first projection system PL1, and the exposure light beam EL is radiated onto the first exposure area AR1. As described above, the exposure light beam EL, which is allowed to exit from the first illumination system IL1 and which passes via the first pattern-forming unit 3A and the first projection system PL1, is radiated onto the substrate P held by the substrate stage 4. Accordingly, the image of the first pattern is projected onto the substrate P, and the substrate P is exposed therewith.

Similarly, the exposure light beam EL, which is allowed to exit from the second illumination system IL2 and which passes via the second pattern-forming unit 3B and the second projection system PL2, is radiated onto the substrate P held by the substrate stage 4. Accordingly, the image of the second pattern is projected onto the substrate P, and the substrate P is exposed therewith.

Figure 20:
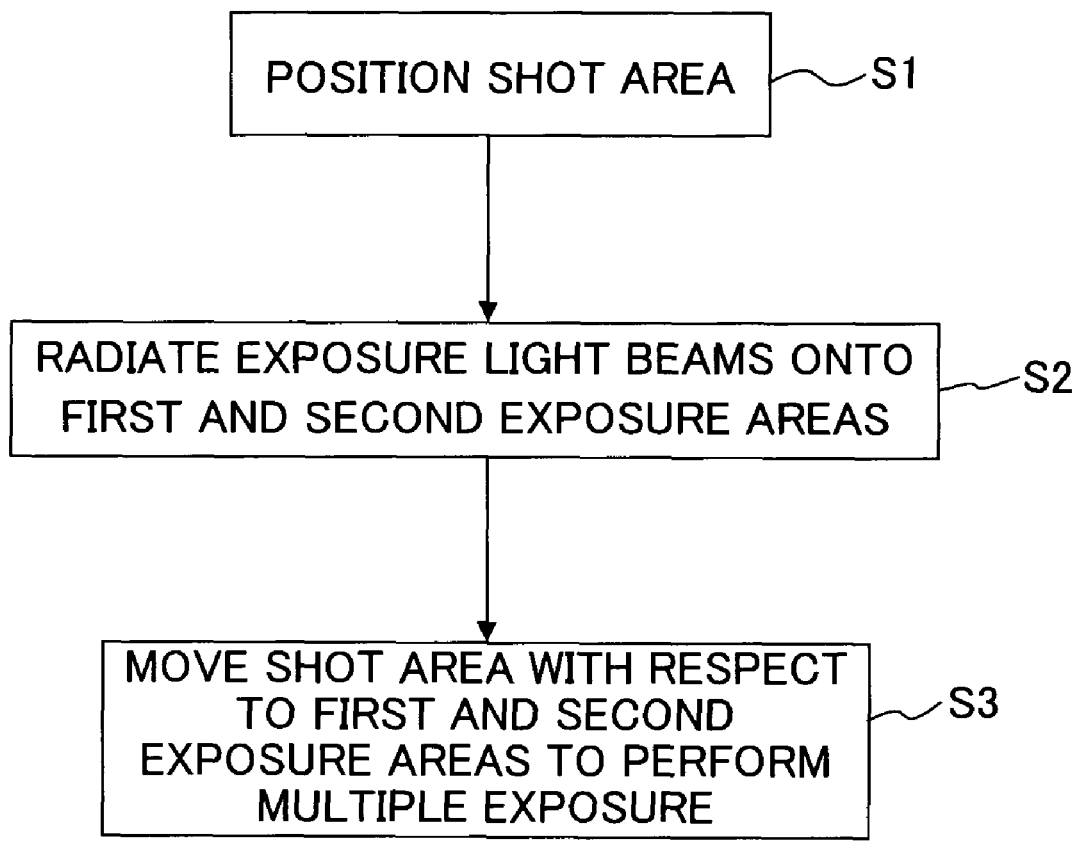
FIG. 20 shows a flow chart illustrating an exposure method according to the present invention.
Figure 21:
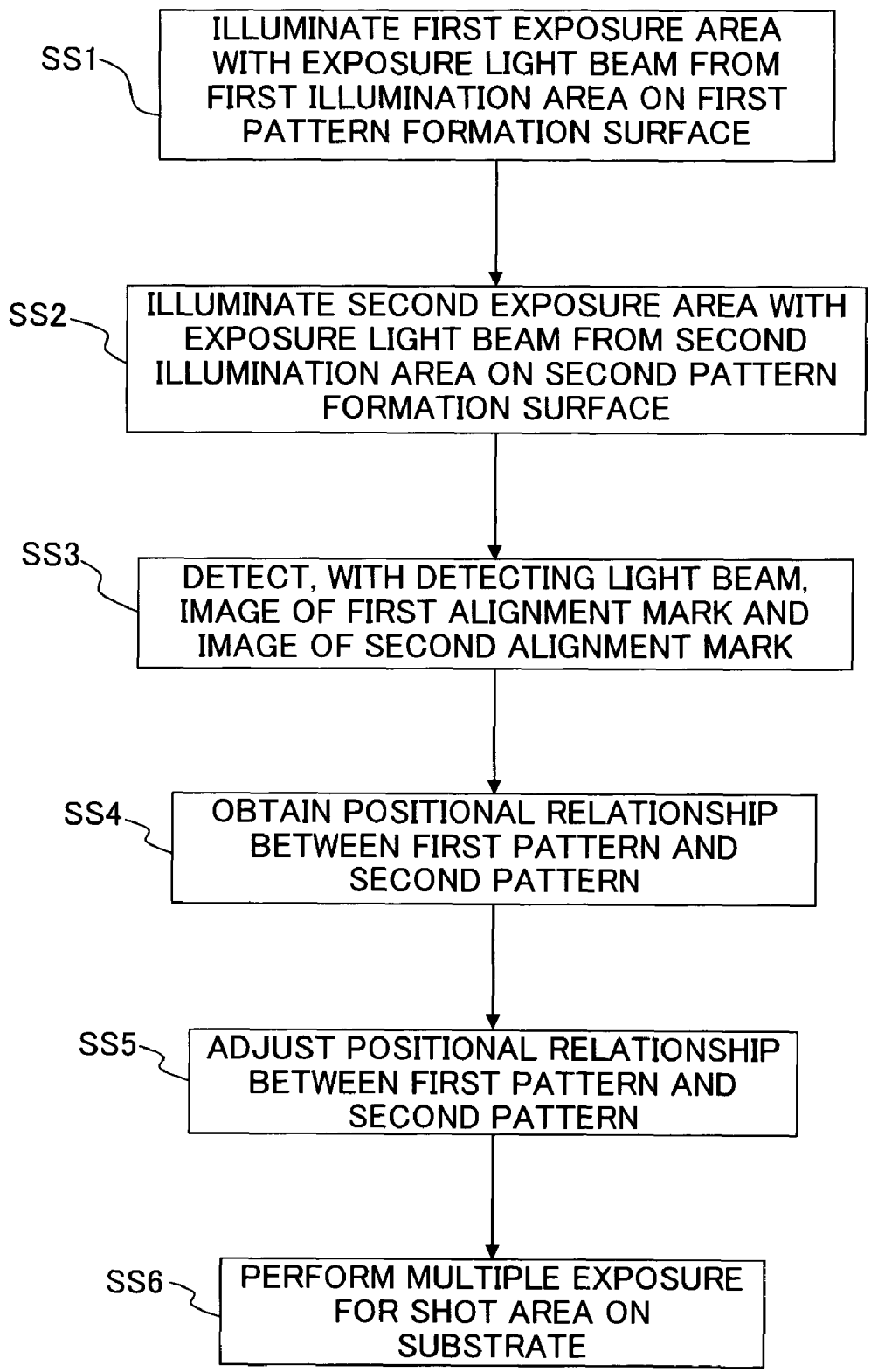
FIG. 21 shows a flow chart illustrating an exposure method in the eighth embodiment.

Next, an explanation will be made with reference to FIGS. 1, 2, and 20 about a method for exposing the substrate P by using the exposure apparatus EX constructed as described above.

The exposure apparatus EX of this embodiment is an exposure apparatus of the scanning type in which the respective shot areas on the substrate P are subjected to the multiple exposure (double exposure) by scanning the substrate P in the predetermined direction with respect to the exposure light beams EL radiated onto the first exposure area AR1 and the second exposure area AR2 respectively. That is, the exposure apparatus EX of this embodiment is the exposure apparatus of the scanning type in which the patterned exposure light beams EL are radiated onto the first and second exposure areas AR1, AR2 respectively by controlling the first and second pattern-forming units 3A, 3B in synchronization with the movement of the substrate P while moving the substrate P in the predetermined scanning direction with respect to the first and second exposure areas AR1, AR2. The plurality of shot areas as the exposure objective areas are defined in a matrix form on the substrate P. The exposure apparatus EX radiates the exposure light beams EL onto the first exposure area AR1 and the second exposure area AR2 respectively by the optical unit U while moving a shot area SH on the substrate P in the Y axis direction with respect to the first exposure area AR1 and the second exposure area AR2. Accordingly, the shot area SH on the substrate P is subjected to the multiple exposure (double exposure) with the image of the first pattern formed by the exposure light beam EL radiated onto the first exposure area AR1 and the image of the second pattern formed by the exposure light beam EL radiated onto the second exposure area AR2.

At first, the substrate stage 4 is controlled by the control unit 7 to move the substrate stage 4 to a position under or below the first projection system PL1 and the second projection system PL2, and the substrate P (shot area SH), which is held by the substrate holder 4H, is positioned at the predetermined position with respect to the first projection system PL1 and the second projection system PL2 (S1 shown in FIG. 20). FIG. 2 schematically shows the relationship between the shot area SH on the substrate P and the first exposure area AR1 and the second exposure area AR2 when one shot area on the substrate P is subjected to the exposure while moving the substrate P in the −Y direction. In this embodiment, the first exposure area AR1, onto which the exposure light beam EL is radiated, is the projection area of the first projection system PL1, and the second exposure area AR2, onto which the exposure light beam EL is radiated, is the projection area of the second projection system PL2.

Figure 2:
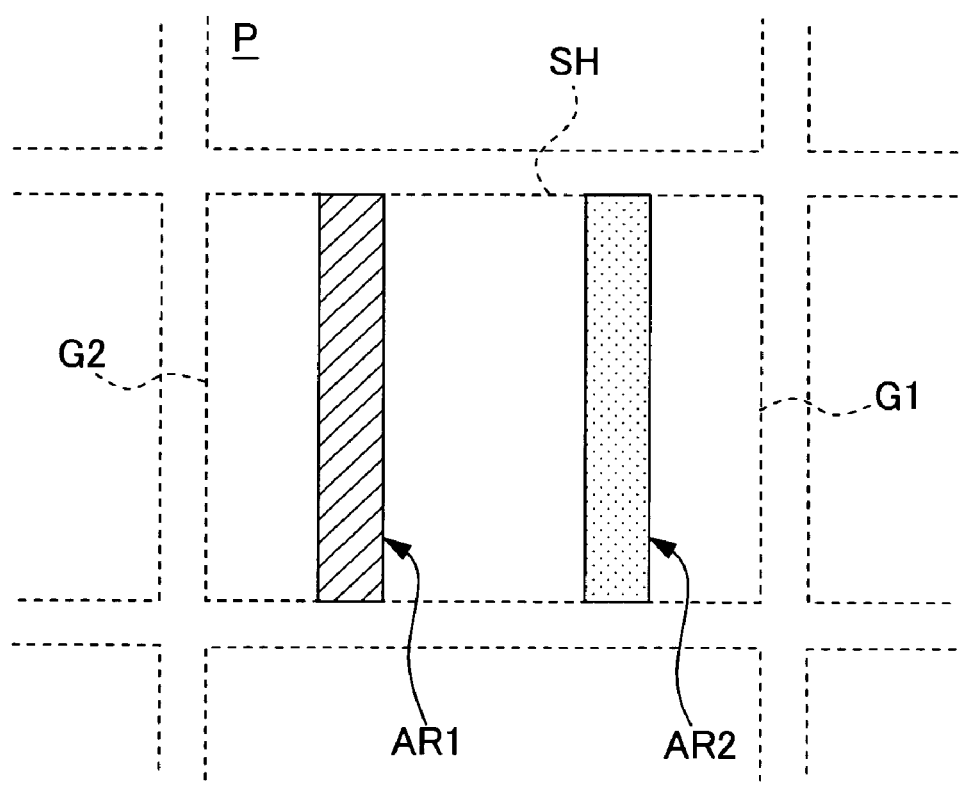
FIG. 2 schematically shows a relationship between first and second exposure areas and a shot area.

As shown in FIG. 2, each of the first exposure area AR1 and the second exposure area AR2 has a rectangular shape (slit-shaped form) in which the X axis direction is the longitudinal direction. The first exposure area AR1 and the second exposure area AR2 can be simultaneously arranged in a single shot area SH. That is, in this embodiment, the distance in the Y axis direction between the center of the first exposure area AR1 and the center of the second exposure area AR2 is smaller than the size of one shot area SH in the Y axis direction. In this embodiment, the first exposure area AR1 and the second exposure area AR2 are separated or away from each other in the Y axis direction. The first exposure area AR1 is set on the +Y side with respect to the second exposure area AR2. It is not necessarily indispensable that the first exposure area AR1 and the second exposure area AR2 can be simultaneously arranged in one shot area SH. It is possible to arbitrarily set (define) the first exposure area AR1 and the second exposure area AR2.

The first and second illumination systems IL1, IL2 are controlled by the control unit 7 to radiate the exposure light beams EL onto the first exposure area AR1 and the second exposure area AR2 defined at the different positions in the Y axis direction respectively (S2). The substrate stage 4 is controlled to move the substrate P in the Y axis direction so that the shot area SH on the substrate P is moved relative to the first exposure area AR1 and the second exposure area AR2 accompanying with the radiation (S3). The multiple exposure (double exposure) is performed in accordance with the movement of the substrate for the shot area SH on the substrate P with the image of the first pattern formed by the exposure light beam EL radiated onto the first exposure area AR1 and the image of the second pattern formed by the exposure light beam EL radiated onto the second exposure area AR2 (S3). That is, the control unit 7 performs the exposure again (double exposure) with the exposure light beam EL radiated onto the second exposure area AR2 for the photosensitive layer of the substrate P having been exposed with the exposure light beam EL radiated onto the first exposure area AR1, without performing, for example, the development step.

For example, when one shot area SH on the substrate P is exposed while moving the substrate P in the −Y direction, the control unit 7 starts the exposure (first scanning exposure) for the shot area SH with the exposure light beam EL radiated onto the first exposure area AR1 when an edge G1 of the shot area SH on the −Y side in FIG. 2 arrives at the first exposure area AR1. In this embodiment, the width of the first exposure area AR1 in the scanning direction is zero on the substrate P before the start of the first scanning exposure by the mask blind system of the first illumination system IL1. However, the width is gradually widened from the point of time of the start of the first scanning exposure, i.e., from the point of time at which the edge G1 arrives at the edge of the first exposure area AR1 on the +Y side. The width is maintained to be constant at the point of time at which the width arrives at a predetermined preset value. Accordingly, it is possible to avoid any unnecessary exposure for the shot area in the −Y direction in relation to the shot area SH on the substrate P before and after the start of the first scanning exposure. The width of the second exposure area AR2 in the scanning direction is zero by the mask blind system of the second illumination system IL2 immediately after the start of the first scanning exposure.

When the substrate P is further moved in the −Y direction, the shot area SH on the substrate P is moved relative to the first exposure area AR1. The control unit 7 stops the radiation of the exposure light beam EL onto the first exposure area AR1 when the edge G2 of the shot area SH on the +Y side in FIG. 2 arrives at the edge of the first exposure area AR1 on the −Y side. Accordingly, the first scanning exposure is completed for the shot area SH. In this embodiment, the width of the first exposure area AR1 is gradually narrowed by the mask blind system of the first illumination system IL1 immediately before the end of the first scanning exposure, i.e., from the point of time at which the edge G2 arrives at the edge of the first exposure area AR1 on the +Y side. The width is zero at the point of time at which the edge G2 arrives at the edge of the first exposure area AR1 on the −Y side. Accordingly, it is possible to avoid any unnecessary exposure for the shot area in the +Y direction in relation to the shot area SH on the substrate P before the end of the first scanning exposure.

The edge G1 of the shot area SH on the −Y side arrives at the second exposure area AR2 during the period (during the first scanning exposure) in which the first exposure area AR1 exists on the shot area SH. The control unit 7 starts the exposure (second scanning exposure) for the shot area SH with the exposure light beam EL radiated onto the second exposure area AR2 when the edge G1 of the shot area SH on the −Y side arrives at the second exposure area AR2. More specifically, the control unit 7 controls, for example, the second pattern-forming unit 3B on the basis of the position of the first exposure area AR1, the position of the second exposure area AR2, and the movement velocity of the substrate P in the −Y direction after the start of the radiation of the exposure light beam EL onto the first exposure area AR1 so as to start the radiation of the exposure light beam EL onto the second exposure area AR2 when the edge G1 of the shot area SH on the −Y side arrives at the second exposure area AR2. In this embodiment, the width is gradually widened by the mask blind system of the second illumination system IL2 from the point of time of the start of the second scanning exposure, i.e., from the point of time at which the edge G1 arrives at the edge of the second exposure area AR2 on the +Y side. The width is maintained to be constant at the point of time at which the width arrives at a predetermined preset value. Accordingly, it is possible to avoid any unnecessary exposure for the shot area in the −Y direction in relation to the shot area SH on the substrate P before and after the start of the second scanning exposure. A part of the operation of the second scanning exposure is performed in parallel with the first scanning exposure described above. Further, the preset values are equal to one another for the first exposure area AR1 and the second exposure area AR2.

When the substrate P is further moved in the −Y direction, the shot area SH on the substrate P is moved relative to the second exposure area AR2 as well. The control unit 7 stops the radiation of the exposure light beam EL onto the second exposure area AR2 when the edge G2 of the shot area SH on the +Y side arrives at the edge of the second exposure area AR2 on the −Y side. Accordingly, the second scanning exposure is completed for the shot area SH. In this embodiment, the width of the second exposure area AR2 is gradually narrowed by the mask blind system of the second illumination system IL2 immediately before the end of the second scanning exposure, i.e., from the point of time at which the edge G2 arrives at the edge of the second exposure area AR2 on the +Y side. The width is zero at the point of time at which the edge G2 arrives at the edge of the second exposure area AR2 on the −Y side. Accordingly, it is possible to avoid any unnecessary exposure for the shot area in the +Y direction in relation to the shot area SH on the substrate P before the end of the second scanning exposure. In this embodiment, the mask blind system is used to change the width of each of the first and second exposure areas AR1, AR2, i.e., control the start and the end of the first scanning exposure and the second scanning exposure. However, it is also allowable to control the start and the end of the scanning exposure, for example, by DMD described above. In this case, it is also allowable that the mask blind system is not provided for the illumination optical system. Alternatively, it is also allowable that the mask blind system does not possess the function to control the start and the end of the scanning exposure.

The image of the pattern to be projected onto the first exposure area AR1 is successively changed by the first pattern-forming unit 3A during the period in which the shot area SH on the substrate P is moved with respect to the first exposure area AR1. The image of the first pattern is formed on the shot area SH which has passed over the first exposure area AR1. Similarly, the image of the pattern to be projected onto the second exposure area AR2 is successively changed by the second pattern-forming unit 3B during the period in which the shot area SH is moved with respect to the second exposure area AR2. The image of the second pattern is also formed on the shot area SH which has passed over the second exposure area AR2. That is, the shot area SH on the substrate P is subjected to the multiple exposure (double exposure) with the image of the first pattern formed by the exposure light beam EL radiated onto the first exposure area AR1 and the image of the second pattern formed by the exposure light beam EL radiated onto the second exposure area AR2.

As explained above, the exposure light beams EL are radiated onto the first exposure area AR1 and the second exposure area AR2 which are defined at the different positions in the Y axis direction respectively, and the substrate P is moved in the Y axis direction so that the shot area SH on the substrate P is moved relative to the first exposure area AR1 and the second exposure area AR2. Accordingly, it is possible to efficiently perform the multiple exposure for the shot area SH on the substrate P. In this embodiment, when the plurality of shot areas SH on the substrate P are subjected to the multiple exposure (double exposure), one shot area can be exposed with the image of the first pattern and the image of the second pattern by performing the scanning operation once (one time). Thus, it is possible to improve the throughput. When the scanning operation in the −Y direction for the substrate P and the scanning operation in the +Y direction are repeated, it is possible to efficiently perform the multiple exposure for the plurality of shot areas on the substrate P. Further, the image of the first pattern and the image of the second pattern can be formed in the desired positional relationship in each of the shot areas, because the multiple exposure can be performed for one shot area by one time of the scanning operation.

The exposure apparatus EX of this embodiment has the illumination systems IL1, IL2, the pattern-forming units 3A, 3B, and the projection systems PL1, PL2. Even when the substrate P is subjected to the multiple exposure, it is possible to reduce, for example, the operation for exchanging the mask and/or changing the exposure condition such as the illumination condition. Therefore, it is possible to suppress the decrease in the rate of operation of the exposure apparatus EX, and it is possible to suppress the decrease in the throughput. Thus, the substrate P can be subjected to the multiple exposure efficiently.

In the multiple exposure, in general, the substrate P is exposed with mutually different patterns. However, any equivalent exposure accuracy is not necessarily required for the respective exposure processes. When the substrate P is subjected to the multiple exposure, for example, there is such a possibility that the resolution in the first time exposure and the resolution in the second time exposure may be mutually different, and/or the optical performance of the projection system in the first time exposure and the optical performance of the projection system in the second time exposure may be mutually different. For example, it is also allowable that the numerical aperture of the projection system in the first time exposure is smaller than the numerical aperture of the projection system in the second time exposure. Further, it is also allowable that the wavelength of the exposure light beam EL radiated onto the first exposure area AR1 is different from the wavelength of the exposure light beam EL radiated onto the second exposure area AR2. In this embodiment, it is possible to provide the first and second projection systems PL1, PL2 having the optical performance (numerical apertures) adapted to the target resolutions in response to the patterns to be subjected to the multiple exposure. Therefore, it is possible to suppress the increase in the cost of the apparatus, and it is possible to expose the substrate P efficiently. In this embodiment, each of the first pattern-forming unit 3A and the second pattern-forming unit 3B includes DMD. Therefore, the images of the mutually different patterns can be easily formed in the first exposure area AR1 and the second exposure area AR2 respectively.

In the embodiment described above, the first exposure area AR1 and the second exposure area AR2 are separated from each other in the Y axis direction. However, the first exposure area AR1 and the second exposure area AR2 may be partially overlapped with each other in the Y axis direction. The exposure apparatus EX of this embodiment may be provided with an actuator for adjusting the position and/or the rotation (inclination) of DMD described above.

Second Embodiment

Next, a second embodiment will be explained. An exposure apparatus and an exposure method of this embodiment have such a feature that the exposure light beam EL is radiated onto the substrate through a liquid LQ in at least one of the first exposure area AR1 and the second exposure area AR2. In the following description, the constitutive components, which are the same as or equivalent to those of the first embodiment described above, are designated by the same reference numerals, any explanation of which will be simplified or omitted.

Figure 3:
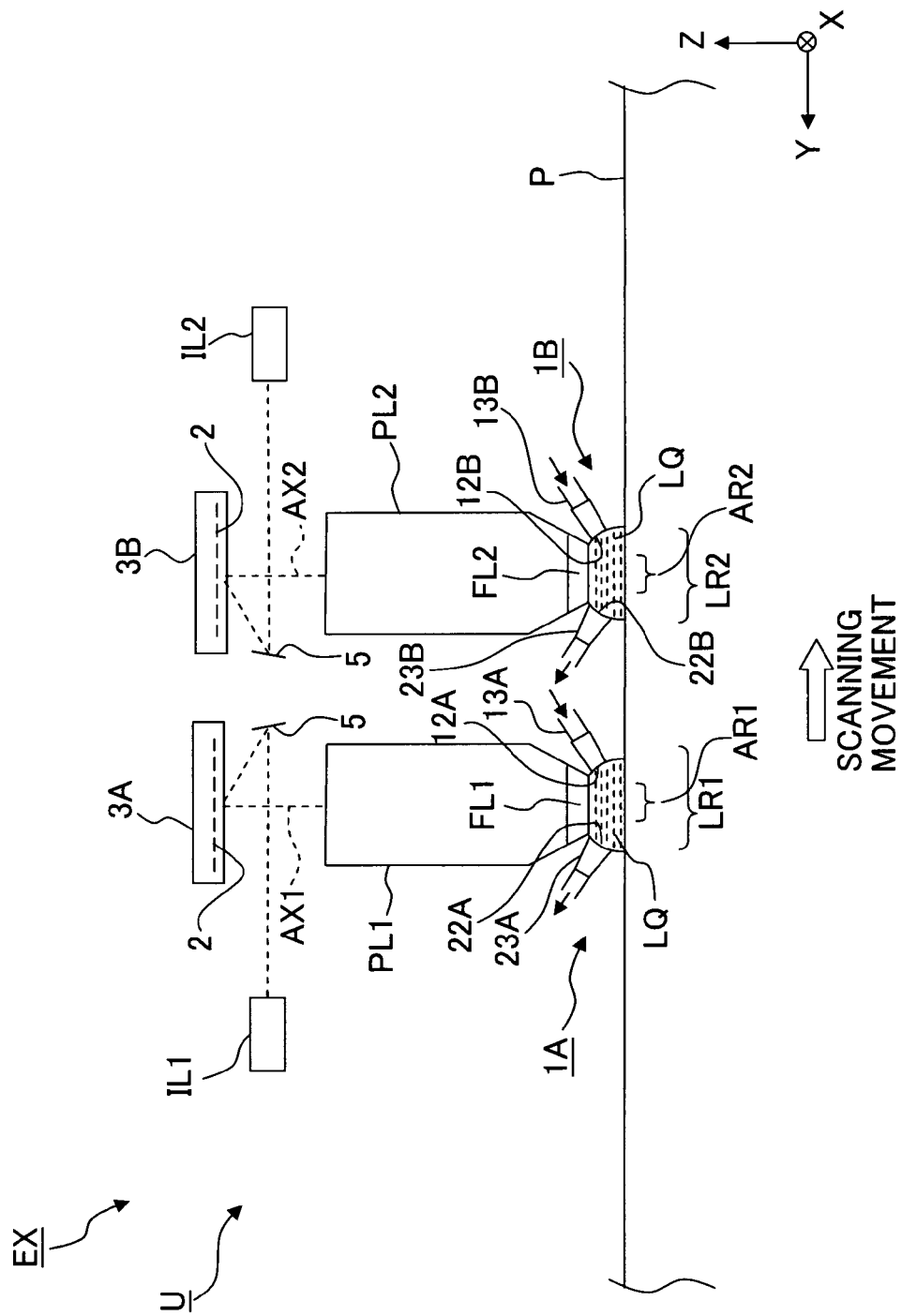
FIG. 3 shows a schematic arrangement view illustrating an exposure apparatus according to a second embodiment.

FIG. 3 shows a schematic arrangement view illustrating the second embodiment. The exposure apparatus EX of this embodiment is an exposure apparatus to which the liquid immersion method is applied in order that the exposure wavelength is substantially shortened to improve the resolution and the depth of focus is substantially widened, as disclosed, for example, in International Publication No. 99/49504 and Japanese Patent Application Laid-open No. 2004-289126 (corresponding to United States Patent Application Publication No. 2004/0165159). The exposure apparatus EX includes first and second liquid immersion systems 1A, 1B for filling, with the liquid LQ, at least a part of the optical path for the exposure light beam EL. In this embodiment, water (pure or purified water) is used as the liquid LQ. A top coat film or the like, which protects the photosensitive material and the base material from the liquid LQ, can be provided on the substrate P.

The first liquid immersion system 1A is provided in the vicinity of the optical path for the exposure light beam EL between the substrate P and the end optical element FL1 of the first projection system PL1. The first liquid immersion system 1A includes a supply member 13A which has a supply port 12A for supplying the liquid LQ to the optical path, and a recovery member 23A which has a recovery port 22A for recovering the liquid LQ. A liquid supply unit (not shown), which is capable of feeding the liquid LQ, is connected to the supply member 13A. The clean and temperature-adjusted liquid LQ can be supplied to the optical path by the liquid supply unit via the supply port 12A. A liquid recovery unit (not shown), which includes, for example, a vacuum system, is connected to the recovery member 23A. The liquid LQ, with which the optical path is filled, can be recovered by the liquid recovery unit via the recovery port 22A. The operations of the liquid supply unit and the liquid recovery unit are controlled by the control unit 7. The control unit 7 controls the first liquid immersion system 1A to perform the liquid supply operation by the liquid supply unit in parallel with the liquid recovery operation by the liquid recovery unit. Accordingly, the first liquid immersion area LR1 of the liquid LQ is locally formed on a part of the substrate P so that the optical path for the exposure light beam EL, which is disposed between the lower surface of the end optical element FL1 of the first projection system PL1 and the surface of the substrate P on the substrate stage 4, is filled with the liquid LQ. The first liquid immersion area LR1 is formed to be larger than the first exposure area AR1 on the substrate P. That is, the first liquid immersion area LR1 is formed to entirely cover the first exposure area AR1.

Similarly, the second liquid immersion system 1B has the same arrangement as that of the first liquid immersion system 1A. The second liquid immersion system 1B includes a supply member 13B which has a supply port 12B for supplying the liquid LQ, and a recovery member 23B which has a recovery port 22B for recovering the liquid LQ. The second liquid immersion area LR2 of the liquid LQ is locally formed on a part of the substrate P so that the optical path for the exposure light beam EL, which is disposed between the lower surface of the end optical element FL2 of the second projection system PL2 and the surface of the substrate P on the substrate stage 4, is filled with the liquid LQ. The second liquid immersion area LR2 is formed to be larger than the second exposure area AR2 on the substrate P. That is, the second liquid immersion area LR2 is formed to entirely cover the second exposure area AR2. It is not necessarily indispensable that the exposure apparatus is provided with a part or parts (for example, member or members for constructing the liquid supply unit and/or the liquid recovery unit) of each of the first and second liquid immersion systems 1A, 1B. The part or parts of the first and second liquid immersion systems 1A and 1B may be substituted, for example, with the equipment of the factory or the like in which the exposure apparatus is installed. The structure of the liquid immersion system 1A, 1B is not limited to the structure described above. It is possible to use those described, for example, in European Patent Publication No. 1420298, International Publication No. 2004/055803, International Publication No. 2004/057590, International Publication No. 2005/029559 (corresponding to United States Patent Application Publication No. 2006/0231206), International Publication No. 2004/086468 (corresponding to United States Patent Application Publication No. 2005/0280791), and Japanese Patent Application Laid-open No. 2004-289126 (corresponding to U.S. Pat. No. 6,952,253). The disclosures of United States Patents and United States Patent Application Publications and the like described above are incorporated herein by reference within a range of permission of the domestic laws and ordinances of the designated or selected state, in relation to the liquid immersion mechanism of the liquid immersion exposure apparatus and the attached equipment thereof.

The exposure apparatus EX forms the first and second liquid immersion areas LR1, LR2 of the liquid LQ on the substrate P held by the substrate stage 4. The substrate P is exposed by radiating the exposure light beam EL onto each of the first and second exposure areas AR1, AR2 on the substrate P through the liquid LQ of each of the first and second liquid immersion areas LR1, LR2.

The exposure apparatus EX radiates the exposure light beams EL onto the first and second exposure areas AR1, AR2 respectively while moving a shot area SH on the substrate P in the Y axis direction with respect to the first and second exposure areas AR1, AR2 in a state in which the first and second liquid immersion areas LR1, LR2 are formed. Accordingly, the shot area SH on the substrate P is subjected to the multiple exposure (double exposure) with the image of the first pattern formed by the exposure light beam EL radiated through the liquid LQ onto the first exposure area AR1 and the image of the second pattern formed by the exposure light beam EL radiated through the liquid LQ onto the second exposure area AR2.

In this embodiment, the first exposure area AR1 and the second exposure area AR2 are separated from each other in the Y axis direction. However, the first exposure area AR1 and the second exposure area AR2 may be partially overlapped with each other in the Y axis direction.

In this embodiment, the type (physical property) of the liquid LQ for forming the first liquid immersion area LR1 is the same as that of the liquid LQ for forming the second liquid immersion area LR2. However, the type (physical property) may differ between the liquids. For example, the first and second liquid immersion areas LR1, LR2 may be formed with liquids of different types (at least different in refractive indexes with respect to exposure light beam EL) respectively. For example, one of the first and second liquid immersion areas LR1, LR2 may be formed with water (pure or purified water), and the other may be formed with any liquid having a refractive index higher than that of water (refractive index of about 1.44) with respect to the exposure light beam EL. At least one of the viscosity of the liquid LQ, the transmittance for the exposure light beam EL, and the temperature may mutually differ between the first liquid immersion area LR1 and the second liquid immersion area LR2.

For example, when the exposure light beam EL is the $F_2$ laser, the $F_2$ laser beam is not transmitted through water. Therefore, the liquid LQ may be, for example, a fluorine-based fluid such as fluorine-based oil and perfluoropolyether (PFPE). Alternatively, other than the above, it is also possible to use, as the liquid LQ, liquids (for example, cedar oil) which have the transmittance with respect to the exposure light beam EL, which have the refractive index as high as possible, and which are stable against the photoresist coated on the surface of the substrate P and the projection optical system PL.

The liquid LQ, which has the refractive index (for example, not less than 1.5) higher than that of pure water, includes, for example, predetermined liquids having the C—H bond or the O—H bond such as isopropanol having a refractive index of about 1.50 and glycerol (glycerin) having a refractive index of about 1.61, predetermined liquids (organic solvents) such as hexane, heptane, and decane, and decalin (decahydronaphthalene) having a refractive index of about 1.60. As for the liquid LQ, it is also allowable to use liquids obtained by mixing arbitrary two or more liquids of the foregoing liquids and liquids obtained by adding (mixing) at least one of the foregoing liquid or liquids to (with) pure water. Further, as for the liquid LQ, it is also allowable to use liquids obtained by adding (mixing) base or acid such as $H^+$, $Cs^+$, $K^+$, $Cl^-$, $SO_4^{2-}$, and $PO_4^{2-}$ to (with) pure water, and it is also allowable to use liquids obtained by adding (mixing) fine particles of Al oxide or the like to (with) pure water. As for the liquid LQ, it is preferable to use liquids which have the small coefficients of light absorption, which have the small temperature dependency, and which are stable against the photosensitive material (or, for example, the top coat film or the antireflection film) coated on the surface of the substrate P and/or each of the first and second projection systems P11, PL2. As for the liquid LQ, it is also allowable to use liquids having refractive indexes of about 1.6 to 1.8. As for the liquid LQ, it is also possible to use supercritical fluids.

The end optical elements FL1, FL2 of the first and second projection systems PL1, PL2 respectively may be formed of an identical material, or may be formed of different materials. At least one of the end optical elements FL1, FL2 may be formed of silica glass (silica), or single crystal materials of fluoride such as calcium fluoride (calcium fluorite), barium fluoride, strontium fluoride, lithium fluoride, and sodium fluoride. Alternatively, at least one of the end optical elements FL1, FL2 may be formed of any material having a refractive index (for example, not less than 1.6) higher than those of silica glass and calcium fluoride. Those usable as the material having the refractive index of not less than 1.6 include, for example, sapphire and germanium dioxide as disclosed, for example, in International Publication No. 2005/059617, and potassium chloride (refractive index: about 1.75) as disclosed in International Publication No. 2005/059618.

The refractive index $n_1$ of the end optical element with respect to the exposure light beam EL may be smaller than the refractive index $n_2$ of the liquid LQ with respect to the exposure light beam EL, in relation to at least one of the first and second projection systems PL1, PL2. For example, the end optical element is formed of silica glass (refractive index: about 1.5), and the liquid LQ to be used has refractive index $n_2$ (for example, about 1.6 to 1.8) which is higher than the refractive index of the silica glass. Alternatively, the refractive index $n_1$ of the end optical element may be larger than the refractive index $n_2$ of the liquid LQ, in relation to at least one of the first and second projection systems PL1, PL2. For example, the end optical element is formed of a material having a refractive index of not less than 1.6, and the liquid LQ to be used has the refractive index $n_2$ which is larger than the refractive index of pure water and which is smaller than the refractive index of the end optical element. In this case, it is preferable that the refractive index $n_2$ of the liquid LQ, which is smaller than the refractive index $n_1$ of the end optical element, is larger than the numerical aperture NA of the projection system.

In the projection system of this embodiment, the optical path, which is disposed on the side of the object plane of the end optical element, may be filled with the liquid, in addition to the optical path which is disposed on the side of the image plane of the end optical element, as disclosed, for example, in International Publication No. 2004/019128 (corresponding to United States Patent Application Publication No. 2005/0248856). It is also allowable that a thin film, which has the liquid-attractive property and/or the dissolution-preventive function, may be formed on a part (including at least a contact surface with the liquid LQ) or all of the surface of the end optical element. Silica glass has the high affinity for the liquid LQ, for which any dissolution-preventive film is unnecessary as well. However, it is preferable to form at least any dissolution-preventive film for calcium fluoride.

For example, any one of a space between the end optical element FL1 and the substrate P and a space between the end optical element FL2 and the substrate P may be filled with the liquid LQ, and the other of the spaces may be filled with a gas. In this way, it is also allowable that the condition (type or the like) may be different between the medium with which the space between the end optical element FL1 and the substrate P is filled and the medium with which the space between the end optical element FL2 and the substrate P is filled.

In the second embodiment, the first exposure area AR1 and the second exposure area AR2 are covered with the first liquid immersion area LR1 and the second liquid immersion area LR2 separately. However, the first exposure area AR1 and the second exposure area AR2 may be covered with one liquid immersion area.

Third Embodiment

Next, an explanation will be made about a third embodiment of the exposure apparatus and the exposure method of the present invention. In the first and second embodiments described above, the images of the first and second patterns are formed by using the first and second pattern-forming units 3A, 3B including DMD's. However, this embodiment has such a feature that the images of the first and second patterns are formed on the substrate P by using first and second masks M1, M2 on each of which a predetermined pattern is formed by using a light-shielding film such as chromium on a transparent member such as a glass plate. The first and second masks M1, M2 include reticles on each of which a pattern is formed to be subjected to the reduction projection onto the substrate P. In this embodiment, the transmissive type mask is used as the mask. However, it is also allowable to use a reflective type mask. The constitutive components or parts, which are the same as or equivalent to those of the first and second embodiments described above, are designated by the same reference numerals, any explanation of which will be simplified or omitted.

Figure 4:
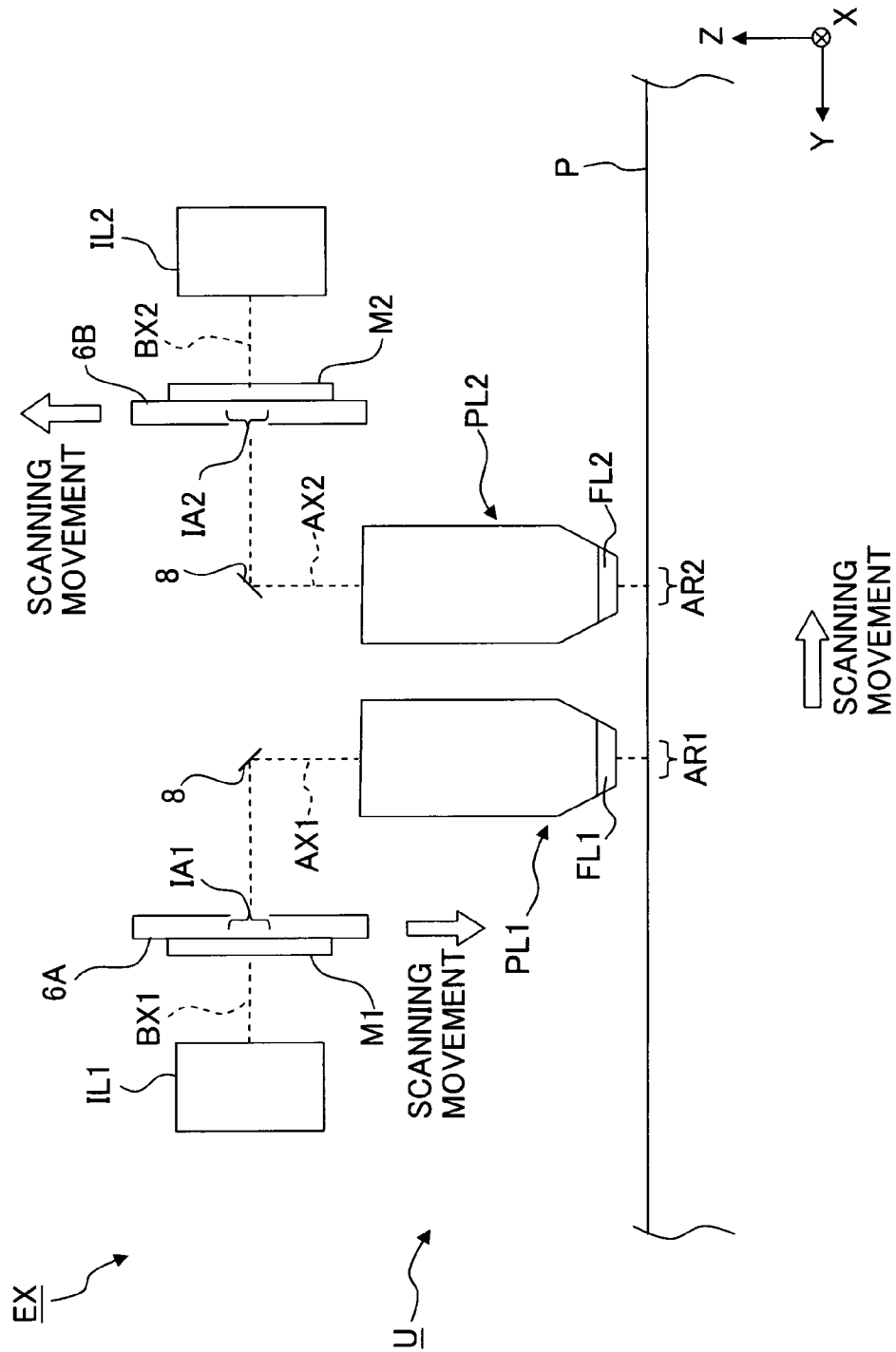
FIG. 4 shows a schematic arrangement view illustrating an exposure apparatus according to a third embodiment.

FIG. 4 shows a schematic arrangement illustrating the third embodiment. An exposure apparatus EX of this embodiment includes a first mask stage 6A which is movable while holding a first mask M1, and a second mask stage 6B which is movable while holding a second mask M2.

The first mask M1 is a member for forming the image of the first pattern on the substrate P. The second mask M2 is a member for forming the image of the second pattern on the substrate P. The first pattern is formed on the first mask M1. Similarly, the second pattern is formed on the second mask M2. The first mask M1 and the first mask stage 6A are used to form the image of the first pattern in the first exposure area AR1 on the substrate P. The second mask M2 and the second mask stage 6B are used to form the image of the second pattern in the second exposure area AR2 on the substrate P.

First and second illumination systems IL1, IL2 illuminate predetermined first and second illumination areas IA1, IA2 with exposure light beams EL having uniform illuminance distributions respectively. In this embodiment, each of the first and second illumination areas IA1, IA2 is set to have a rectangular shape (slit-shaped form) in which the X axis direction is the longitudinal direction.

In this embodiment, an optical axis BX1 of the first illumination system IL1 is substantially perpendicular to an optical axis AX1 of the first projection system PL1, and is parallel to the Y axis direction as shown in FIG. 4. Similarly, an optical axis BX2 of the second illumination system IL2 is substantially perpendicular to an optical axis AX2 of the second projection system PL2, and is parallel to the Y axis direction as shown in FIG. 4. The first mask stage 6A holds the first mask M1 so that a surface of the first mask M1 is perpendicular to the Y axis. The second mask stage 6B holds the second mask M2 so that a surface of the second mask M2 is perpendicular to the Y axis.

Each of the first and second mask stages 6A, 6B is movable in the X axis direction, the Z axis direction, and the θY direction in a state in which each of the first and second masks M1, M2 is held, in accordance with the driving operation of a mask stage-driving unit including an actuator such as a linear motor. The position information about the first and second mask stages 6A, 6B (as well as the first and second masks M1, M2) is measured by an unillustrated laser interferometer. The laser interferometer measures the position information about the first and second mask stages 6A, 6B by using reflecting surfaces provided for the first and second mask stages 6A, 6B respectively. The control unit 7 drives the mask stage-driving unit on the basis of the measurement result of the laser interferometer to control the positions of the first and second masks M1, M2 held by the first and second mask stages 6A, 6B. The first and second mask stages 6A, 6B may be constructed so that they are coarsely and finely movable, as disclosed, for example, in Japanese Patent Application Laid-open No. 8-130179 (corresponding to U.S. Pat. No. 6,721,034).

When the exposure light beam EL is radiated onto the first exposure area AR1, the control unit 7 allows the exposure light beam EL to exit from the first illumination system IL1. The exposure light beam EL, which is allowed to exit from the first illumination system IL1, illuminates the pattern in the first illumination area of the first mask M1 held by the first mask stage 6A. The exposure light beam EL, which has passed through the first mask M1, is reflected by a reflecting mirror 8. After that, the exposure light beam EL is allowed to exit from the lower surface of an end optical element FL1 via the first projection system PL1, and the exposure light beam EL is radiated onto the first exposure area AR1. As described above, the exposure light beam EL, which is allowed to exit from the first illumination system IL1 and which passes via the first mask M1 and the first projection system PL1, is radiated onto the substrate P held by the substrate stage 4. Accordingly, the image of the first pattern is projected onto the substrate P, and the substrate P is exposed therewith.

Similarly, the exposure light beam EL, which is allowed to exit from the second illumination system IL2 and which passes via the second mask M2 and the second projection system PL2, is radiated onto the substrate P held by the substrate stage 4. Accordingly, the image of the second pattern is projected onto second exposure area AR2 on the substrate P, and the substrate P is exposed therewith.

The exposure apparatus EX of this embodiment is the scanning type exposure apparatus in which the patterned exposure light beams EL are radiated onto the first and second exposure areas AR1, AR2 respectively by synchronously performing the movement of the substrate P in the predetermined scanning direction with respect to the first and second exposure areas AR1, AR2, the movement of the first mask M1 in the predetermined scanning direction with respect to the first illumination area IA1, and the movement of the second mask M2 in the predetermined scanning direction with respect to the second illumination area IA2. When a shot area SH on the substrate P is subjected to the multiple exposure, the control unit 7 radiates the exposure light beams EL onto the first exposure area AR1 and the second exposure area AR2 defined at the different positions in the Y axis direction respectively, and controls the substrate stage 4 to move the substrate P in the Y axis direction so that the shot area SH on the substrate P is moved relative to the first exposure area AR1 and the second exposure area AR2. Accordingly, the shot area SH on the substrate P is subjected to the multiple exposure (double exposure) with the image of the first pattern formed by the exposure light beam EL radiated onto the first exposure area AR1 and the image of the second pattern formed by the exposure light beam EL radiated onto the second exposure area AR2. At this time, the control unit 7 moves, in the predetermined scanning direction, the first mask stage 6A which holds the first mask M1 and the second mask stage 6B which holds the second mask M2 in synchronization with the movement in the Y axis direction of the substrate stage 4 which holds the substrate P. In this embodiment, when the shot area SH on the substrate P is exposed, then the control unit 7 moves the first mask stage 6A in the −Z direction, and the control unit 7 moves the second mask stage 6B in the +Z direction, for example, in synchronization with the movement of the substrate stage 4 in the −Y direction. Accordingly, the photosensitive layer of the substrate P, which has been exposed with the exposure light beam EL radiated onto the first exposure area AR1, is exposed again (subjected to the double exposure) with the exposure light beam EL radiated onto the second exposure area AR2 without performing, for example, the development step, in the same manner as in the embodiment described above.

For example, as shown in FIG. 2, when one shot area SH on the substrate P is subjected to the multiple exposure while moving the substrate P in the −Y direction, the control unit 7 controls the movement of the first mask stage 6A in the scanning direction so that the projection of the image of the pattern of the first mask M1 onto the first exposure area AR1 is started when the edge G1 on the −Y side of the shot area SH arrives at the first exposure area AR1 in FIG. 2. The control unit 7 further controls the substrate P so that the substrate P is further moved in the −Y direction, and the shot area SH passes over the first exposure area AR1. Accordingly, the exposure (first scanning exposure) is completed for the shot area SH with the exposure light beam EL radiated onto the first exposure area AR1. The edge G1 of the shot area SH on the −Y side arrives at the second exposure area AR2 during the period of time (during the first scanning exposure) in which the first exposure area AR1 exists on the shot area SH. The control unit 7 controls the movement of the second mask stage 6B in the scanning direction so that the projection of the image of the second pattern of the second mask M onto the second exposure area AR2 is started when the edge G1 of the shot area SH on the −Y side arrives at the second exposure area AR2 in FIG. 2. More specifically, after the start of the projection of the image of the first pattern onto the first exposure area AR1, the control unit 7 controls the movement of the second mask stage 6B in the scanning direction so that the projection of the image of the pattern of the second mask M2 onto the second exposure area AR2 is started, when the edge G1 of the shot area SH on the −Y side arrives at the second exposure area AR2, on the basis of the positions of the first and second exposure areas AR1, AR2 (relative distance between AR1 and AR2) and the velocity of movement of the substrate P in the −Y direction. The control unit 7 performs control that the substrate P is further moved in the −Y direction, and the shot area SH passes over the second exposure area AR2. Accordingly, the exposure (second scanning exposure) is completed for the shot area SH with the exposure light beam EL radiated onto the second exposure area AR2. Accordingly, the multiple exposure (double exposure) is completed for the shot area SH with the image of the first pattern formed by the exposure light beam EL radiated onto the first exposure area AR1 and the image of the second pattern formed by the exposure light beam EL radiated onto the second exposure area AR2. Also in this embodiment, it is preferable that the mask blind system is used to change the widths of the first and second exposure areas AR1, AR2 during the predetermined period of times immediately after the start and immediately before the end of the first and second scanning exposure processes in the same manner as in the first embodiment described above. That is, it is preferable to control the start and the end of each of the first and second scanning exposure processes.

As explained above, in this embodiment, the synchronous movement of the substrate stage 4, the first mask stage 6A, and the second mask stage 6B is controlled so that the projection of the image of the pattern of the first mask M onto the first exposure area AR1 and the projection of the image of the pattern of the second mask M2 onto the second exposure area AR2 are started at the predetermined timings, even when the first exposure area AR1 and the second exposure area AR2 are defined at the different positions in the Y axis direction in order to perform the multiple exposure for each of the shot areas SH on the substrate P. Therefore, the first pattern image and the second pattern image can be formed in the desired positional relationship in each of the shot areas SH on the substrate P.

In this embodiment, the patterns, which are formed on the first and second masks M1, M2, are different from each other. Therefore, the illumination conditions of the first and second masks M1, M2 to be illuminated by the first and second illumination systems IL1, IL2 as well as the illumination conditions of the exposure light beams EL to be radiated onto the substrate P may be allowed to differ therebetween depending on the patterns.

One of the first and second masks M1, M2 may be, for example, a phase shift mask, and the other of the first and second masks M1, M2 may be a binary mask formed of only a chromium pattern. In this case, for example, the illumination condition for the phase shift mask may be the small σ illumination (ordinary illumination in which the coherence factor (σ value) is, for example, about 0.2 to 0.4), and the illumination condition for the binary mask may be the modified illumination (zonal illumination or multipolar illumination). Each of the first and second masks M1, M2 may be a phase shift mask.

The first and second masks M1, M2 may be illuminated under optimum illumination conditions which are different from each other, for example, such that the first illumination system IL1 is based on the coherent illumination and the second illumination system IL2 is based on the partial coherent illumination. The partial coherent illumination is the illumination in which the value of σ=(numerical aperture of illumination system/numerical aperture of projection system) is larger than zero and smaller than 1. The coherent illumination is the illumination in which the value of σ is zero or any value approximate thereto, the value being considerably smaller than that of σ of the partial coherent illumination. The two-light flux interference exposure may be performed in at least one of the first exposure area AR1 and the second exposure area AR2. Also in this embodiment, the liquid immersion exposure may be performed in at least one of the first exposure area AR1 and the second exposure area AR2.

Fourth Embodiment

Figure 5:
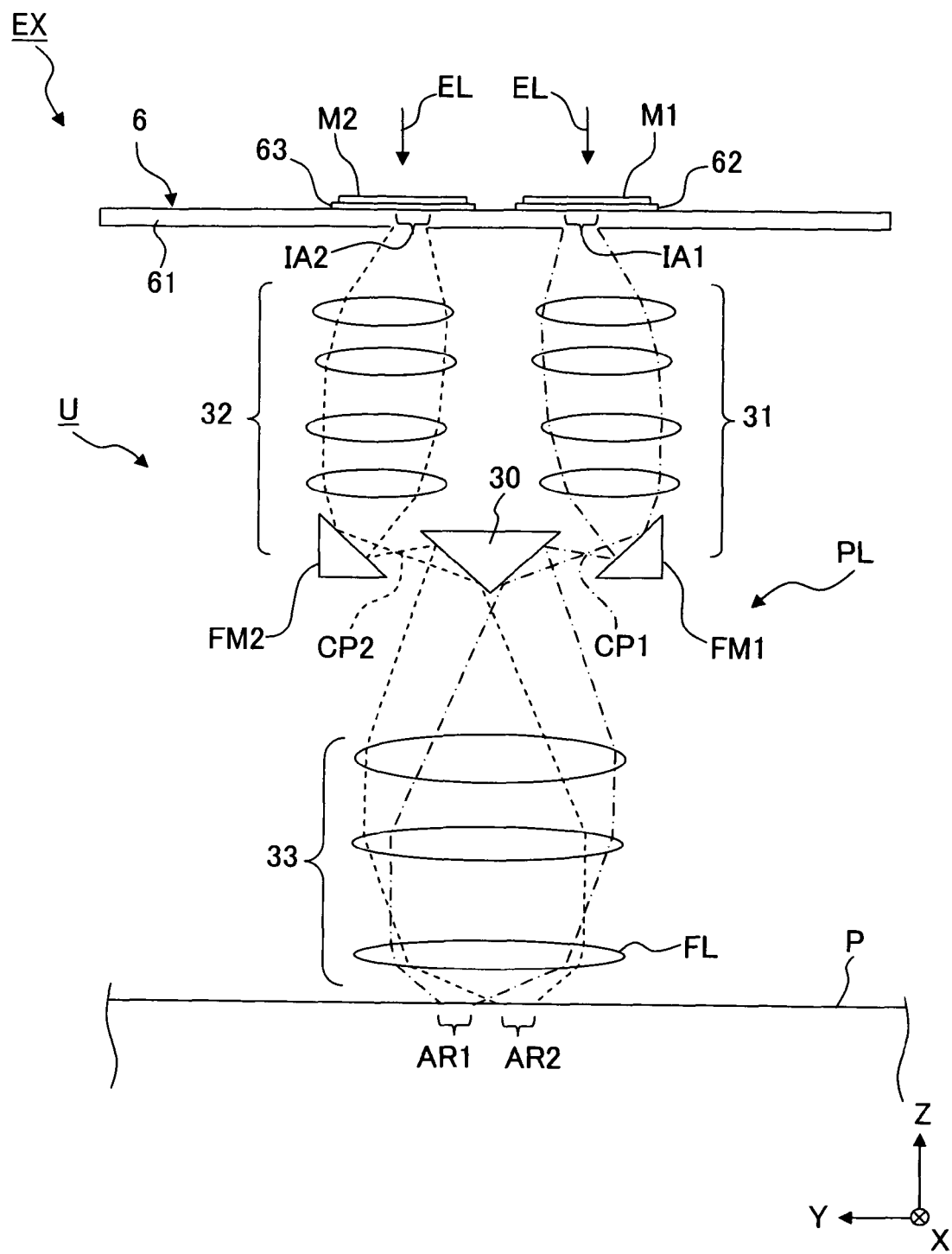
FIG. 5 shows a schematic arrangement view illustrating an exposure apparatus according to a fourth embodiment.

Next, a fourth embodiment of the exposure apparatus and the exposure method of the present invention will be explained. FIG. 5 shows a schematic arrangement view illustrating the fourth embodiment. The constitutive components or parts, which are the same as or equivalent to those of the first to third embodiments described above, are designated by the same reference numerals, any explanation of which will be simplified or omitted. An exposure apparatus EX of this embodiment is also the scanning type exposure apparatus in which the patterned exposure light beams EL are radiated onto the first and second exposure areas AR1, AR2 respectively by synchronously performing the movement of the substrate P in the predetermined scanning direction (Y axis direction) with respect to the first and second exposure areas AR1, AR2, the movement of the first mask M1 in the predetermined scanning direction with respect to the first illumination area IA1, and the movement of the second mask M2 in the predetermined scanning direction with respect to the second illumination area IA2.

With reference to FIG. 5, the exposure apparatus EX includes a mask stage 6 which is movable while holding a first mask M1 for forming an image of a first pattern and a second mask M2 for forming an image of a second pattern. An optical unit U of this embodiment includes a projection system PL which projects, onto the substrate P, the images of the patterns of the first and second masks M1, M2 illuminated with the exposure light beams EL. Although not shown in FIG. 5, the first mask M1 is illuminated with the exposure light beam EL from the first illumination system (IL1), and the second mask M2 is illuminated with the exposure light beam EL from the second illumination system (IL2).

The projection system PL of this embodiment has a single end optical element (last optical element) FL to which the surface of the substrate P is arranged opposite or facing thereto. The exposure light beams EL are radiated onto the first exposure area AR1 and the second exposure area AR2 respectively via the end optical element FL.

The projection system PL has an intermediate optical system 30 which is arranged in the vicinity of the positions optically conjugate with the first exposure area AR1 and the second exposure area AR2 (first and second conjugate positions CP1, CP2 at which intermediate images of the patterns of the first and second masks M1, M2 are formed respectively as described later on) and which guides the exposure light beam EL from the first mask M1 and the exposure light beam EL from the second mask M2 to the end optical element FL. The intermediate optical system 30 has two reflecting surfaces which reflect the exposure light beam EL from the first mask M1 and the exposure light beam EL from the second mask M2 respectively. In this embodiment, the intermediate optical system 30 includes a prism.

The projection system PL has a first optical system 31 which guides the exposure light beam EL from the first mask M1 to the intermediate optical system 30, and a second optical system 32 which guides the exposure light beam EL from the second mask M2 to the intermediate optical system 30. The first and second optical systems 31, 32 are juxtaposed in a predetermined scanning direction (Y axis direction). Each of the first and second optical systems 31, 32 includes a plurality of lenses, and a reflecting member FM1, FM2 which has a reflecting surface for reflecting, toward the intermediate optical system 30, the exposure light beam EL allowed to pass via the plurality of lenses. The reflecting members FM1, FM2 of the first and second optical systems 31, 32 bend the optical paths of the first and second optical systems 31, 32 in a YZ plane including the predetermined scanning direction (Y axis direction) respectively.

The exposure light beams EL, which are patterned by the first and second masks M1, M2, are guided to the intermediate optical system 30 respectively after effecting the intermediate imaging at the first conjugate position CP1 and the second conjugate position CP2 as the optically conjugate positions with respect to the first and second masks M1, M2 via the first and second optical systems 31, 32. After being reflected (bent) by the intermediate optical system 30, the exposure light beam EL from the first mask M1 and the exposure light beam EL from the second mask M2 are radiated onto the first exposure area AR1 and the second exposure area AR2 which are defined in a same field of the projection system PL respectively, via a third optical system 33 including an end (last) optical element FL.

In this embodiment, the intermediate optical system 30 is arranged in the vicinity of the first conjugate position CP1 and the second conjugate position CP2. Therefore, the exposure light beams EL from the first and second optical systems 31, 32 can be guided to the third optical system 33 without making the intermediate optical system 30 to have a large size and the projection system PL to have a lengthy dimension.

The projection system PL of this embodiment includes the first exposure area AR1 corresponding to the first illumination area IA1 and the second exposure area AR2 corresponding to the second illumination area IA2. Each of the first and second exposure areas AR1, AR2 has a slit-shaped form in which the longitudinal direction is in a direction (X axis direction) which traverses the predetermined scanning direction (Y axis direction). Therefore, the cross-sectional shape of the exposure light beam EL, which is obtained in the vicinity of each of the first and second conjugate positions CP1, CP2, is such a shape that the longitudinal direction is in the X axis direction. Therefore, the exposure light beams EL from the first and second optical systems 31, 32 can be easily introduced into the third optical system 33 by using the intermediate optical system 30.

Also in this embodiment, the distance in the Y axis direction between the center of the first exposure area AR1 and the center of the second exposure area AR2 irradiated with the exposure light beams EL from the single end optical element FL is smaller than one shot area on the substrate P as shown in FIG. 2. The first and second exposure areas AR1, AR2 may be partially overlapped with each other on the substrate. The projection system PL of this embodiment is the catadioptric system of the two-headed type having the two fields on a side of the object plane on which the first and second masks M1, M2 are arranged. The images of the patterns in the two fields are projected onto the first and second exposure areas AR1, AR2, respectively, disposed in one field on a side of the image plane on which the substrate P is arranged.

Figure 6:
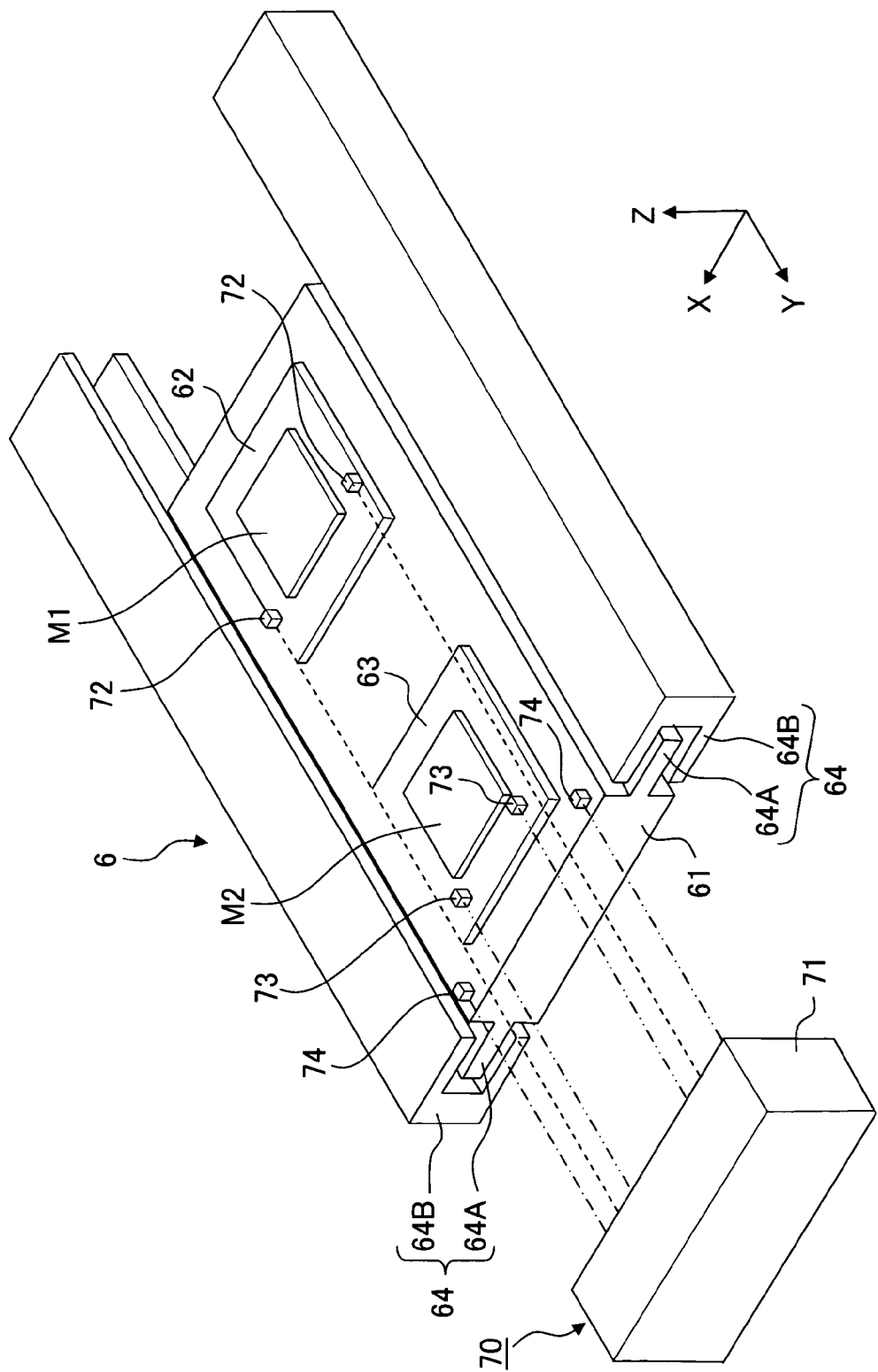
FIG. 6 shows a perspective view illustrating a mask stage according to the fourth embodiment.

FIG. 6 shows a perspective view illustrating the mask stage 6 according to this embodiment. The mask stage 6 includes a first stage 61, a second stage 62 which is movable on the first stage 61 while holding the first mask M1, and a third stage 63 which is movable on the first stage 61 while holding the second mask M2.

The first stage 61 is provided to move the first mask M1 and the second mask M2 in the Y axis direction. The first stage 61 has a relatively large stroke in the Y axis direction so that the entire first pattern of the first mask M1 is moved relative to (allowed to traverse) the first illumination area IA1 and the entire second pattern of the second mask M2 is moved relative to (allowed to traverse) the second illumination area IA2 during the scanning exposure for one shot area SH on the substrate. The mask stage 6 includes a first stage-driving unit 64 for moving the first stage 61 in the Y axis direction. The first stage-driving unit 64 includes, for example, an actuator such as a linear motor. In this embodiment, the first stage-driving unit 64 includes movers 64A which are provided on the both sides of the first stage 61 in the X axis direction, and stators 64B which are provided corresponding to the movers 64A. The control unit 7 is capable of moving the first stage 61 in the Y axis direction by driving the first stage-driving unit 64. When the first stage 61 is moved in the Y axis direction, the second and third stages 62, 63 on the first stage 61 as well as the first and second masks M1, M2 are also moved.

The second stage 62 is provided movably in the X axis direction, the Y axis direction, and the θZ direction on the first stage 61. The first mask M1 is finely movable with respect to the first stage 61 by an unillustrated second stage-driving unit. Similarly, the third stage 63 is provided movably in the X axis direction, the Y axis direction, and the θZ direction on the first stage 61. The second mask M2 is finely movable with respect to the first stage 61 by an unillustrated third stage-driving unit.

The exposure apparatus EX is provided with a measuring system 70 which is capable of measuring the position information about the first stage 61, the second stage 62, and the third stage 63 respectively. The measuring system 70 includes reflecting members 72 which are provided on the second stage 62, reflecting members 73 which are provided on the third stage 63, reflecting members 74 which are provided on the first stage 61, and a laser interferometer 71 which radiates measuring beams onto reflecting surfaces of the reflecting members 72, 73, 74 and which receives the reflected light beams to obtain the position information about the first stage 61, the second stage 62, and the third stage 63 respectively. In this embodiment, the laser interferometer 71 is arranged on the +Y side of the mask stage 6. The reflecting member 74 includes, for example, a corner cube mirror (retroreflector). Two pieces of the reflecting members 74 are provided at predetermined positions on the first stage 61 at which the measuring beams from the laser interferometer 71 can be radiated. The reflecting member 72 includes, for example, a corner cube mirror (retroreflector). Two pieces of the reflecting members 72 are provided at predetermined positions on the second stage 62 at which the measuring beams from the laser interferometer 71 can be radiated. The reflecting member 73 also includes, for example, a corner cube mirror (retroreflector). Two pieces of the reflecting members 73 are provided at predetermined positions on the third stage 63 at which the measuring beams from the laser interferometer 71 can be radiated. Although not shown, the measuring system 70 is also provided with a laser interferometer and a reflecting member (reflecting surface) in order to measure the position information in the X axis direction about the first, second, and third stages 61, 62, 63. The laser interferometer for the X axis and the laser interferometer 71 for the Y axis are collectively referred to below as "laser interferometer 71".

The laser interferometer 71 measures the position information of the first stage 61 in relation to the X axis direction, the Y axis direction, and the θZ direction by using, for example, the reflecting members 74 provided on the first stage 61. The laser interferometer 71 measures the position information of the second and third stages 62, 63 in relation to the X axis direction, the Y axis direction, and the θZ direction by using, for example, the reflecting members 72, 73 provided on the second and third stages 62, 63, respectively. The control unit 7 appropriately drives the first, second, and third stages 61 to 63 on the basis of the measurement result of the laser interferometer 71 to control the positions of the first and second masks M1, M2 held by the second and third stages 62, 63.

Next, an explanation will be made about the operation for exposing the substrate P by the exposure method and the exposure apparatus EX of this embodiment.

As described above, the exposure apparatus EX of this embodiment also performs the multiple exposure for the respective shot areas on the substrate P such that the patterned exposure light beams EL are radiated onto the first and second exposure areas AR1, AR2 respectively by synchronously performing the movement of the substrate P in the predetermined scanning direction (Y axis direction) with respect to the first and second exposure areas AR1, AR2, the movement of the first mask M1 in the predetermined scanning direction with respect to the first illumination area IA1, and the movement of the second mask M2 in the predetermined scanning direction with respect to the second illumination area IA2.

The exposure light beam EL, from the first illumination area IA1 patterned with the first mask M1, is allowed to come into one of the two reflecting surfaces of the intermediate optical system 30 via the first optical system 31. The exposure light beam EL, which is reflected by one of the reflecting surfaces of the intermediate optical system 30, is allowed to come into the third optical system 33. The exposure light beam EL is radiated onto the first exposure area AR1 defined on a side of the image plane of the projection system PL via the end optical element FL of the third optical system 33. On the other hand, the exposure light beam EL, from the second illumination area IA2 patterned with the second mask M2, is allowed to come into the other of the reflecting surfaces of the intermediate optical system 30 via the second optical system 32. The exposure light beam EL, which is reflected by the other of the reflecting surfaces of the intermediate optical system 30, is allowed to come into the third optical system 33. The exposure light beam EL is radiated onto the second exposure area AR2 defined at a position different from the position of the first exposure area AR1 (position away in the +Y direction from the first exposure area AR1) on the side of the image plane of the projection system PL via the end optical element FL of the third optical system 33. In this embodiment, the exposure light beam EL radiated onto the first exposure area AR1 and the exposure light beam EL radiated onto the second exposure area AR2 are radiated onto the substrate P via the single end optical element FL. Therefore, it is possible to simplify the structure of the projection system PL. Further, the first exposure area AR1 and the second exposure area AR2 are defined at the different positions. Therefore, the exposure light beam EL from the first mask M1 and the exposure light beam EL from the second mask M2 can be guided to the third optical system by arranging the reflecting surfaces (30) in the vicinity of the positions optically conjugate with the first and second exposure areas AR1, AR2. Accordingly, the exposure light beam EL from the first mask M1 and the exposure light beam EL from the second mask M2 can be radiated onto the first and second exposure areas AR1, AR2 respectively. That is, the exposure light beam EL from the first mask M1 and the exposure light beam EL from the second mask M2 can be guided to the end optical element FL without using any polarizing beam splitter, because the first exposure area AR1 and the second exposure area AR2 are defined at the different positions. Accordingly, the exposure light beams EL in the desired state (desired polarized state) can be radiated onto the first and second exposure areas AR1, AR2 respectively. In the projection system PL of this embodiment, the exposure light beam EL from the first mask M1 and the exposure light beam EL from the second mask M2, which are reflected by the intermediate optical system 30, are allowed to come into the third optical system 33 symmetrically with respect to an optical axis AX3 of the third optical system 33. Therefore, the temperature distribution in each of the elements in the third optical system 33 can be made symmetrical with respect to the optical axis AX3 as well. Therefore, even when any temperature change (including the temperature distribution change) arises in each of the elements in the third optical system 33, the optical performance of the projection system PL can be maintained in the desired state, for example, by moving and/or inclining a part or parts of the optical elements included in the projection system PL (for example, a part or parts of the lenses included in the third optical system 33). As described above, in this embodiment, each of the shot areas SH on the substrate P is subjected to the multiple exposure with the image of the first pattern of the first mask M1 and the image of the second pattern of the second mask M2 by moving the first mask M1 and the second mask M2 in the Y axis direction (for example, in the +Y direction) by using the mask stage 6 in synchronization with the movement in the Y axis direction (for example, in the −Y direction) of the substrate stage 4 which holds the substrate P.

The control unit 7 determines the movement velocity (scanning velocity) of the substrate stage 4, when each of the shot areas on the substrate P is exposed, on the basis of, for example, the sensitivity of the photosensitive material of the substrates before the start of the exposure for the substrate P. Further, the control unit 7 determines the scanning velocity of the first stage 61 of the mask stage 6 on the basis of the projection magnification of the projection system PL and the scanning velocity of the substrate P. The control unit 7 previously stores respective pieces of position information about the first exposure area AR1 and the second exposure area AR2 in the XY coordinate system defined by the measuring axis of the laser interferometer 4L, in the same manner as in the respective embodiments described above. The control unit 7 moves the second and third stages 62, 63 to adjust the respective positions of the mask M1 and the mask M2 (relative positional relationship between the mask M1 and the mask M2) on the first stage 61, on the basis of the position information about the first exposure area AR1 and the second exposure area AR2 (for example, the distance between the first exposure area AR1 and the second exposure area AR2) so that the projection of the image of the pattern of the first mask M1 onto the first exposure area AR1 and the projection of the image of the pattern of the second mask M2 onto the second exposure area AR2 are started at the desired timings respectively in accordance with the movement of the first stage 61 in the Y axis direction. After the completion of the adjustment, the control unit 7 successively performs the multiple exposure for the respective shot areas on the substrate P.

For example, as shown in FIG. 2, when one shot area SH on the substrate P is subjected to the multiple exposure while moving the substrate P in the −Y direction with respect to the first and second exposure areas AR1, AR2, then the control unit 7 moves the substrate stage 4 in the −Y direction on the basis of the measurement result of the laser interferometer 4L, and the control unit 7 controls the first stage-driving unit 64 to move the first stage 61 in the +Y direction on the basis of the position information about the first stage 61 measured by using the laser interferometer 71 and the reflecting members 74.

Then, in FIG. 2, the projection of the pattern of the first mask M1 is started when the edge G1 of the shot area SH on the −Y side arrives at the first exposure area AR1. Further, the projection of the image of the pattern of the mask M1 onto the first exposure area AR1 is continuously performed by continuing the movement of the first stage 61 in the +Y direction and the movement of the substrate stage 4 in the −Y direction. The first pattern of the mask M1 is moved relative to the first illumination area IA1, and the shot area SH is moved relative to the first exposure area AR1. Then, in FIG. 2, the projection of the pattern of the first mask M1 comes to an end at the point of time at which the edge G2 of the shot area SH on the +Y side arrives at the edge of the first exposure area AR1 on the −Y side. Accordingly, the exposure (first scanning exposure) is completed for the shot area SH with the exposure light beam EL radiated onto the first exposure area AR1. The edge G1 of the shot area SH on the −Y side arrives at the second exposure area AR2 during the period of time (during the first scanning exposure) in which the first exposure area AR1 exists on the shot area SH. The projection of the pattern of the second mask M2 is started when the edge G1 of the shot area SH on the −Y side arrives at the second exposure area AR2. As described above, the position of the first mask M1 and the position of the second mask M2 with respect to the first stage 61, i.e., the relative positional relationship between the first mask M1 and the second mask M2 on the first stage 61 is previously adjusted on the basis of the relative positional relationship (distance in the Y axis direction) between the first exposure area AR1 and the second exposure area AR2. Therefore, the projection of the pattern of the second mask M2 can be started when the edge G1 of the shot area SH on the −Y side arrives at the second exposure area AR1 by synchronously moving the substrate stage 4 and the first stage 61. Further, the projection of the image of the pattern of the second mask M2 onto the second exposure area AR2 is continuously performed by continuing the movement of the first mask stage 61 in the +Y direction and the movement of the substrate stage 4 in the −Y direction. The second pattern of the second mask M2 is moved relative to the second illumination area IA2, and the shot area SH is moved relative to the second exposure area AR2. Then, in FIG. 2, the projection of the pattern of the second mask M2 comes to an end at the point of time at which the edge G2 of the shot area SH on the +Y side arrives at the edge of the second exposure area AR2 on the −Y side. Accordingly, the exposure (second scanning exposure) is also completed for the shot area SH with the exposure light beam EL radiated onto the second exposure area AR2 after the completion of the first scanning exposure for the shot area SH. That is, the multiple exposure is also completed for the shot area SH with the image of the first pattern of the first mask M1 and the image of the second pattern of the second mask M2. Also in this embodiment, it is allowable that the start and the end of each of the scanning exposure processes are controlled by the variable field diaphragm (mask blind system) arranged in each of the illumination systems in the same manner as in the first embodiment described above.

As described above, also in this embodiment, one shot area SH can be subjected to the multiple (double) exposure with the image of the first pattern and the image of the second pattern by one time of the scanning operation. Further, the plurality of shot areas on the substrate P can be subjected to the multiple exposure efficiently by repeating the scanning operation of the substrate P in the −Y direction and the scanning operation in the +Y direction.

In this embodiment, the positions of the first and second masks M1, M2 on the first stage 61 (relative positions of the first mask M1 and the second mask M2) are previously adjusted, for example, on the basis of the relative positional relationship between the first exposure area AR1 and the second exposure area AR2, and the substrate stage 4 and the first stage 61 are synchronously moved on the basis of the measurement results of the laser interferometers 4L, 71. Accordingly, the projection of the first pattern of the first mask M1 and the projection of the second pattern of the second mask M2 can be executed at the predetermined timings respectively. The image of the first pattern of the first mask M1 and the image of the second pattern of the second mask M2 can be formed in the desired positional relationship in each of the shot areas SH. In this embodiment, it is also allowable that the adjustment of the projection timings of the first and second patterns is performed by the mask blind system as described above, and only the adjustment of the relative positional relationship between the first and second masks M1, M2 is performed in order to perform the highly accurate positional adjustment (alignment) between the images of the first and second patterns and the shot area on the substrate.

There is such a possibility that the relative position between the substrate stage 4 and the first stage 61, i.e., the relative position between the substrate P and at least one of the first and second masks M1, M2 may be deviated from the target relative position when one shot area SH on the substrate P is subjected to the multiple exposure as shown in FIG. 2. In this embodiment, the deviation of the relative position can be sensed from the measurement results of the laser interferometers 4L, 71. Accordingly, when the deviation of the relative position is sensed, the control unit 7 moves at least one of the second stage 62 and the third stage 63 on the basis of the measurement results of the laser interferometers 4L, 71 to adjust the position of at least one of the first mask M1 and the second mask M2. Accordingly, the respective positional relationships among the first and second masks M1, M2 and the shot area SH are always adjusted to be in the desired state. The image of the first pattern and the image of the second pattern can be formed in the shot area SH in the desired positional relationship.

There is such a possibility that the relative positional relationship between the first exposure area AR1 and the second exposure area AR2 may be changed due to the change of the optical characteristic of the projection system PL caused, for example, by the radiation of the exposure light beam EL onto the projection system PL and the change (variation) of the environment around the projection system PL (including the temperature change and the pressure change). In such a case, the radiation amount of the exposure light beam EL onto the projection system PL and the environmental change around the projection system PL may be detected, and at least one of the second stage 62 and the third stage 63 may be moved on the basis of the detection result to adjust the position of at least one of the first mask M1 and the second mask M2 so that the first pattern of the first mask M1 and the second pattern of the second mask M2 are formed at the desired positions in the shot area SH respectively.

At least one of the first optical system 31, the second optical system 32, and the third optical system 33 may be adjusted to correct the relative positional relationship (for example, the distance in the Y axis direction) between the first exposure area AR1 and the second exposure area AR2. Further, the image formation characteristic and/or the imaging characteristic of the projection system PL is also fluctuated due to the radiation amount and the environmental change as described above. Accordingly, it is preferable to perform, for example, at least one of the adjustment of the projection system PL (including the movement of the optical element), the adjustment of the wavelength characteristic (for example, the central wavelength and the spectrum width) of the exposure light beam EL, and the movement of the substrate P (positional adjustment in the Z axis direction, the θX direction, and the θY direction) on the basis of the detection result described above. Accordingly, it is possible to suppress (correct) the fluctuation of the image formation characteristic and/or to avoid the deterioration of the exposure accuracy caused by the fluctuation.

In this embodiment, the measuring system 70 obtains the position information about the first stage 61 by using the reflecting members 74 provided on the first stage 61, and the control unit 7 controls the position of the first stage 61 on the basis of the position information. However, the reflecting members 74 may be omitted, and the movement of the first stage 61 may be controlled by using at least one of the position information about the second stage 62 obtained by using the reflecting members 72 and the position information about the third stage 63 obtained by using the reflecting members 73.

In this embodiment, the second and third stages 62, 63 are provided as the mechanism for making the first and second masks M1, M2 movable, and the reflecting members 72, 73 are provided in order to obtain the position information about the second and third stages 62, 63. However, the mechanism and members may be omitted when the change of the relative position between the first exposure area AR1 and the second exposure area AR2 and the synchronization error (position error) between the first stage 61 and the substrate stage 4 can be permitted (in an allowable range). In this case, the first mask M1 and the second mask M2 may be fixed at predetermined positions on the first stage 61 respectively to only synchronously move the first stage 61 and the substrate stage 4 on the basis of the position information about the first stage 61 obtained by the laser interferometer 71 by using the reflecting mirrors 74 and the position information about the substrate stage 4 obtained by the laser interferometer 4L. In this case, it is also allowable that a detecting system (for example, an optical sensor such as an encoder), which detects the information about the relative positional relationship between the first and second masks M1, M2, for example, the position information (position or displacement) of the first and second masks M1, M2, may be provided separately from the laser interferometer 71. It is also allowable to provide an actuator for adjusting the relative positional relationship between the first and second masks M1, M2, for example, a piezoelectric element or a voice coil motor for finely moving at least one of the first and second masks M1, M2.

In this embodiment, the first mask M1 and the second mask M2 are moved in the Y axis direction by mainly using the first stage 61. However, as in the third embodiment, the mask stage for the first mask M1 and the mask stage for the second mask M2 may be provided separately. In this case, the first and second masks M1, M2 may be moved in the XZ plane as in the third embodiment. Alternatively, the first and second masks M1, M2 may be moved in the XY plane in the same manner as in this embodiment.

Fifth Embodiment

Figure 7:
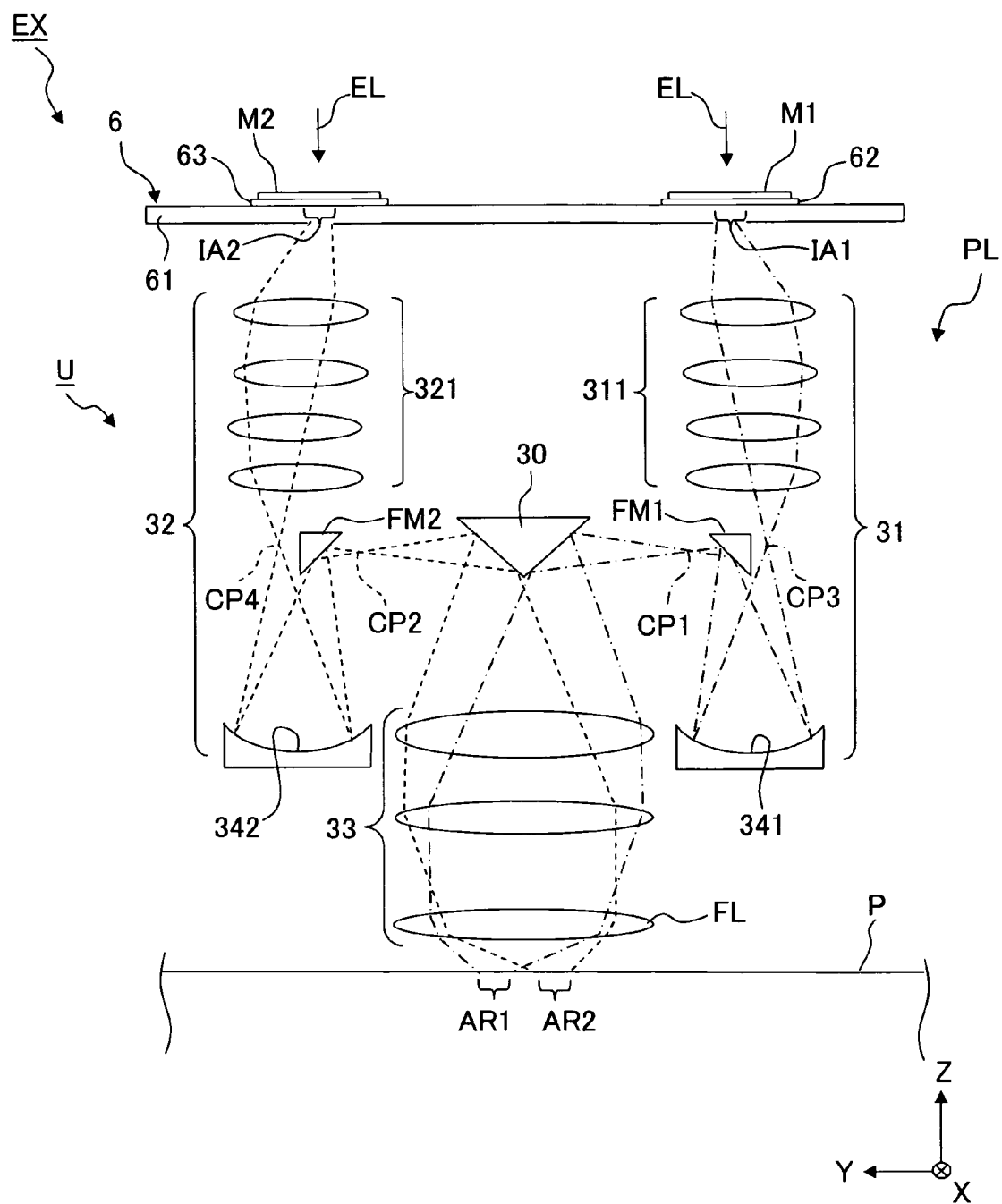
FIG. 7 shows a schematic arrangement view illustrating an exposure apparatus according to a fifth embodiment.

Next, an explanation will be made about a fifth embodiment of the exposure apparatus and the exposure method of the present invention. FIG. 7 shows a schematic arrangement view illustrating the fifth embodiment. This embodiment is different from the fourth embodiment in that the first optical system 31 and the second optical system 32 have concave mirrors 341, 342, respectively. The difference between the fourth and fifth embodiments will be principally explained below. The constitutive components or parts, which are the same as or equivalent to those of the fourth embodiment described above, are designated by the same reference numerals, any explanation of which will be simplified or omitted.

As shown in FIG. 7, the projection system PL of this embodiment has the single end (last) optical element FL to which a surface of the substrate P is arranged opposite in the same manner as in the fourth embodiment described above. The exposure light beams EL are radiated onto the first exposure area AR1 and the second exposure area AR2 respectively via the single end optical element FL. The projection system PL has an intermediate optical system 30 which is arranged in the vicinity of positions (CP1, CP2) optically conjugate with the first exposure area AR1 and the second exposure area AR2 and which guides the exposure light beam EL from the first mask M1 and the exposure light beam EL from the second mask M2 to the third optical system 33.

The first optical system 31, which guides the exposure light beam EL from the first mask M1 to the intermediate optical system 30, has the concave mirror 341. Similarly, the second optical system 32, which guides the exposure light beam EL from the second mask M2 to the intermediate optical system 30, also has the concave mirror 342.

The exposure light beams EL, which are patterned by the first and second masks M1, M2 respectively, are guided to the intermediate optical system 30 by the first and second optical systems 31, 32 respectively. The exposure light beam EL from the first mask M1 and the exposure light beam EL from the second mask M2 are reflected by the intermediate optical system 30, and then the exposure light beams EL are radiated onto the first exposure area AR1 and the second exposure area AR2 respectively via the third optical system 33 including the end optical element FL.

In this embodiment, the first optical system 31 is provided with a first imaging optical system 311 which forms a third conjugate position CP3, as a position optically conjugate with the first mask M1 and the first conjugate position CP1, in the optical path therein. A first optical path-bending mirror FM1 is arranged in the vicinity of the third conjugate position CP3 (in the vicinity of the first conjugate position CP1). The first optical path-bending mirror FM1 bends the optical path of the first optical system 31 in a YZ plane including a predetermined scanning direction (Y axis direction). The first optical system 31 is the catadioptric system which forms the intermediate images of the pattern of the first mask M1 at the two positions CP3, CP1 respectively. On the other hand, the second optical system 32 is provided with a second imaging optical system 321 which forms a fourth conjugate position CP4, as a position optically conjugate with the second mask M2 and the second conjugate position CP2, in the optical path therein. A second optical path-bending mirror FM2 is arranged in the vicinity of the fourth conjugate position CP4 (in the vicinity of the second conjugate position CP2). The second optical path-bending mirror FM2 bends the optical path of the second optical system 32 in a YZ plane including the predetermined scanning direction (Y axis direction). The second optical system 32 is the catadioptric system which forms the intermediate images of the pattern of the second mask M2 at the two positions CP4, CP2 respectively. In this embodiment, the first and second optical path-bending mirrors FM1, FM2 are arranged in the vicinity of the image conjugate positions (first to fourth conjugate positions CP1 to CP4). Therefore, it is possible to miniaturize the optical path-bending mirrors FM1, FM2. In this embodiment, no reflecting surface intervenes between the optical path ranging from the first imaging optical system 311 to the concave mirror 341 and the optical path ranging from the second imaging optical system 321 to the second concave mirror 342. Therefore, the first and second optical systems 31, 32 and the third optical system 33 can be arranged so that they are partially overlapped in the Z direction with one another. The entire length of the projection system PL (distance between the substrate P and the first and second masks M1, M2) can be suppressed to be short.

Also in this embodiment, the intermediate optical system 30 is arranged in the vicinity of the first conjugate position CP1 and the second conjugate position CP2 in the same manner as in the fourth embodiment. Therefore, the exposure light beams EL from the first and second optical systems 31, 32 can be guided to the third optical system 33 without causing the intermediate optical system 30 to be large-sized and the projection system PL to have lengthy dimension.

The projection system PL of this embodiment also includes the first exposure area AR1 corresponding to the first illumination area IA1 and the second exposure area AR2 corresponding to the second illumination area IA2. Each of the first and second exposure areas AR1, AR2 has a slit-shaped form in which the longitudinal direction is in a direction (X axis direction) which traverses the predetermined scanning direction (Y axis direction). Therefore, the cross-sectional shape of the exposure light beam EL, which is obtained in the vicinity of each of the first to fourth conjugate positions CP1 to CP4, is such a shape that the longitudinal direction is in the X axis direction. Therefore, the optical paths can be easily separated before and after (at positions behind and in front of) the concave mirrors 341, 342. In addition, the exposure light beams EL, from the first and second optical systems 31, 32 respectively, can be easily introduced into the third optical system 33 by using the intermediate optical system 30.

Also in this embodiment, the multiple exposure can be performed for each of the shot areas SH on the substrate P by one time of the scanning operation without causing any deterioration of the throughput. Also in the projection system PL of this embodiment, the exposure light beam EL from the first mask M1 and the exposure light beam EL from the second mask M2 can be guided to the third optical system 33 without using any polarizing beam splitter. Therefore, the exposure light beams EL in the desired state (polarized state) can be radiated onto the first and second exposure areas AR1, AR2 respectively. In the projection system PL of this embodiment, the first and second optical systems 31, 32 have the concave mirrors 341, 342 respectively. Therefore, the so-called Petzval sum is allowed to approach zero with ease. Even when the numerical aperture on the image side of the projection system PL is large, it is possible to obtain the large exposure areas (AR1, AR2).

In this embodiment, the image conjugate positions (first and second conjugate positions CP1, CP2) are positioned between the first and second optical path-bending mirrors FM1, FM2 and the respective reflecting surfaces of the intermediate optical system 30. Therefore, the influence, which is exerted by the polarization caused by the reflection at the first and second optical path-bending mirrors FM1, FM2, is in the direction opposite to the direction of the influence which is exerted by the polarization caused by the reflection at the respective reflecting surfaces of the intermediate optical system 30. Accordingly, even when the exposure light beam EL is the polarized light beam, it is possible to reduce the influence on the polarized state thereof.

In the fourth and fifth embodiments, the exposure light beam EL patterned by DMD may be allowed to come into the projection system PL as explained with reference to FIGS. 5 and 7, and the exposure light beam EL may be radiated onto each of the first and second exposure areas AR1, AR2 defined on the substrate P. In this case, it is also allowable that the mask stage is not provided.

In the fourth and fifth embodiments, it is also allowable that the liquid immersion exposure is executed in at least one of the first exposure area AR1 and the second exposure area AR2.

In the fourth and fifth embodiments, it is also allowable that the exposure condition differs between the exposure for the substrate P with the exposure light beam EL radiated onto the first exposure area AR1 and the exposure for the substrate P with the exposure light beam EL radiated onto the second exposure area AR2. The illumination condition for the first pattern may be different from the illumination condition for the second pattern, for example, in consideration of the difference between the first pattern of the first mask M1 and the second pattern of the second mask M2.

It is also allowable that the type of the first mask M1 is different from the type of the second mask M2. For example, one of the first and second masks M1, M2 may be a phase shift mask, and the other of the first and second masks M1, M2 may be a binary mask.

In the fourth and fifth embodiments, a part or parts of the optical elements of the first optical system 31 for allowing the exposure light beam EL from the first mask M1 to pass via the elements and a part or parts of the optical elements of the second optical system 32 for allowing the exposure light beam EL from the second mask M2 to pass via the elements may be movable and/or inclinable to independently adjust the pattern image to be projected onto the first exposure area AR1 and the pattern image to be projected onto the second exposure area AR2 respectively.

In the fourth and fifth embodiments, the first pattern is formed on the first mask M1, and the second pattern is formed on the second mask M2 which is different from the first mask M1. However, the first pattern and the second pattern may be formed on one mask. The substrate P can be subjected to the multiple exposure with the image of the first pattern and the image of the second pattern formed on the one mask.

Sixth Embodiment

Figure 8:
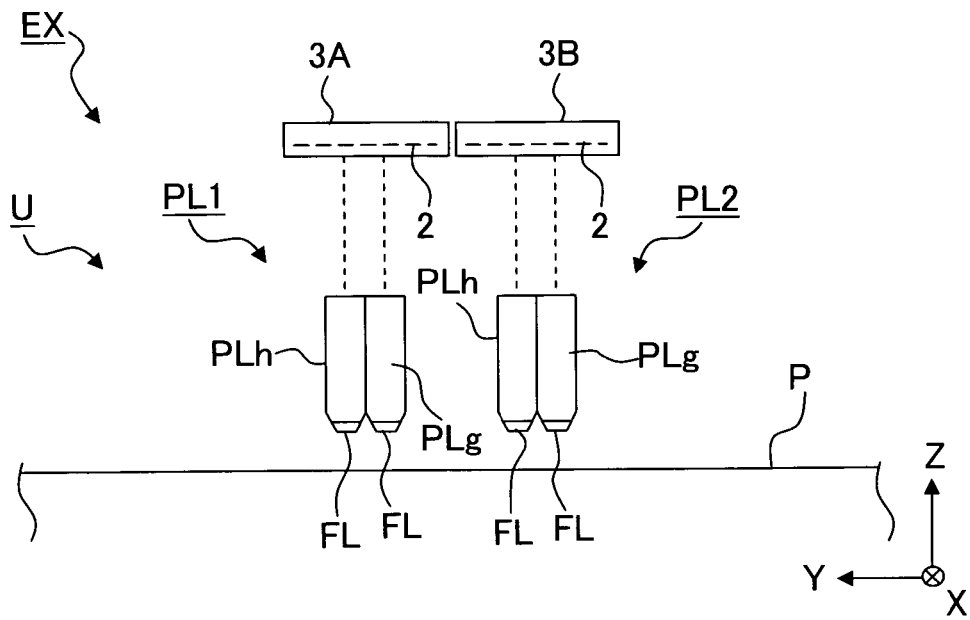
FIG. 8 shows a schematic arrangement view illustrating an exposure apparatus according to a sixth embodiment.
Figure 9:
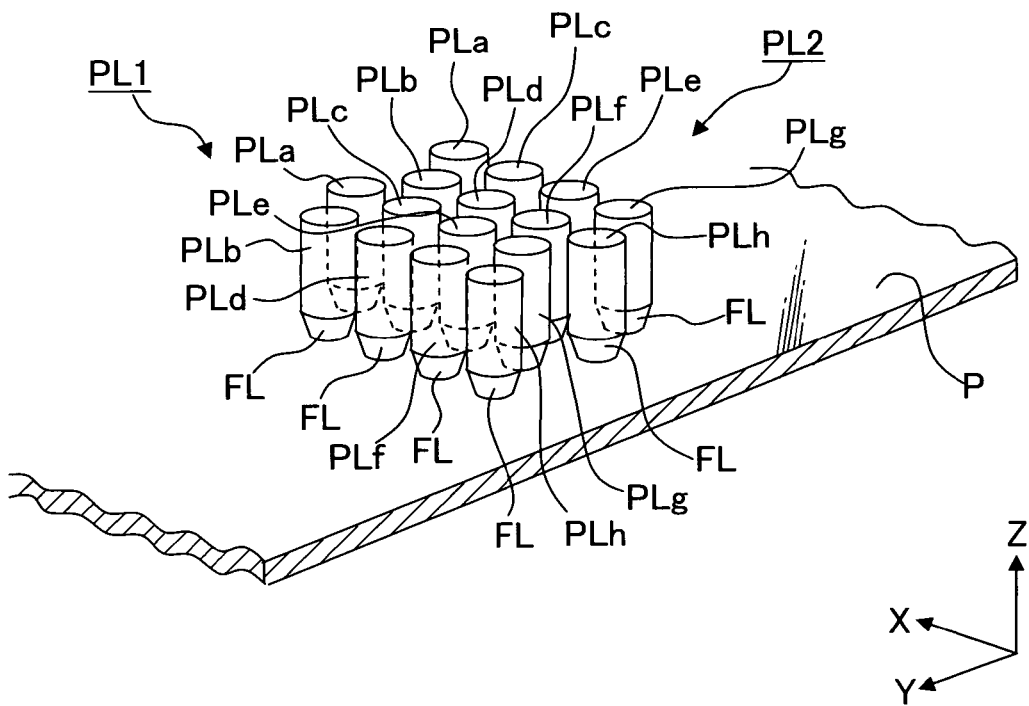
FIG. 9 shows a perspective view illustrating the exposure apparatus according to the sixth embodiment.

Next, an explanation will be made about a sixth embodiment of the exposure apparatus and the exposure method of the present invention. FIG. 8 shows a schematic arrangement view of an exposure apparatus EX according to the sixth embodiment, and FIG. 9 shows a perspective view illustrating the exposure apparatus EX. This embodiment is different from the first embodiment in that each of the first and second projection systems PL1, PL2 is provided with a plurality of projection systems, and the exposure light beams EL, from the first and second pattern-forming units 3A, 3B, are radiated onto the first and second exposure areas AR1, AR2 via the plurality of projection systems respectively. The difference between the first and sixth embodiments will be mainly explained below. The constitutive components or parts, which are the same as or equivalent to those of the first embodiment described above, are designated by the same reference numerals, any explanation of which will be simplified or omitted.

In this embodiment, each of the first and second projection systems PL1, PL2 includes a plurality of (eight in this embodiment) projection systems PLa to PLh for which radiated areas of the exposure light beam EL are arranged at different positions in relation to the X axis direction and the Y axis direction on the XY plane. In the following description, the eight projection systems PLa to PLh are appropriately referred to as "first to eighth projection modules PLa to PLh" respectively. In the following description, when the projection module is explained, the first projection module PLa is mainly explained in some cases. However, in this embodiment, the respective projection modules PLa to PLh are constructed in approximately a same manner.

In the case of the first and second illumination systems IL1, IL2 of this embodiment (not shown in FIG. 8), the first and second pattern-forming units 3A, 3B, which include DMD's having the reflecting elements 2 respectively as explained in the first and second embodiments, are illuminated with the exposure light beams EL.

Each of the first to eighth projection modules PLa to PLh includes an end (last) optical element FL having a lower surface (light-exit surface) to which the surface of the substrate P is arranged opposite. The lower surfaces of the projection modules PLa to PLh have approximately the same height (are flush with one another) respectively. As described above, each of the first projection system PL1 and the second projection system PL2 has the plurality of end optical elements FL to which the surface of the substrate P held by the substrate stage 4 is arranged opposite. The exposure light beams EL are allowed to exit from the respective end optical elements.

A first group of projection modules PLa, PLc, PLe, PLg, which are included in the plurality of projection modules PLa to PLh of the first projection system PL1, are arranged in an array (row) in the X axis direction. A second group of projection modules PLb, PLd, PLf, PLh are also arranged in array in the X axis direction. The first group of projection modules PLa, PLc, PLe, PLg and the second group of projection modules PLb, PLd, PLf, PLh are arranged such that they are away from each other in the Y axis direction and they are deviated by predetermined amounts in the X axis direction. The first group of projection modules PLa, PLc, PLe, PLg and the second group of projection modules PLb, PLd, PLf, PLh are arranged in a zigzag form as a whole. That is, the first group of projection modules PLa, PLc, PLe, PLg and the second group of projection modules PLb, PLd, PLf, PLh have the positions which are deviated from each other in the X axis direction, and they have approximately the same arrangement intervals. The plurality of projection modules PLa to PLh are not limited to the arrangement described above. The arrangement may be arbitrary provided that the projection areas (radiated areas of the exposure light beams) are arranged at predetermined intervals (spacing distances) in relation to the X axis direction.

The second projection system PL2 is arranged away from the first projection system PL1 in relation to the scanning direction of the substrate P (Y axis direction). Further, the second projection system PL2 has the plurality of projection modules PLa to PLh which are arranged in the same manner as the plurality of projection modules PLa to PLh of the first projection system PL1.

The exposure light beam EL, which is allowed to come into the projection modules PLa to PLh, is allowed to exit from the lower surfaces of the end optical elements FL respectively, and the exposure light beam EL is radiated onto the substrate P. In this embodiment, the first and second exposure areas AR1, AR2, onto which the exposure light beams EL are radiated via the first and second projection systems PL1, PL2, are constructed by the projection areas of the plurality of projection modules PLa to PLh respectively.

Figure 10:
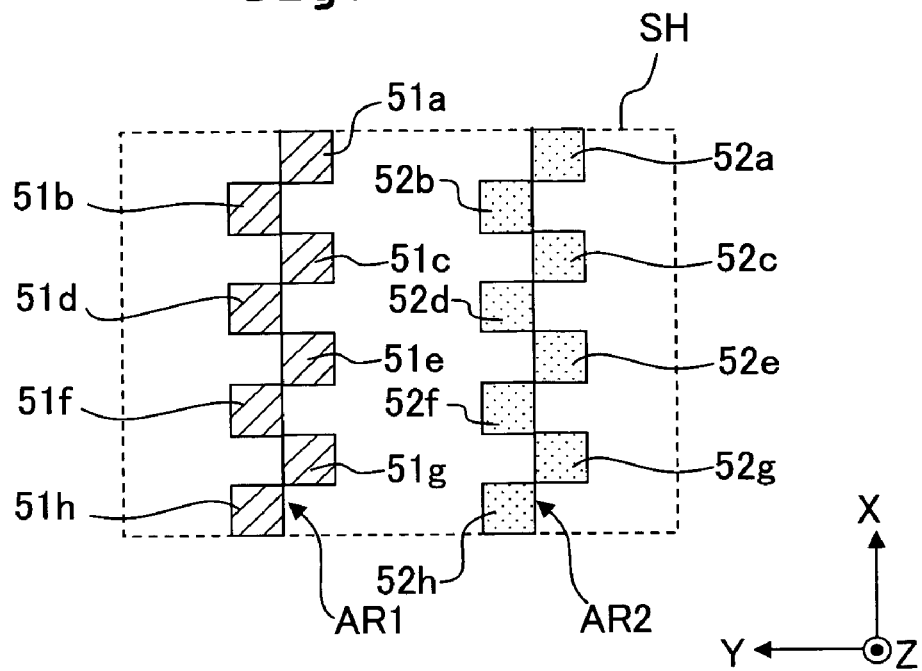
FIG. 10 schematically shows a relationship between the first and second exposure areas and the shot area.

FIG. 10 schematically shows the relationship between the first exposure area AR1 and the second exposure area AR2 on the substrate P and the shot area SH on the substrate P. With reference to FIG. 10, the projection modules PLa to PLh of the first projection system radiate the exposure light beam EL onto a plurality of radiated areas 51a to 51h on the substrate P. The radiated areas 51a to 51h correspond to the projection areas in which the pattern images are generated in the fields of the projection modules PLa to PLh respectively. The first exposure area AR1 is constituted by the plurality of radiated areas 51a to 51h.

The radiated areas 51a to 51h are defined to have predetermined shapes, for example, rectangular shapes (approximately square shapes in this embodiment), and the widths in the X axis direction are approximately identical with each other. The first group of radiated areas 51a, 51c, 51e, 51g, which are included in the radiated areas 51a to 51h, are arranged at predetermined intervals in the X axis direction so that the centers thereof are set on a first straight line which is parallel to the X axis. The second group of radiated areas 51b, 51d, 51f, 51h are also arranged at the same intervals as those of the first group of radiated areas in the X axis direction so that the centers thereof are set on a second straight line which is parallel to the X axis. The first group of radiated areas 51a, 51c, 51e, 51g and the second group of radiated areas 51b, 51d, 51f, 51h are arranged while being away from each other in the Y axis direction and being deviated from each other in the X axis direction. In this embodiment, the first group of radiated areas and the second group of radiated areas are arranged while being deviated from each other by the widths of the radiated areas in relation to the X axis direction, wherein the edges on the +Y side of the first group of radiated areas are arranged at the same positions as those of the edges on the −Y side of the second group of radiated areas in relation to the Y axis direction. As for each of the radiated areas 51*a* to 51*h*, the intensity distribution of the exposure light beam EL in relation to the X axis direction has inclined portions (slope portions) at both ends thereof at which the intensity is gradually decreased respectively. That is, in this embodiment, the exposure light beam EL is radiated onto each of the radiated areas so that the intensity distribution in the X axis direction has a substantially trapezoidal shape.

FIG. 10 shows the radiated areas of the exposure light beam EL in which the intensity is a half of the peak value. Therefore, the radiated areas of the first and second groups are depicted so that the edges on the −X side (+X side) of the first group of radiated areas are disposed at the same positions as those of the edges on the +X side (−X side) of the second group of radiated areas in relation to the X axis direction. However, actually, the exposure light beam EL is radiated onto areas which are slightly wider than the radiated areas shown in FIG. 10 in relation to the X axis direction. Specifically, the exposure light beam EL is radiated onto the areas which are wider then the radiated areas shown in FIG. 10 by the widths each corresponding to one circumferential portion on each of the ±X sides so that the first group of radiated areas and the second group of radiated areas are partially overlapped with each other at end portions thereof in relation to the X axis direction, i.e., the circumferential portions on the −X side (+X side) of the first group of radiated areas and the circumferential portions on the +X side (−X side) of the second group of radiated areas are overlapped with each other in relation to the X axis direction. The slope portions, at the both ends of the intensity distribution in the X axis direction described above, are defined at the circumferential portions on the ±X sides of each of the radiated areas. Further, the same area (overlapped area) on the substrate P is subjected to the scanning exposure by the circumferential portion on the −X side (+X side) of each of the first group radiated areas and the circumferential portion on the +X side (−X side) of each of the second group of radiated areas. Accordingly, in this embodiment, when the substrate P is exposed while moving the projection modules PLa to PLh relative to the substrate P in the Y axis direction, the totalized exposure amount is equal to one another at the respective positions in the shot area on the substrate P.

On this assumption, the intensity distribution in the X axis direction described above has the slope portions at the both ends thereof in each of the radiated areas of the projection modules PLa to PLh. However, for example, when the stitching exposure is not performed for at least a plurality of shot areas aligned in the X axis direction on the substrate P, it is allowable that the respective intensity distributions do not have any slope portion at the circumferential portion on the +X side of the radiated area 51*a* of the projection module PLa and the circumferential portion on the −X side of the radiated area of the projection module PLh, or that the mask blind system is used to prevent the circumferential portion from being irradiated with the exposure light beam EL during the exposure. Further, the exposure light beam EL is radiated so that the intensity distribution of the exposure light beam EL in the Y axis direction is substantially rectangular in relation to each of the radiated areas of the projection modules PLa to PLh. It is assumed that each of the radiated areas of the projection modules PLa to PLh is substantially square on the substrate P. However, any shape other than the square may also be adopted. For example, it is also allowable to use rhombuses, parallelograms, or trapezoids in which a pair of parallel sides are arranged, for example, in the X axis direction.

Similarly, the projection modules PLa to PLh of the second projection system PL2 radiate the exposure light beam EL onto a plurality of radiated areas 52*a* to 52*h* on the substrate P to form the pattern images on the radiated areas. The second exposure area AR2 is constructed by the plurality of radiated areas 52*a* to 52*h*.

The arrangement of the plurality of radiated areas 52*a* to 52*h* of the second projection system PL2 is substantially equivalent to the arrangement of the plurality of radiated areas 51*a* to 51*h* of the first projection system PL1. The first exposure area AR1 including the plurality of radiated areas 51*a* to 51*h* of the first projection system PL1 is away from the second exposure area AR2 including the plurality of radiated areas 52*a* to 52*h* of the second projection system PL2 in the Y axis direction. As shown in FIG. 10, also in this embodiment, the distance in the Y axis direction between the center of the first exposure area AR1 and the center of the second exposure area AR2 is smaller than the size of one shot area SH in the Y axis direction.

The control unit 7 performs the multiple exposure for the shot area SH on the substrate P with the image of the first pattern formed by the exposure light beam EL radiated onto the first exposure area AR1 and the image of the second pattern formed by the exposure light beam EL radiated onto the second exposure area AR2 by moving the substrate P in the Y axis direction so that the shot area SH on the substrate P is moved relative to the first exposure area AR1 and the second exposure area AR2.

As explained above, also in this embodiment, the shot area SH on the substrate P can be subjected to the multiple exposure by one time of the scanning operation. It is thus possible to improve the throughput. Further, it is also possible to improve the positional adjustment accuracy between the first pattern and the second pattern on the substrate P.

The plurality of projection modules PLa to PLh are provided in order to radiate the exposure light beams EL onto the first and second exposure areas AR1, AR2 respectively. Therefore, it is possible to suppress the optical elements of the respective projection modules PLa to PLh from becoming large, and the resolution can be improved while maintaining the satisfactory optical characteristics of the projection modules PLa to PLh. That is, when the shot area SH having the predetermined size is exposed by using any single projection system, there is such a possibility that the optical elements of the projection system may be large-sized, when the numerical aperture of the projection system is increased in order to improve the resolution. There is such a possibility that any large-sized optical element is difficult to be produced in some cases, and the production cost may be increased in other cases. On the other hand, when it is intended to increase the numerical aperture without large-sizing the optical element, then the projection area, which is provided by one projection system (projection module), is decreased, and the size of the shot area capable of being exposed by one time of the scanning exposure is consequently decreased as well. In this embodiment, the plurality of projection modules PLa to PLh are provided in the aligned manner, and the predetermined shot area SH on the substrate P is exposed by using the respective projection modules PLa to PLh. Therefore, the shot area SH having the desired size can be exposed at the high resolution while suppressing each of the optical elements of the projection modules PLa to PLh to be large.

Figure 11:
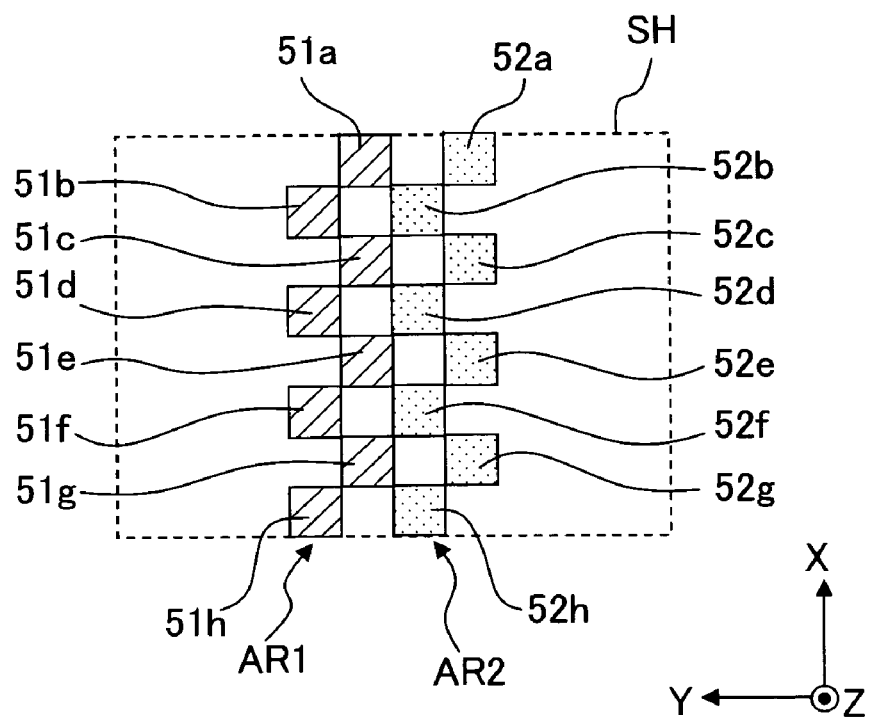
FIG. 11 schematically shows a relationship between the first and second exposure areas and the shot area.

In this embodiment, the first exposure area AR1 and the second exposure area AR2 are away from each other in the Y axis direction. However, as shown in FIG. 11, the first exposure area AR1 and the second exposure area AR2 may be allowed to be close to one another in the Y axis direction.

Further, the first exposure area AR1 and the second exposure area AR2 may be partially overlapped with each other in the Y axis direction.

Each of the first and second pattern-forming units 3A, 3B may be provided with a plurality of DMD's. For example, it is also allowable to provide DMD's which are arranged corresponding to areas optically conjugate with the radiated areas 51a to 51h respectively in relation to the projection modules PLa to PLh of the first projection system PL1. Further, the illumination systems IL1, IL2 may illuminate, with the exposure light beams, only parts of the first and second pattern-forming units 3A, 3B, i.e., a plurality of areas (including areas conjugate with the radiated areas) necessary to generate the patterns with which the images are formed in the radiated areas 51a to 51h, 52a to 52h. Alternatively, predetermined areas including the plurality of areas may be entirely illuminated with the exposure light beams. Also in this embodiment, it is preferable that the start and the end of the scanning exposure for each of the first and second exposure areas AR1, AR2 are controlled by the mask blind system and/or DMD in the same manner as in the first embodiment described above.

In this embodiment, the radiated areas of the plurality of projection modules PLa to PLh are divided into those belonging to the first group and the second group, and the plurality of radiated areas are arranged in array in parallel to the X axis direction on the XY plane for each of the groups. However, the arrangement of the plurality of radiated areas is not limited thereto. For example, the plurality of radiated areas may be divided into radiated areas belonging to three or more groups. The three or more groups may be arranged while being away from each other in the X axis direction. In this case, it is preferable that the positions of all of the radiated areas in the X axis direction are different from each other in the same manner as in this embodiment. The arrays of the plurality of projection areas of each of the groups may intersect the X axis direction. In principle, it is enough that the arrays are parallel to the direction intersecting the Y axis direction. It is also allowable that the plurality of radiated areas of each of the groups are not arranged in array. For example, when the array is parallel to the X axis direction, a part or parts or all of the plurality of radiated areas in array may be allowed to have different positions in the Y axis direction. In principle, it is enough that the plurality of radiated areas are arranged at predetermined intervals in relation to the Y axis direction. Alternatively, it is also allowable that the radiated areas of the plurality of projection modules are not divided into radiated areas belonging to a plurality of groups. The plurality of radiated areas may be arranged at predetermined intervals in relation to the Y axis direction, for example, they may be arranged in one array in parallel to the X axis direction. In this case, one shot area on the substrate is consequently exposed as a whole by performing the scanning exposure at least two times. For example, when the intervals in the X axis direction of the plurality of radiated areas are set to be equal to the width in the X axis direction of one radiated area, the area of one shot area on the substrate is entirely exposed by the scanning exposure in which the substrate is moved in the +Y axis direction and the scanning exposure in which the substrate is moved in the −Y axis direction. In this case, the substrate is moved in the X axis direction by a distance corresponding to the interval of the radiated area during the two times of the scanning exposure.

Seventh Embodiment

Next, an explanation will be made about a seventh embodiment of the exposure apparatus and the exposure method of the present invention. The seventh embodiment is a modification of the sixth embodiment. The constitutive components or parts, which are the same as or equivalent to those of the sixth embodiment described above, are designated by the same reference numerals, any explanation of which will be simplified or omitted. The liquid immersion exposure is performed in an exposure apparatus EX of the seventh embodiment. It is also assumed that the exposure apparatus of this embodiment is different from the exposure apparatus of the second embodiment in only the structure of the projection systems PL1, PL2 and the structure of parts of the liquid immersion systems 1A, 1B (supply members and recovery members). The projection system of this embodiment is the same as that of the sixth embodiment. Therefore, the following description will be made about only the difference from the second embodiment in relation to the liquid immersion system.

Figure 12:
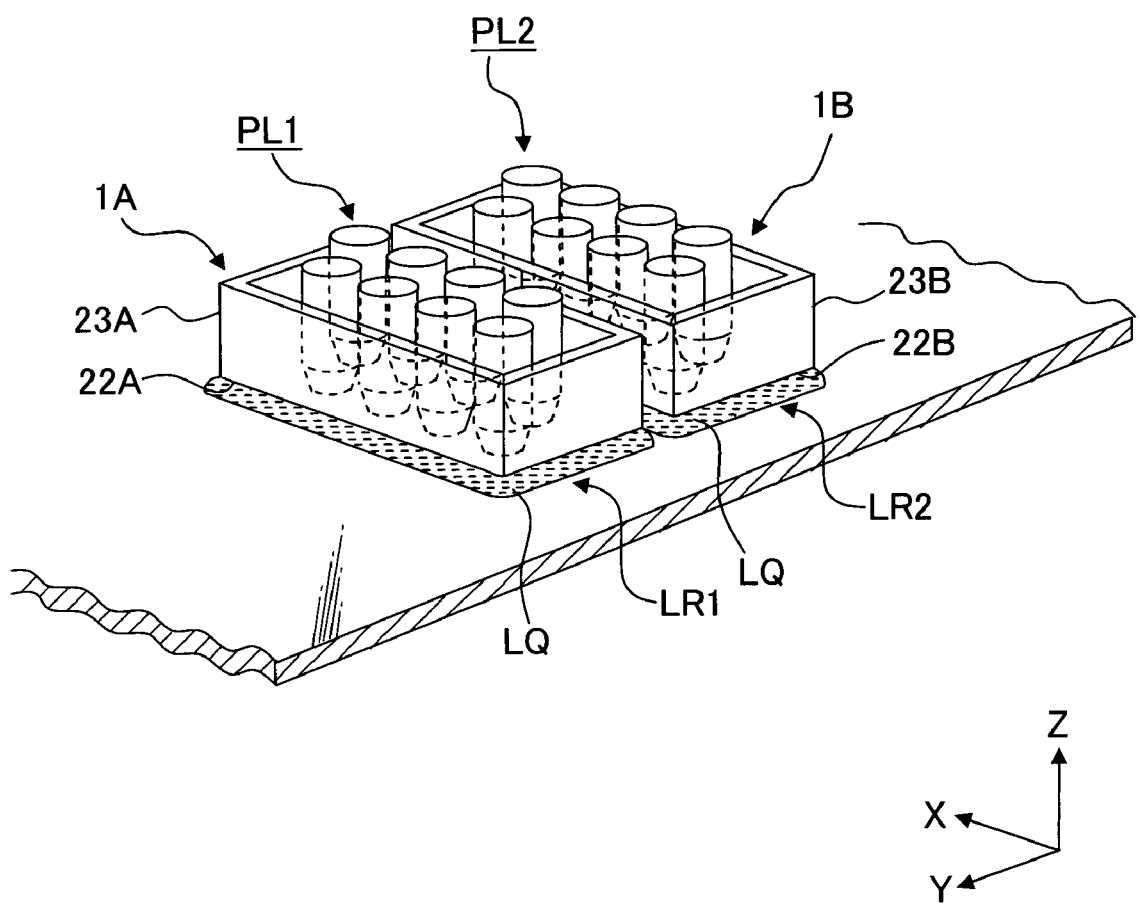
FIG. 12 shows a perspective view illustrating an exposure apparatus according to a seventh embodiment.

FIG. 12 shows a perspective view illustrating the exposure apparatus according to the seventh embodiment. As shown in FIG. 12, in the exposure apparatus EX of this embodiment, spaces, which include the optical paths for the exposure light beams EL between a surface of the substrate P and the end optical elements FL of the plurality of projection modules PLa to PLh of the first and second projection systems PL1, PL2 respectively, are filled with the liquid LQ to form first and second liquid immersion areas LR1, LR2, and the substrate P is exposed through the liquid LQ. Liquid immersion systems 1A, 1B shown in FIG. 12 include recovery members 23A, 23B which have recovery ports 22A, 22B provided to surround the projection modules PLa to PLh respectively, and supply members (not shown) which have supply ports arranged between the projection modules PLa to PLh. The recovery ports 22A, 22B are provided on the lower surfaces of the recovery members 23A, 23B to which the surface of the substrate P is arranged opposite. The supply ports are also provided on the lower surfaces of the supply members to which the surface of the substrate P is arranged opposite.

In this embodiment, the type (physical property) of the liquid LQ of the first liquid immersion area LR1 including the optical path for the exposure light beam EL of the first projection system PL may be mutually different from the type (physical property) of the liquid LQ of the second liquid immersion area LR2 including the optical path for the exposure light beam EL of the second projection system PL2. For example, one of the first and second liquid immersion areas LR1, LR2 may be filled with water (pure or purified water), and the other of the first and second liquid immersion areas LR1, LR2 may be filled with any liquid having a refractive index, with respect to the exposure light beam EL, higher than that of water. At least one of the viscosity of the liquid, the transmittance of the exposure light beam EL, and the temperature may mutually differ between the first liquid immersion area LR1 and the second liquid immersion area LR2.

For example, any one of the optical paths for the exposure light beams EL of the first projection system PL1 and the second projection system PL2 may be filled with the liquid LQ, and the other of the optical paths for the exposure light beams EL may be filled with a gas.

In this embodiment, the plurality of radiated areas 51a to 51h of the first exposure area AR1 are covered with one liquid immersion area LR1. However, the radiated areas 51a to 51h may be covered with distinct liquid immersion areas respectively. Similarly, the plurality of radiated areas 52a to 52h of the second exposure area AR2 may be covered with one liquid immersion area, or the radiated areas 52a to 52h may be covered with distinct liquid immersion areas respectively. The radiated areas 51a to 51h of the first exposure area AR1 and the radiated areas 52a to 52h of the second exposure area AR2 may be covered with one liquid immersion area.

Eighth Embodiment

Next, an explanation will be made about an eighth embodiment of the exposure apparatus and the exposure method of the present invention. An exposure apparatus EX of this embodiment has such a feature that a detecting system is provided to obtain the information about the positional relationship between the first pattern of the first mask M1 and the second pattern of the second mask M2.

Figure 13:
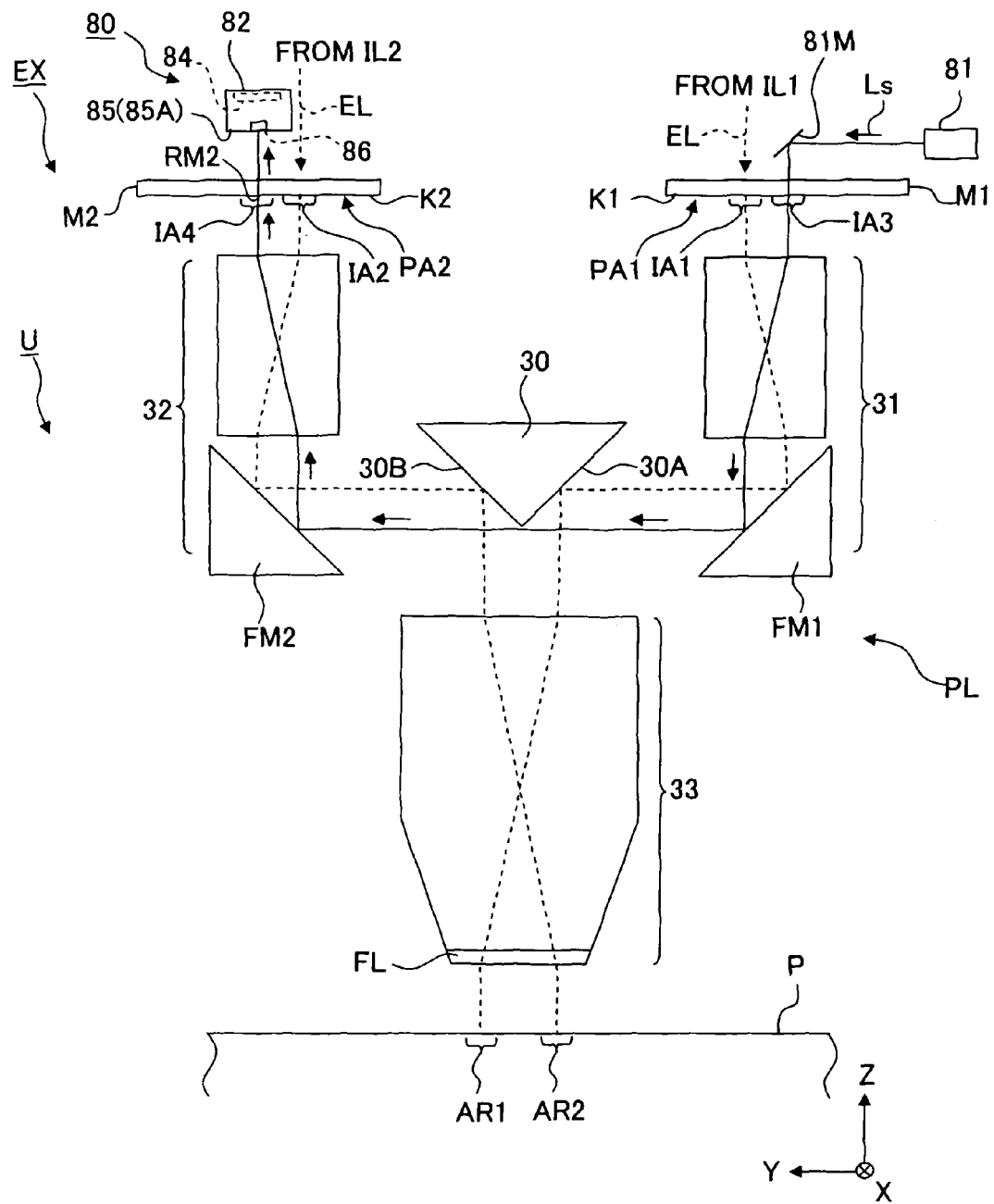
FIG. 13 schematically shows an exposure apparatus according to an eighth embodiment.

FIG. 13 shows a schematic arrangement view illustrating the exposure apparatus EX according to the eighth embodiment. The exposure apparatus EX of this embodiment is constructed in approximately the same manner as the exposure apparatus EX explained in the foregoing fourth embodiment. FIG. 13 schematically shows the exposure apparatus EX including the optical unit U shown in FIG. 5. In the following description, the constitutive components or parts, which are the same as or equivalent to those of the embodiment described above, are designated by the same reference numerals, any explanation of which will be simplified or omitted.

The exposure apparatus EX of this embodiment includes the projection system PL for projecting, onto the substrate P, images of the patterns of the first and second masks M1, M2 illuminated with the exposure light beams EL in the same manner as in the fourth embodiment described above. The first mask M1 has a first pattern PA1, and the second mask M2 has a second pattern PA2 which is different from the first pattern PA1. Although not shown in FIG. 13, the exposure apparatus EX includes the mask stage 6 (see FIG. 6) for holding the first mask M1 and the second mask M2 in the same manner as in the fourth embodiment described above.

The exposure apparatus EX of this embodiment is also the exposure apparatus of the scanning type in which the exposure light beams EL are radiated onto the first and second exposure areas AR1, AR2 respectively to expose a shot area SH on the substrate P by synchronously performing the movement of the substrate P in a predetermined scanning direction (Y axis direction) with respect to the first and second exposure areas AR1, AR2, the movement of the first mask M1 in a predetermined scanning direction (Y axis direction) with respect to the first illumination area IA1, and the movement of the second mask M2 in the predetermined scanning direction (Y axis direction) with respect to the second illumination area IA2.

The first mask M1 has a first pattern formation surface (lower surface) K1 on which the first pattern PA1 is formed. The second mask M2 has a second pattern formation surface (lower surface) K2 on which the second pattern PA2 is formed. The first mask M1 is illuminated with the exposure light beam EL from the first illumination system IL1. The second mask M2 is illuminated with the exposure light beam EL from the second illumination system IL2. The first illumination system IA1 illuminates the first illumination area IA1 on the first mask M1 with the exposure light beam EL, and the second illumination system IA2 illuminates the second illumination area IA2 on the second mask M2 with the exposure light beam EL, in the same manner as in the embodiment described above.

The projection system PL is capable of radiating, onto the first exposure area AR1, the exposure light beam EL from the first illumination area (first field area) IA1 of the first pattern formation surface (lower surface) K1 of the first mask M1. The projection system PL is capable of radiating, onto the second exposure area AR2, the exposure light beam EL from the second illumination area (second field area) IA2 of the second pattern formation surface (lower surface) K2 of the second mask M2.

The exposure apparatus EX of this embodiment includes a detecting system 80 which obtains the information about the positional relationship between the first pattern PA1 of the first mask M1 and the second pattern PA2 of the second mask M2. As shown in FIG. 13, the detecting system 80 has a light-emitting unit 81 which emits or radiates a detecting light beam Ls for obtaining the information about the positional relationship between the first pattern PA1 and the second pattern PA2, and a light-receiving unit 82 which receives the detecting light beam Ls emitted from the light-emitting unit 81 via the lower surface K1 of the first mask M1 and the lower surface K2 of the second mask M2. In this embodiment, the light-receiving unit 82 receives the detecting light beam Ls emitted from the light-emitting unit 81 via at least a part of the projection system PL. The detecting system 80 obtains the information about the positional relationship between the first pattern PA1 arranged in the first illumination area (first field area) IA1 and the second pattern PA2 arranged in the second illumination area (second field area) IA2, on the basis of the light-receiving result of the light-receiving unit 82.

In this embodiment, at least a part of the light-emitting unit 81 is arranged over or above the first mask M1, and at least a part of the light-receiving unit 82 is arranged over or above the second mask M2. The light-emitting unit 81 emits the detecting light beam Ls by the aid of a reflecting mirror 81M onto a third illumination area IA3 which is different from the first illumination area IA1 on the lower surface K1 of the first mask M1.

In this embodiment, the light-emitting unit 81 emits, as the detecting light beam Ls, a light beam having the same wavelength as that of the exposure light beam EL. In this embodiment, the wavelength of the exposure light beam EL is 193 nm. Therefore, the light-emitting unit 81 emits the detecting light beam Ls having the wavelength of 193 nm as well. The detecting light beam Ls may be generated from any light source distinct from the light source unit described above. Alternatively, the exposure light beam EL, which is generated from the light source unit described above, may be used.

The detecting light beam Ls, which is radiated onto the third illumination area IA3, is allowed to come into the first optical system 31. The light beam (exposure light beam EL) from the first illumination area IA1 and the light beam (detecting light beam Ls) from the third illumination area IA3 travel along mutually different optical paths in the first optical system 31. As described above, the light beam (exposure light beam EL) from the first illumination area IA1 is allowed to come into the first reflecting surface 30A of the intermediate optical system 30 via the first optical system 31. On the other hand, the light beam (detecting light beam Ls) from the third illumination area IA3 is allowed to come into the second optical system 32 via the first optical system 31 not via the intermediate optical system 30. That is, the first optical system 31 is capable of supplying the light beam (detecting light beam Ls) from the third illumination area IA3 to the second optical system 32. The position of the third illumination area IA3 is set at an optimum position depending on, for example, the arrangement of the respective optical elements of the projection system PL so that the light beam (detecting light beam Ls), which is radiated onto the third illumination area IA3, is supplied to the second optical system 32, not via the intermediate optical system 30, after passing through the first optical system 31.

The detecting light beam Ls, which is allowed to come into the second optical system 32, is radiated onto a fourth illumination area IA4 which is different from the second illumination area IA2 on the lower surface K2 of the second mask M2, and the detecting light beam Ls is allowed to come into the light-receiving unit 82 via the second mask M2. As described above, in this embodiment, the light-receiving unit 82 receives the detecting light beam Ls from the third illumination area IA3 (lower surface K1) via the first optical system 31, the second optical system 32, and the fourth illumination area IA4 (lower surface K2), not via the intermediate optical system 30 of the projection system PL.

Figure 14:
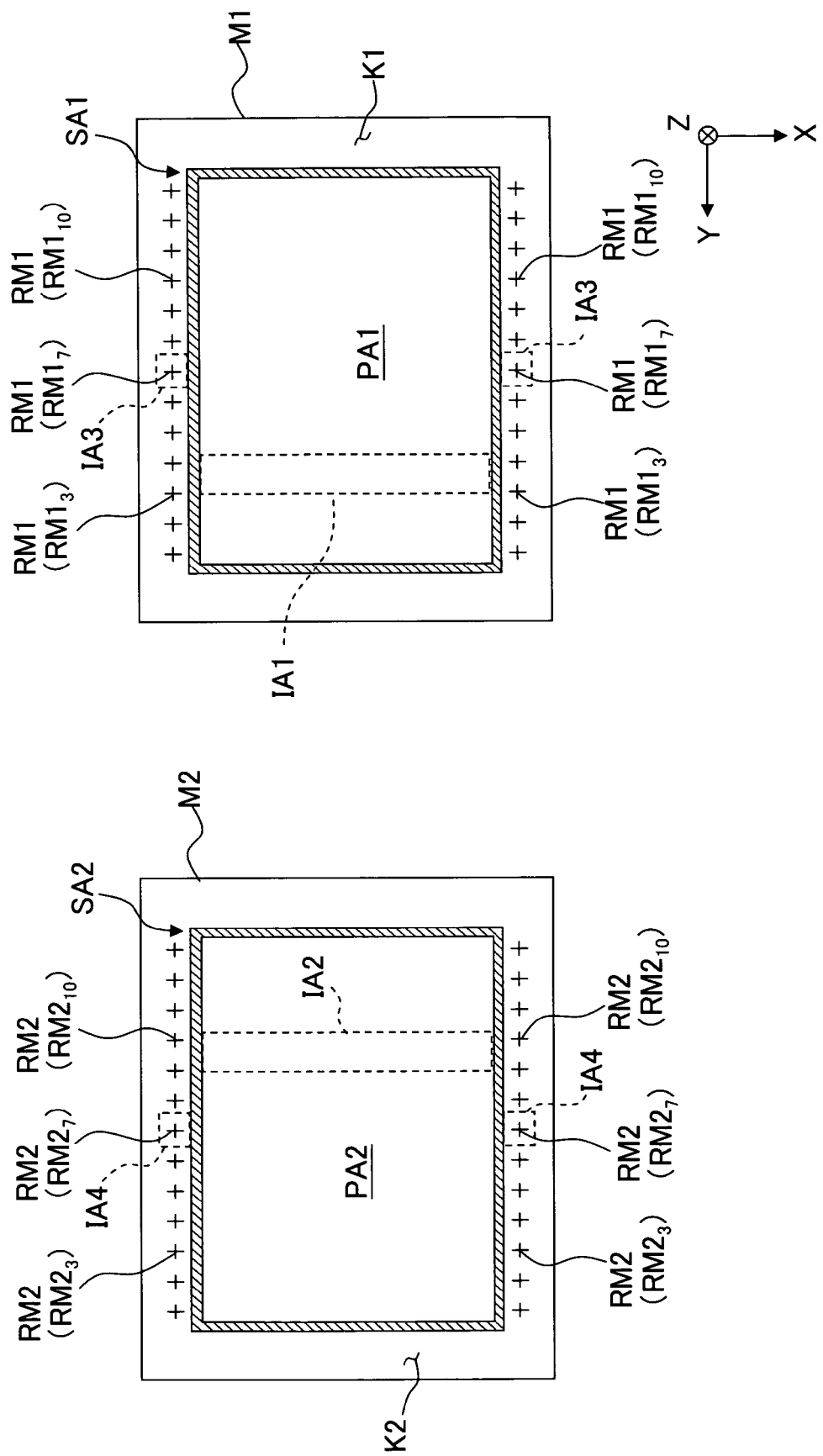
FIG. 14 shows a plan view illustrating first and second masks according to the eighth embodiment.

FIG. 14 shows a plan view illustrating the first mask M1 and the second mask M2 held by the mask stage 6 (not shown in FIG. 14). The first mask M1 is held by the mask stage 6 so that the lower surface K1, on which the first pattern PA1 of the first mask M1 is formed, is substantially parallel to the XY plane. The second mask M2 is held by the mask stage 6 so that the lower surface K2, on which the second pattern PA2 of the second mask M2 is formed, is substantially parallel to the XY plane. The lower surfaces K1, K2 of the first and second masks M1, M2, respectively, are arranged on the object plane of the projection system PL. As shown in FIG. 14, the first illumination area IA1 and the second illumination area IA2, onto which the exposure light beams EL are radiated, are defined to be rectangular (slit-shaped) in which the X axis direction is the longitudinal direction. The third illumination area IA3, onto which the detecting light beam Ls is radiated, is set at a position different from the position of the first illumination area IA1. The fourth illumination area IA4, onto which the detecting light beam Ls is radiated via the first mask M1, the first optical system 31, and the second optical system 32, is set at the position different from the position of the second illumination area IA2.

As shown in FIG. 14, the first mask M1 is provided with a first alignment mark RM1 which is formed in a predetermined positional relationship with respect to the first pattern PA1. The second mask M2 is provided with a second alignment mark RM2 which is formed in a predetermined positional relationship with respect to the second pattern PA2.

The first alignment mark RM1 is formed as a plurality of first alignment marks RM1 formed, outside a first pattern formation area SA1 in which the first pattern PA1 is formed, on the lower surface K1 of the first mask M1. In this embodiment, thirteen pieces of the first alignment marks RM1 ($RM1_1$ to $RM1_{13}$) are formed in the scanning direction (Y axis direction) of the first mask M1 in outer areas, on the +X side and the –X side of the first pattern formation area SA1 of the first mask M1, respectively. The first alignment marks RM1 can be arranged in the third illumination area IA3. The light-emitting unit 81 is capable of illuminating the first alignment marks RM1 with the detecting light beam Ls. The second alignment mark RM2 is formed as a plurality of second alignment marks RM2 formed outside a second pattern formation area SA2 in which the second pattern PA2 is formed on the lower surface K2 of the second mask M2. In this embodiment, thirteen pieces of the second alignment marks RM2 ($RM2_1$ to $RM2_{13}$) are formed in the scanning direction (Y axis direction) of the second mask M2 in outer areas on the +X side and the –X side of the second pattern formation area SA2 of the second mask M2 respectively. The second alignment marks RM2 can be arranged in the fourth illumination area IA4. The light-emitting unit 81 is capable of illuminating the second alignment marks RM2 with the detecting light beam Ls via the first mask M1, the first optical system 31, and the second optical system 32. In this embodiment, the first alignment marks RM1 ($RM1_1$ to $RM1_{13}$) and the second alignment marks RM2 ($RM2_1$ to $RM2_{13}$) are formed on the first mask M1 and on the second mask M2 respectively so that they correspond to one another. When the mask stage 6 is controlled to move the mask M1 and the mask M2 in the Y axis direction, then the first alignment marks RM1 are successively arranged in the third illumination area IA3, and the second alignment marks RM2, which correspond to the first alignment marks RM1 arranged in the third illumination area IA3, are successively arranged in the fourth illumination area IA4. In FIG. 14, the alignment mark $RM1_7$ of the first mask M1 is arranged in the third illumination area IA3, and the alignment mark $RM2_7$ of the second mask M2, which corresponds to the alignment mark $RM1_7$, is arranged in the fourth illumination area IA4.

The detecting light beam Ls is allowed to come into the light-receiving unit 82 via the third illumination area IA3 in which the first alignment mark RM1 is arranged and the fourth illumination area IA4 in which the second alignment mark RM2 is arranged. The light-receiving unit 82 receives the detecting light beam Ls from the light-emitting unit 81 via the first alignment mark RM1 and the second alignment mark RM2.

Figure 15:
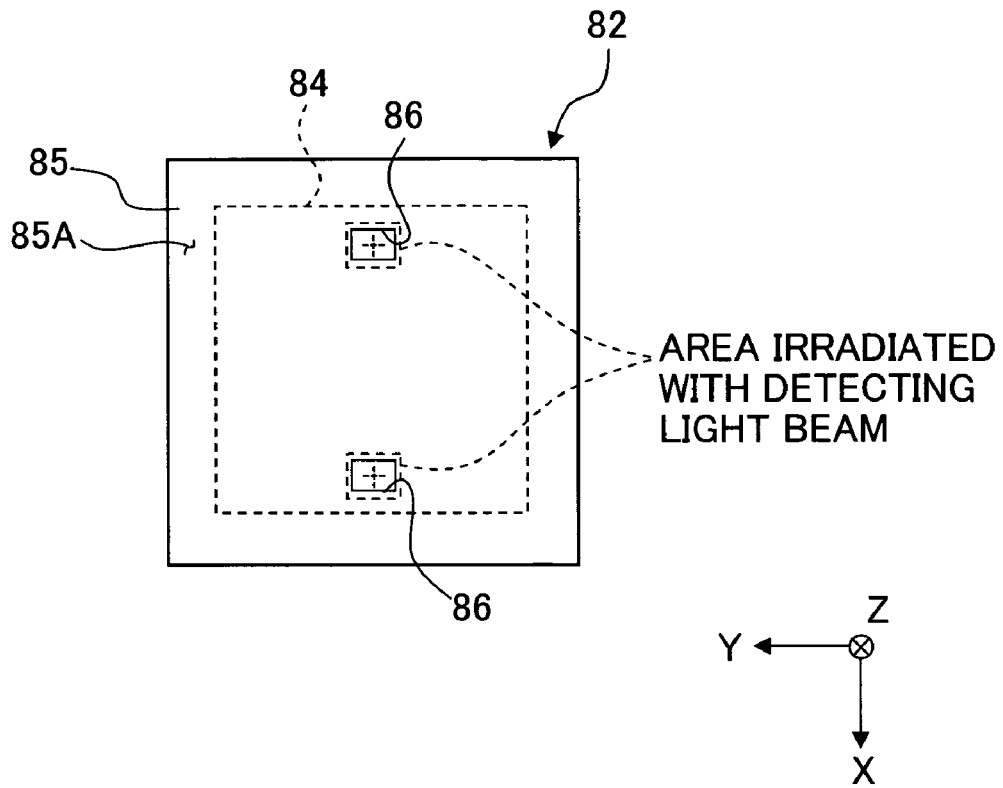
FIG. 15 shows an example of a light-receiving unit.

FIG. 15 conceptually shows an illustration in which the light-receiving unit 82 is viewed from a lower position (on the side of the wafer). With reference to FIG. 15, the light-receiving unit 82 is provided with a plate member 85 which is formed with transmitting portions (openings) 86 capable of transmitting the detecting light beam Ls therethrough, and a light-receiving element 84 which receives the light beam allowed to pass through the transmitting portions 86 of the plate member 85 by the aid of an optical system. The light-receiving element 84 is arranged on the +Z side of the plate member 85 (see FIG. 13), and is capable of receiving the detecting light beam Ls allowed to pass through the transmitting portions 86. The plate member 85 is formed of, for example, silica glass, which is capable of transmitting the detecting light beam Ls. The transmitting portions 86 are provided as the openings each of which is formed in a light-shielding area formed of, for example, a metal such as Cr (chromium) on a surface 85A, of the plate member 85, on the side of the second mask M2 (–Z side). The transmitting portions 86 are formed at the two positions which are away from each other in the X axis direction, respectively, in conformity with the third and fourth illumination areas IA3, IA4. Although not shown, a predetermined optical system is arranged between the plate member 85 and the light-receiving element 84. The light beam, which is allowed to pass through the transmitting portions 86 of the plate member 85, is received by the light-receiving element 84 via the optical system. A light-receiving surface of the light-receiving element 84 is arranged to be optically conjugate with the lower surface K2 of the second mask M2 with respect to the optical system. The light-receiving element 84 includes a photoelectric conversion element including, for example, an image pickup device (for example, CCD), a photomultiplier tube (PMT), and the like.

In this embodiment, two pieces of the transmitting portions 86 are arranged while being separated and away from each other in the X axis direction corresponding to a pair of second alignment marks RM2 arranged on the ±X sides of the second pattern formation area SA2. Therefore, actually, the light-receiving unit 82 is provided with two pairs of the optical systems and the light-receiving elements 84 corresponding to the two transmitting portions 86. Two light-receiving units 82 may be provided corresponding to the pair of second alignment marks RM2. The third and fourth illumination areas IA3, IA4 may be widened in the Y axis direction to make it possible to detect the plurality of first and second alignment marks RM1, RM2 aligned in the Y axis direction.

The light-receiving surface of the light-receiving element 84 is arranged at the position (or in the vicinity thereof) which is optically conjugate mutually with the lower surface K1 of the first mask M1 and the lower surface K2 of the second mask M2. The lower surface K1 of the first mask M1 and the lower surface K2 of the second mask M2 are not optically conjugate with each other in relation to the first and second optical systems 31, 32 in some cases depending on, for example, the structure of the projection system PL. In such a situation, it is preferable that a correcting optical system is provided for the optical path for the detecting light beam Ls to provide the optically conjugate relationship between the lower surface K1 of the first mask M1 and the lower surface K2 of the second mask M2.

The detecting light beam Ls, which is radiated from the light-emitting unit 81 is allowed to come into the light-receiving unit 82 via the first mask M1, the part of the projection system PL, and the second mask M2. When the first and second alignment marks RM1 (for example, $RM1_7$), RM2 (for example, $RM2_7$) are arranged in the third and fourth illumination areas IA3, IA4 respectively, then the detecting light beam Ls from the first and second alignment marks RM1, RM2 is allowed to come into the light-receiving element 84 via the transmitting portion 86 and the optical system, and the images of the first and second alignment marks RM1 (for example, $RM1_7$), RM2 (for example, $RM2_7$) are formed on the light-receiving surface.

Figure 16:
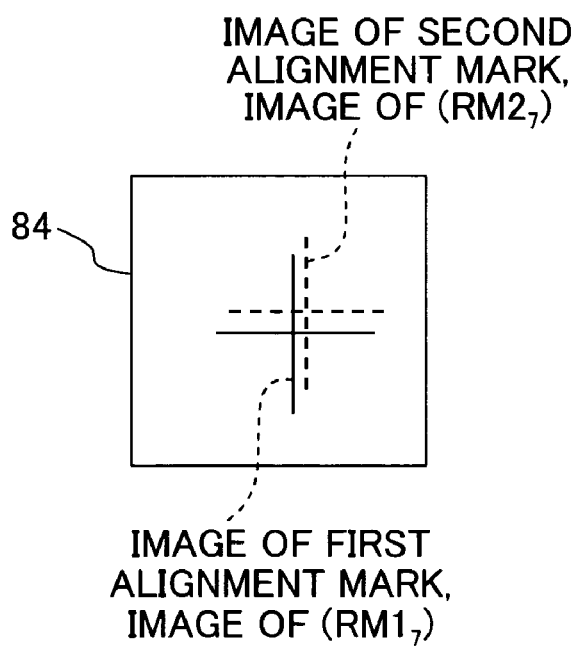
FIG. 16 schematically illustrates a state in which images of alignment marks are formed on a light-receiving surface of the light-receiving unit.

FIG. 16 schematically shows an exemplary state in which the images of the first and second alignment marks RM1, RM2 are formed on the light-receiving surface of the light-receiving unit 84. As shown in FIG. 16, the images of the first and second alignment marks RM1 (for example, $RM1_7$), RM2 (for example, $RM2_7$) are formed on the light-receiving surface of the light-receiving element 84.

The control unit 7 processes an image pickup signal outputted from the light-receiving element 84 to determine the positional relationship (relative positional deviation) between the image of the first alignment mark RM1 and the image of the second alignment mark RM2 formed on the light-receiving surface of the light-receiving element 84 via the part of the projection system PL. The control unit 7 manages the correlating relationship (for example, the direction, the scale and the like) between the light-receiving surface of the light-receiving element 84 and the XY coordinate system defined by the measuring system 70 described above. The control unit 7 can determine the relative positional relationship between the first alignment mark RM1 and the second alignment mark RM2 in the XY coordinate system defined by the measuring system 70, for example, a positional deviation (deviation from the target relative position) in the X axis direction and the Y axis direction by determining the positional deviation between the image of the first alignment mark RM1 and the image of the second alignment mark RM2. The control unit 7 can also determine the positions of the first and second alignment marks RM1, RM2 in the XY coordinate system.

As described above, the first pattern PA1 on the first mask M1 and the first alignment mark RM1 are formed in the predetermined positional relationship, and the second pattern PA2 on the second mask M2 and the second alignment mark RM2 are formed in the predetermined positional relationship. Therefore, the control unit 7 can obtain the information about the positional relationship (for example, the positional deviation in the X axis direction and the Y axis direction) between the first pattern PA1 and the second pattern PA2, on the basis of the positional relationship between the first and second alignment marks RM1, RM2 obtained from the light-receiving result of the light-receiving unit 82. In this embodiment, it is possible to detect the positional relationship between a pair of first alignment marks RM1 separated in the X axis direction and a pair of second alignment marks RM2 corresponding thereto. Therefore, the control unit 7 can also determine the information about the relative rotational positional relationship (positional deviation in the θZ direction) between the first pattern PA1 and the second pattern PA2 on the basis of the positional relationship between the two pairs of first and second alignment marks RM1, RM2. The control unit 7 can also determine the positions and the rotation of the first and second patterns PA1, PA2 in the XY coordinate system.

The control unit 7 adjusts the positional relationship between the first pattern PA1 and the second pattern PA2 on the basis of the information about the positional relationship between the first pattern PA1 and the second pattern PA2 obtained by using the detecting system 80.

In this embodiment, the control unit 7 performs in parallel the operation for performing the scanning exposure (multiple exposure) for the shot area SH on the substrate P and the operation for obtaining the information about the positional relationship between the first pattern PA1 and the second pattern PA2 using the detecting system 80. That is, the control unit 7 can obtain the information about the positional relationship between the first pattern PA1 and the second pattern PA2 by using the detecting system 80 while moving the first and second masks M1, M2 in the scanning direction (Y axis direction) during the exposure for the shot area SH on the substrate P.

The control unit 7 successively obtains the positional relationship between the first alignment mark RM1 successively arranged in the third illumination area IA3 and the second alignment mark RM2 successively arranged in the fourth illumination area IA4 in parallel with at least a part of the operation for performing the multiple exposure for the shot area SH on the substrate P; and the control unit 7 performs control so that the exposure light beam EL from the first illumination area IA1 and the exposure light beam EL from the second illumination area IA2 are radiated onto the first exposure area AR1 and the second exposure area AR2 respectively while adjusting the positional relationship between the first pattern PA1 and the second pattern PA2 on the basis of the obtained information. The first illumination area IA1 onto which the exposure light beam EL is radiated and the third illumination area IA3 onto which the detecting light beam Ls is radiated are defined at the different positions. The second irradiated area IA2 onto which the exposure light beam EL is radiated and the fourth illumination area IA4 onto which the detecting light beam Ls is radiated are defined at the different positions. The control unit 7 can perform the exposure operation for exposing the shot area SH on the substrate P including the operation for radiating the exposure light beam EL in parallel with the operation for obtaining the information about the positional relationship between the first pattern PA1 and the second pattern PA2 by using the detecting system 80 including the operation for radiating the detecting light beam Ls.

The control unit 7 adjusts the position and/or the rotation of at least one of the first pattern PA1 and the second pattern PA2 so that the first and second patterns PA1, PA2 are arranged at the desired positions with respect to the first and second illumination areas IA1, IA2 during the exposure for the shot area SH in order that the images of the first and second patterns PA1, PA2 are projected onto the desired positions in the shot area SH on the substrate P respectively.

When the first mask M1 and the second mask M2 are moved in the scanning direction (Y axis direction) in order to perform the multiple exposure for the shot area SH on the substrate P, then the first alignment mark RM1 is moved in the scanning direction (Y axis direction) together with the first pattern PA1, and the second alignment mark RM2 is moved in the scanning direction (Y axis direction) together with the second pattern PA2. As shown in FIG. 14, the plurality of first alignment marks RM1 are formed in the scanning direction (Y axis direction) on the first mask M1, and the plurality of second alignment marks RM2 are formed in the scanning direction (Y axis direction) on the second mask M2. Therefore, when the first mask M1 and the second mask M2 are moved in the scanning direction (Y axis direction) respectively in order to perform the multiple exposure for the shat SH on the substrate P, then the plurality of first alignment marks RM1 are successively arranged in the third illumination area IA3 respectively, and the plurality of second alignment marks RM2 are successively arranged in the fourth illumination area IA4 respectively. Therefore, the detecting system 80 can be used to successively obtain the positional relationship between the image of the first alignment mark RM1 and the image of the second alignment mark RM2 when the first mask M1 and the second mask M2 are moved in the scanning direction (Y axis direction) respectively in order to perform the multiple exposure for the shot area SH on the substrate P. The information about the positional relationship between the first pattern PA1 and the second pattern PA2 can be obtained on the basis of the obtained positional relationship during the exposure for the shot area SH on the substrate P.

The exposure operation (exposure method) using the exposure apparatus EX of this embodiment will be explained with reference to FIGS. 13 to 15 and 21. At first, the first illumination system IA1 is used to illuminate the first illumination area IA1 on the first mask M1 with the exposure light beam EL, and the second illumination system IA2 is used at a predetermined timing to illuminate the second illumination area IA2 on the second mask M2 with the exposure light beam EL. The exposure light beam EL, from the first illumination area IA1 on the first pattern formation surface (lower surface) K1 of the first mask M1, is radiated by the projection system PL onto the first exposure area AR1 (SS1). The exposure light beam EL, from the second illumination area IA2 on the second pattern formation surface (lower surface) K2 of the second mask M2, is radiated via the projection system PL onto the second exposure area AR2 (SS2).

It is assumed that the illumination is effected as follows at a first timing at which first exposure area AR1 is irradiated to expose the shot area SH on the substrate P. That is, as shown in FIG. 14, for example, the first alignment mark RM1$_7$, which is included in the plurality of first alignment marks RM1 on the first mask M1, is illuminated with the detecting light beam Ls in the third illumination area IA3. The second alignment mark RM2$_7$, which is included in the plurality of second alignment marks RM2 on the second mask M2, is illuminated with the detecting light beam Ls in the fourth illumination area IA4. It is desirable that the first timing is before the start of the illumination with the exposure light beam EL for the second illumination area IA2 on the second mask M2 by the second illumination system IA2.

At the first timing, the image of the first alignment mark RM1$_7$ and the image of the second alignment mark RM2$_7$ are simultaneously detected by the light-receiving element 84 (SS3). That is, the detecting light beam Ls is detected via the first pattern formation surface K1 and the second pattern formation surface K2. When the first pattern PA1 and the second pattern PA2 are deviated from the target relative position, the positional deviation appears between the image of the first alignment mark RM1$_7$ and the image of the second alignment mark RM2$_7$ on the light-receiving surface of the light-receiving element 84. Thus, it is possible to obtain the positional relationship between the first pattern PA1 and the second pattern PA2 (SS4).

Therefore, the control unit 7 can obtain the positional relationship between the first pattern PA1 and the second pattern PA2 at the plurality of timings respectively by determining the position information (positional relationship) between the image of the first alignment mark RM1 and the image of the second alignment mark RM2 corresponding to each of the timings on the light-receiving surface of the light-receiving element 84 at the plurality of timings respectively.

The control unit 7 adjusts the position and/or the rotation of at least one of the second stage 62 and the third stage 63 on the basis of the output of the detecting system 80 (light-receiving unit 82) so that the first pattern PA1 and the second pattern PA2 is in the desired positional relationship during the multiple exposure for the shot area SH on the substrate P (SS5). The control unit 7 performs the multiple exposure for the shot area SH on the substrate P while performing the adjustment (SS6). That is, in this embodiment, the multiple exposure for the substrate and the positional adjustment for the first pattern PA1 and the second pattern PA2 are performed in parallel as shown in the flow chart in FIG. 21.

Accordingly, the positional relationship among the first pattern PA1 of the first mask M1, the second pattern PA2 of the second mask M2, and the shot area SH on the substrate P is always adjusted to be in the desired state. The image of the first pattern PA1 and the image of the second pattern PA2 can be formed at the desired positions in the shot area SH on the substrate P.

As explained above, the control unit 7 can obtain the information about the positional relationship between the first pattern PA1 and the second pattern PA2 by using the detecting system 80. The positional relationship between the first pattern PA1 and the second pattern PA2 can be adjusted on the basis of the information obtained by the detecting system 80. Therefore, the image of the first pattern PA1 and the image of the second pattern PA2 can be formed at the desired positions in the shot area SH on the substrate P.

In this embodiment, it is also allowable that the light-emitting unit 81 emits, as the detecting light beam Ls, any light beam having a wavelength (for example, a wavelength of 633 nm) different from that of the exposure light beam EL. Also in this case, the detecting system 80 radiates the detecting light beam Ls emitted from the light-emitting unit 81 onto the third illumination area IA3. Accordingly, it is possible to allow the detecting light beam Ls to come into the light-receiving unit 82 not via the intermediate optical system 30. However, an unillustrated optical system is arranged on the optical path for the detecting light beam Ls so that the light-receiving surface of the light-receiving element 84, the lower surface K1 of the first mask M1, and the lower surface K2 of the second mask M2 are in optically mutually conjugate positions (or in the vicinity thereof). On the other hand, the detecting system 80 allows the detecting light beam Ls from the light-emitting unit 81 to come into the light-receiving unit 82 without radiating the detecting light beam Ls onto the substrate P. Therefore, even when the light beam, which has the same wavelength as that of the exposure light beam EL, is used as the detecting light beam Ls as in this embodiment, it is possible to obtain the information about the positional relationship between the first pattern PA1 and the second pattern PA2 without exposing the substrate P.

In this embodiment, the detecting light beam Ls is firstly radiated onto the first mask M1, and the detecting light beam Ls is received by the light-receiving unit 82 via the first mask M1, the first optical system 31, the second optical system 32, and the second mask M2. However, the detecting system 80 may radiate the detecting light beam Ls firstly onto the second mask M2. The first optical system 31 and the second optical system 32 are constructed in approximately the same manner. The detecting light beam Ls, which is radiated onto the second mask M2, is radiated onto the third illumination area IA3 of the first mask M1 via the second optical system 32 and the first optical system 31. The detecting system 80 receives the detecting light beam Ls from the third illumination area IA3 of the first mask M1. Accordingly, it is possible to obtain the positional relationship between the first pattern PA1 and the second pattern PA2.

In this embodiment, the detecting system 80 is used during the exposure for the shot area SH of the substrate P to obtain the information about the positional relationship between the first pattern PA1 and the second pattern PA2. However, the detecting system 80 may be used to obtain the information about the positional relationship between the first pattern PA1 and the second pattern PA2 before the start of the exposure for the substrate P. In this case, the control unit 7 uses the first stage 61 of the mask stage 6 before the start of the exposure for the substrate P to move the first mask M1 and the second mask M2 in the Y axis direction so that the positional relationship between the first alignment mark RM1 successively arranged in the third illumination area IA3 and the second alignment mark RM2 successively arranged in the fourth illumination area IA4 (positional relationship between the first pattern PA1 and the second pattern PA2) is obtained by using the detecting system 80. Further, the control unit 7 adjusts the position and/or the rotation of at least one of the second stage 62 and the third stage 63 of the mask stage 6 on the basis of the information obtained by using the detecting system 80, so that the first pattern PA1 of the first mask M1 and the second pattern PA2 of the second mask M2 are in the desired positional relationship before the start of the exposure for the substrate P. After performing the adjustment of the positional relationship between the first pattern PA1 and the second pattern PA2, the control unit 7 synchronously performs the movement of the substrate P in the predetermined scanning direction (Y axis direction) with respect to the first and second exposure areas AR1, AR2, the movement of the first mask M1 in the predetermined scanning direction (Y axis direction) with respect to the first illumination area IA1, and the movement of the second mask M2 in the predetermined scanning direction (Y axis direction) with respect to the second illumination area IA2, while maintaining the positional relationship between the first pattern PA1 and the second pattern PA2, and the control unit 7 performs, for the shot area SH on the substrate P, the multiple exposure with the image of the first pattern PA1 formed in the first exposure area AR1 and the image of the second pattern PA2 formed in the second exposure area AR2. In this way, the image of the first pattern PA1 and the image of the second pattern PA2 can be formed at the desired positions in the shot area SH on the substrate P by obtaining the positional relationship between the first pattern PA1 and the second pattern PA2 and adjusting the positional relationship between the first pattern PA1 and the second pattern PA2 before the start of the exposure for the substrate P. The positional relationship between the first pattern PA1 and the second pattern PA2 may be adjusted during the exposure for each of the shot areas on the substrate P on the basis of the information about the positional relationship between the first pattern PA1 and the second pattern PA2 obtained before the start of the exposure for the substrate P by using the detecting system 80. Of course, it is also allowable to perform the execution such that the positional relationship between the first pattern PA1 and the second pattern PA2 is obtained and the positional relationship between the first pattern PA1 and the second pattern PA2 is adjusted before the exposure for the substrate P and during the exposure for the substrate P.

Ninth Embodiment

Next, an explanation will be made about a ninth embodiment of the exposure apparatus and the exposure method of the present invention. The ninth embodiment is a modification of the eighth embodiment described above. The constitutive components or parts, which are the same as or equivalent to those of the eighth embodiment described above, are designated by the same reference numerals, any explanation of which will be simplified or omitted. An exposure apparatus EX of this embodiment has such a feature that a part of at least one of the exposure light beam EL from the first illumination system IL1 and the exposure light beam EL from the second illumination system IL2 is radiated onto at least one of the third illumination area IA3 and the fourth illumination area IA4 as the detecting light beam to obtain the information about the positional relationship between the first pattern PA1 and the second pattern PA2.

Figure 17:
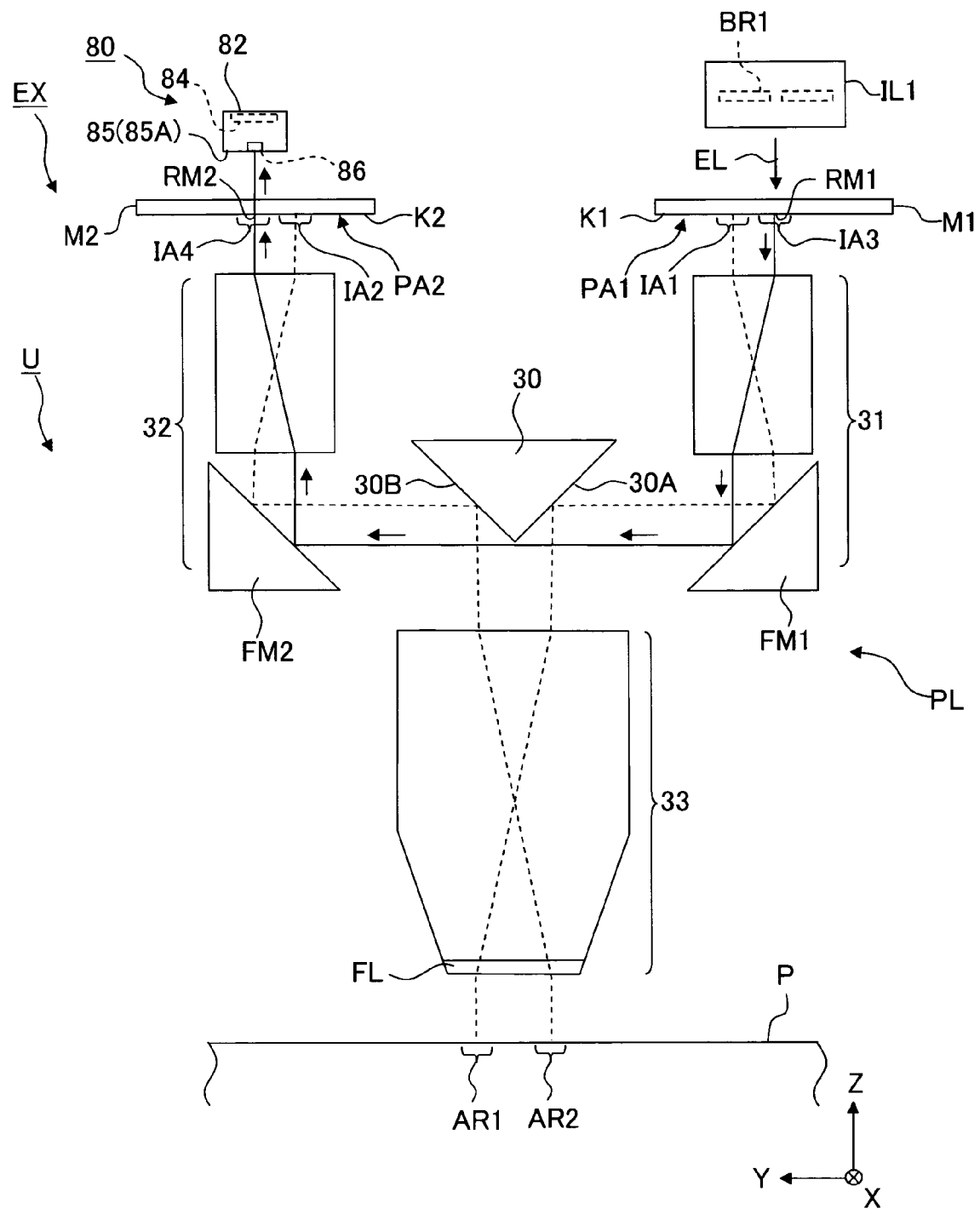
FIG. 17 schematically shows an exposure apparatus according to a ninth embodiment.

FIG. 17 shows a schematic arrangement view illustrating the exposure apparatus EX according to the ninth embodiment. The projection system PL radiates the exposure light beam EL from the first illumination area IA1 onto the first exposure area AR1, and the projection system PL radiates the exposure light beam EL from the second illumination area IA2 onto the second exposure area AR2 in the same manner as in the eighth embodiment described above.

The first illumination system IL1 of this embodiment is capable of adjusting the illumination area onto which the exposure light beam EL is radiated. The first illumination system IL1 is provided with an optical mechanism BR1 including, for example, a variable field diaphragm (mask blind system) which is capable of adjusting the position and/or the size of the illumination area. The control unit 7 is capable of adjusting the position and/or the size of the illumination area on the first mask M1 by controlling the optical mechanism BR1. That is, the exposure light beam EL is radiated onto the first illumination area IA1 in a substrate-exposing operation, and the exposure light beam EL is radiated as the detecting light beam onto the third illumination area IA3 in an alignment mark-detecting operation. In the alignment mark-detecting operation, for example, the optical mechanism BR1 may be used to expand the first illumination area IA1 so that at least one first alignment mark RM1 of the first mask M1 is included. The exposure light beam EL may be radiated onto the expanded illumination area (third illumination area IA3). However, in this embodiment, the first illumination area IA1 is moved so that at least one first alignment mark RM1 is included therein, and the exposure light beam EL is radiated onto the moved illumination area (third illumination area IA3).

In this embodiment, the exposure light beam EL, which is allowed to exit from the first illumination system IL1, is used as the detecting light beam for obtaining the information about the positional relationship between the first pattern PA1 and the second pattern PA2. The control unit 7 executes the operation to obtain the information about the positional relationship between the first pattern PA1 and the second pattern PA2 before the start of the exposure for the substrate P. The control unit 7 controls the optical mechanism BR1 of the first illumination system IL1 to radiate the exposure light beam EL onto the third illumination area IA3. Accordingly, the exposure light beam EL, which is allowed to come into the third illumination area IA3 from the first illumination system IL1, is allowed to come into the second optical system 32 by the first optical system 31 not via the intermediate optical system 30. The exposure light beam EL, which is allowed to come into the second optical system 32, is radiated onto the fourth illumination area IA4. The light-receiving unit 82 is arranged over or above the fourth illumination area IA4. The light-receiving unit 82 receives, as the detecting light beam, the exposure light beam EL from the fourth illumination area IA4. The control unit 7 can obtain the information about the positional relationship between the first pattern PA1 and the second pattern PA2 on the basis of the light-receiving result of the light-receiving unit 82 in the same manner as in the eighth embodiment described above.

Figure 18:
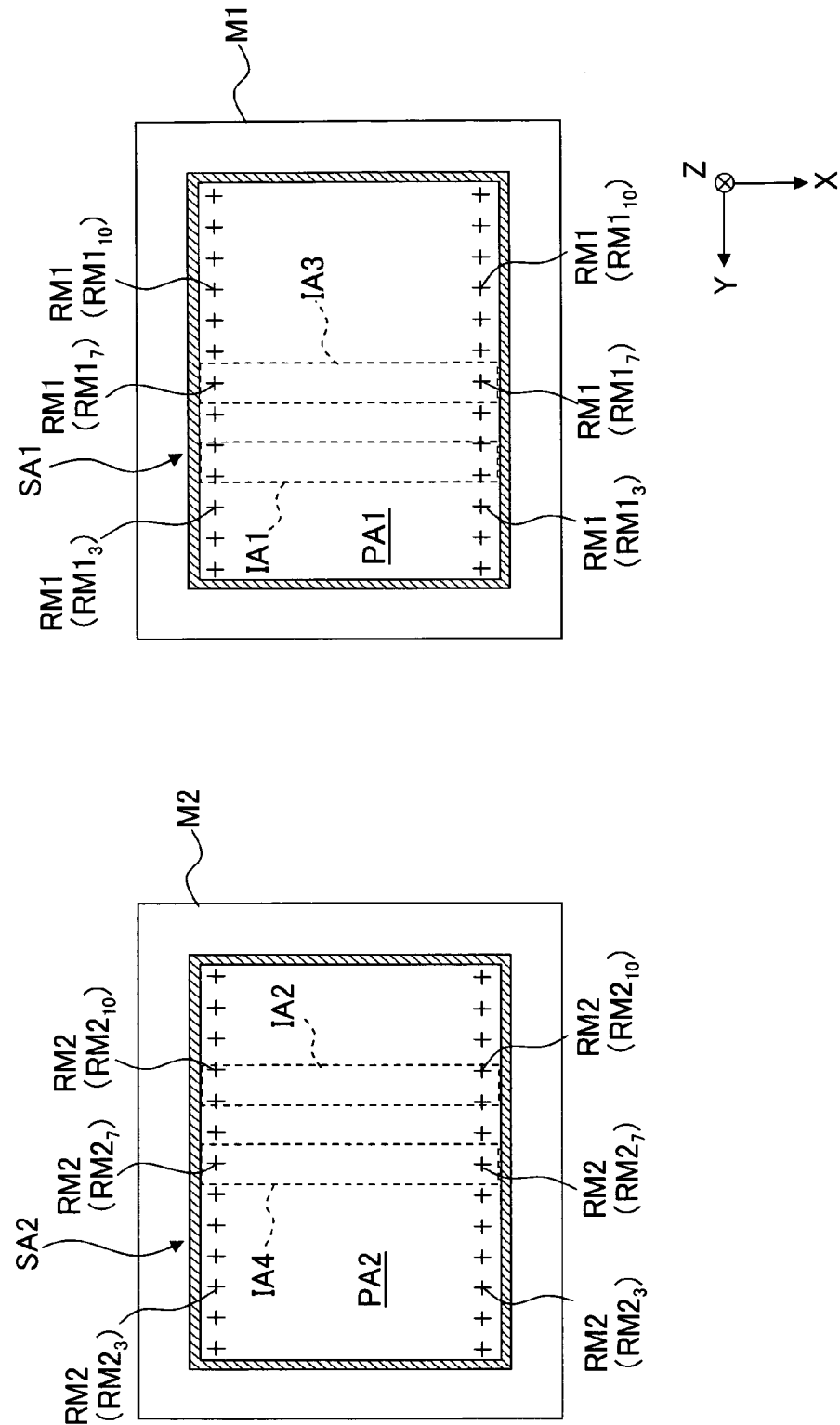
FIG. 18 shows a plan view illustrating first and second masks according to a tenth embodiment.

FIG. 18 shows an exemplary plan view illustrating the first mask M1 and the second mask M2 held by the mask stage 6 (see FIG. 6) according to this embodiment. In this embodiment, the plurality of first alignment marks RM1 are formed in the scanning direction (Y axis direction) of the first mask M1 in the edge areas on the +X side and the −X side respectively in the first pattern formation area SA1 of the first mask M1. The first alignment marks RM1 can be arranged in the third illumination area IA3, and are illuminated with the exposure light beam EL from the first illumination system IL1. The plurality of second alignment marks RM2 are formed in the scanning direction (Y axis direction) of the second mask M2 in the edge areas on the +X side and the −X side respectively in the second pattern formation area SA2 of the second mask M2. The second alignment marks RM2 can be arranged in the fourth illumination area IA4, and are illuminated with the exposure light beam EL from the first illumination system IL1 via the first mask M1, the first optical system 31, and the second optical system 32. The first alignment marks RM1 and the second alignment marks RM2 are formed on the first mask M1 and the second mask M2 respectively so that they correspond to one another.

The light-receiving unit 82 receives, as the detecting light beam, the exposure light beam EL from the fourth illumination area IA4 via the first and second alignment marks RM1, RM2. The control unit 7 can determine the positional relationship between the first and second alignment marks RM1, RM2 on the basis of the light-receiving result of the light-receiving unit 82. The control unit 7 can obtain the information about the positional relationship between the first pattern PA1 and the second pattern PA2 on the basis of the determined positional relationship. The control unit 7 adjusts the positional relationship between the first pattern PA1 and the second pattern PA2 on the basis of the information which relates to the positional relationship between the first pattern PA1 and the second pattern PA2 and which is obtained by using the light-receiving result of the light-receiving unit 82. The exposure light beam EL from the first illumination area IA1 and the exposure light beam EL from the second illumination area IA2 are radiated onto the first exposure area AR1 and the second exposure area AR2 respectively. It is assumed that the control unit 7 can radiate the exposure light beam EL onto the first illumination area by controlling the optical mechanism BR1 after the detection of the first and second alignment marks RM1, RM2 by the detecting system 80.

In the example shown in FIG. 18, the first and second alignment marks RM1, RM2 are formed in the pattern formation areas SA1, SA2 of the first mask M1 and the second mask M2 respectively. However, at least a part of the third illumination area IA3 can be defined outside the pattern formation area SA1. For example, when the third illumination area IA3 can be expanded in the X axis direction, the first and second alignment marks RM1, RM2 can be also formed outside the pattern formation areas of the first mask M1 and the second mask M2 as shown in FIG. 14.

In this embodiment, the exposure light beam EL, for obtaining the information about the positional relationship between the first pattern PA1 and the second pattern PA2, is firstly radiated onto the first mask M1, and the exposure light beam EL is received by the light-receiving unit 82 via the first optical system 31, the second optical system 32, and the second mask M2. However, the exposure apparatus EX may radiate the exposure light beam EL onto the fourth illumination area IA4 (second mask M2) by the second illumination system IL2. When the second illumination system IL2 is provided with, for example, an optical mechanism which is constructed in the same manner as the optical mechanism BR1 described above so that the position and/or the size of the fourth illumination area IA4 is adjustable, the control unit 7 can radiate the exposure light beam EL from the second illumination system IL2 onto the fourth illumination area IA4. The first optical system 31 and the second optical system 32 are constructed substantially identically. The exposure light beam EL, which is radiated onto the fourth illumination area IA4 (second mask M2), is radiated onto the third illumination area IA3 via the second optical system 32 and the first optical system 31. The control unit 7 can receive the exposure light beam EL from the third illumination area IA3 by the light-receiving unit 82, and can use the light-receiving result to obtain the information about the positional relationship between the first pattern PA1 and the second pattern PA2.

In the eighth and ninth embodiments described above, the light-receiving unit 82 receives the detecting light beam via at least a part of the projection system PL. However, the detecting light beam may be received not via the projection system PL. For example, a dedicated optical system, which is distinct from the projection system PL, may be provided, into which the detecting light beam is allowed to come via one of the first mask M1 and the second mask M2. The detecting light beam, which is allowed to pass via the dedicated optical system and the other of the first mask M1 and the second mask M2, may be received by the light-receiving unit 82.

In the eighth and ninth embodiments described above, the detecting light beam is radiated onto one of the first mask M1 and the second mask M2, and the light-receiving unit 82 receives, via the other of the first mask M1 and the second mask M2, the detecting light beam radiated onto the one of the first mask M1 and the second mask M2. However, for example, a light-emitting element may be provided, which is capable of emitting the light in a predetermined positional relationship with respect to at least one of the first pattern PA1 and the second pattern PA2. The light, which is generated from the light-emitting element, may be received via at least one of the first mask M1 and the second mask M2.

In the eighth and ninth embodiments described above, the detecting system 80 is based on the image processing system. However, the detecting system 80 is not limited to the image processing system. It is also allowable to adopt any other system. For example, it is also allowable to adopt such a system that a diffracted light beam (or scattered light beam) generated from the first and second alignment marks RM1, RM2 is detected. In this case, the first and second alignment marks RM1, RM2 may be diffraction gratings. The diffracted light beam having the same order (for example, ±1st order), which is generated from one of the first and second alignment marks RM1, RM2 by radiating a coherent detecting light beam Ls, may be radiated onto the other of the alignment marks RM1, RM2 via the first and second optical systems 31, 32. The two diffracted light beams generated from the other of the alignment marks RM1, RM2 may be allowed to interfere and received.

In the eighth and ninth embodiments described above, the first and second alignment marks RM1, RM2 are formed discretely in relation to the Y axis direction. However, for example, the first and second alignment marks RM1, RM2 may be formed continuously over the entire region of the pattern formation area. It is also allowable that the first and second alignment marks RM1, RM2 are not arranged symmetrically with respect to a straight line which passes through the center of the mask and which is parallel to the Y axis. The first and second masks M1, M2 may be held by mutually different mask stages.

In the first to ninth embodiments described above, DMD may be used to form one of the image of the first pattern and the image of the second pattern, and the mask (reticle) may be used to form the other of the images.

In the first to ninth embodiments described above, it is also allowable that at least one of the size and the shape may differ between the first exposure area AR1 and the second exposure area AR2. For example, the width in the X axis direction and/or the width in the Y axis direction may differ between the first exposure area AR1 and the second exposure area AR2. When the width in the X axis direction differs, only a part of the area in the shot area SH is subjected to the multiple exposure (double exposure).

In each of the embodiments described above, the exposure light beams EL are continuously radiated onto the first exposure area AR1 and the second exposure area AR2 respectively during the period of time in which the shot area SH passes over the first exposure area AR1 and the second exposure area AR2. However, the exposure light beam EL may be radiated in only a part of the period of time in which the shot area SH passes in at least one of the exposure areas. That is, it is also allowable that only a part of the shot area SH is subjected to the multiple exposure (double exposure).

In the embodiments described above, the substrate is moved with respect to the projection system (exposure light beam) during the exposure (the mask is also moved synchronously with the mask, for example, in the third embodiment). However, there is no limitation thereto. The projection system may be moved with respect to the substrate. For example, when DMD is used as in the first embodiment, it is unnecessary that the mask is moved synchronously with the substrate. Therefore, the substrate can be subjected to the scanning exposure by moving DMD and the projection system with respect to the substrate.

In the respective embodiments described above, the respective shot areas SH on the substrate P are subjected to the double exposure with the image of the first pattern and the image of the second pattern respectively. However, it is also possible to perform the triple or more multiple exposure in accordance with the principle of the present invention. When the triple exposure is performed, a third pattern is used in addition to the first pattern and the second pattern. An image of the third pattern can be generated on the substrate in synchronization with the movement of the substrate P in the same manner as the first pattern and the second pattern. As for the third pattern, it is also allowable to use a mask on which the third pattern is physically formed or DMD on which the third pattern is formed with an electronic pattern. In the case of the triple exposure, a third exposure area (AR3), on which the image is formed by radiating the illumination light beam onto the third pattern, can be defined so that the third exposure area (AR3) is distinct from the first exposure area AR1 and the second exposure area AR2 or a part of the third exposure area (AR3) is overlapped with at least one of the first exposure area AR1 and the second exposure area AR2. In this case, three projection systems may be provided independently corresponding to the respective exposure areas. Alternatively, the projection system PL as shown in FIG. 5 may be further provided with an optical system corresponding to the third mask similarly to the first and second optical systems 31, 32 corresponding to the first mask M1 and the second mask M2, and the projection system PL may be provided with a catoptric and/or dioptric system for guiding the light beam from the optical system to the third optical system. When the third mask is used, then the third mask may be arranged on the mask stage 6 on which the first mask M1 and the second mask M2 are arranged, or the third mask may be arranged on any distinct mask stage as described in the third embodiment.

In the embodiments described above, the exposure apparatus is provided with DMD which is the no light-emitting image display device as the variably shaped mask (also referred to as "active mask" or "image generator"). However, the variably shaped mask is not limited to DMD. It is also allowable to use a no light-emitting image display device instead of DMD, as explained below. The no light-emitting image display device is an element which spatially modulates the amplitude (intensity), the phase, or the polarization state of the light allowed to travel in a predetermined direction. Examples of the transmission type spatial light modulator include, for example, the electrochromic display (ECD) other than the transmission type liquid crystal display element (LCD: Liquid Crystal Display). Examples of the reflection type spatial light modulator include, for example, the reflection mirror array, the reflection type liquid crystal display element, the electro phonetic display (EPD), the electronic paper (or the electronic ink), the light diffraction type light valve (Grating Light Valve) and the like, in addition to DMD described above.

The exposure apparatus of the embodiment described above may be provided with a pattern-forming unit including a spontaneous light-emitting image display device instead of the variably shaped mask provided with the no light-emitting image display device. In this case, it is unnecessary to provide the illumination system. The spontaneous light-emitting image display device includes, for example, CRT (Cathode Ray Tube), the inorganic EL display, the organic EL display (or OLED: Organic Light Emitting Diode), the LED display, the LD display, the field emission display (FED), the plasma display (PDP: Plasma Display Panel), and the like. Further, for example, a solid light source chip having a plurality of light-emitting points, a solid light source chip array having a plurality of chips arranged in an array form, or any device having a plurality of light-emitting points formed on one substrate may be used as the spontaneous light-emitting image display device provided for the pattern-forming unit, and the solid light source chip may be electrically controlled to form the pattern. Any inorganic or organic solid light source element may be adopted.

In each of the embodiments described above, the interferometer system is used to measure the position information about the mask stage and the substrate stage. However, there is no limitation thereto. For example, it is also allowable to use an encoder system for detecting the scale (diffraction grating) provided on the upper surface of the substrate stage. In this case, it is preferable to provide a hybrid system including both of the interferometer system and the encoder system, and the measurement result of the encoder system is calibrated (subjected to the calibration) by using the measurement result of the interferometer system. The position control of the substrate stage may be performed by switching and using the interferometer system and the encoder system or using both of them.

In each of the embodiments described above, an ArF excimer laser may be used as a light source unit for generating an ArF excimer laser beam as the exposure light beam EL. However, it is also allowable to use a high harmonic wave-generating unit which includes, for example, a solid laser light source such as a DFB semiconductor laser or a fiber laser, a light-amplifying section having a fiber amplifier or the like, and a wavelength-converting section and which outputs a pulse light beam having a wavelength of 193 nm as disclosed, for example, in International Publication No. 1999/46835 (corresponding to U.S. Pat. No. 7,023,610). In the embodiments described above, the respective illumination areas and the first and second exposure areas (except for the sixth and seventh embodiments) are rectangular respectively. However, it is also allowable to use any other shape, for example, any circular arc-shaped form.

The substrate P, which is usable in the respective embodiments described above, is not limited to the semiconductor wafer for producing the semiconductor device. Substrate applicable include, for example, a glass substrate for the display device, a ceramic wafer for the thin film magnetic head, a master plate (synthetic silica glass, silicon wafer) for the mask or the reticle to be used for the exposure apparatus, or a film member. The shape of the substrate P is not limited to the circular shape. It is also allowable to use other shapes such as a rectangular shape.

The present invention is also applicable to the exposure apparatus of the twine-stage (multistage) type provided with a plurality of substrate stages as disclosed, for example, in Japanese Patent Application Laid-open Nos. 10-163099 and 10-214783 (corresponding to U.S. Pat. Nos. 6,341,007, 6,400,441, 6,549,269, and 6,590,634) and Published Japanese Translation of PCT International Publication for Patent Application No. 2000-505958 (corresponding to U.S. Pat. No. 5,969,441). The disclosures of United States Patents described above are incorporated herein by reference within a range of permission of the domestic laws and ordinances of the designated or selected state, in relation to the exposure apparatus of the multistage type.

Further, the present invention is also applicable, for example, to the exposure apparatus including the substrate stage for holding the substrate and the measuring stage provided with the measuring member (for example, reference member formed with a reference mark and/or various types of photoelectric sensors) as disclosed, for example, in Japanese Patent Application Laid-open No. 11-135400 (corresponding to International Publication No. 1999/23692) and Japanese Patent Application Laid-open No. 2000-164504 (corresponding to U.S. Pat. No. 6,897,963). The disclosures of United States Patents described above are incorporated herein by reference within a range of permission of the domestic laws and ordinances of the designated or selected state.

The embodiment, which is included in the respective embodiments described above and in which the optical path for the exposure light beam EL is filled with the liquid, adopts the exposure apparatus in which the space between the projection system and the substrate P is locally filled with the liquid. However, the present invention is also applicable to the liquid immersion exposure apparatus which performs the exposure in a state in which the entire surface of the substrate as the exposure objective is immersed in the liquid as disclosed, for example, in Japanese Patent Application Laid-open Nos. 6-124873 and 10-303114 and U.S. Pat. No. 5,825,043.

In the respective embodiments described above, the exposure apparatus EX is provided with the projection system. However, in place of the projection system, it is also allowable to use an optical system (for example, a diffraction optical element) which does not form any image of the pattern. In each of the embodiments described above, the substrate P may be exposed with a line-and-space pattern by forming interference fringes in at least one of the first and second exposure areas AR1, AR2 as disclosed, for example, in International Publication No. 2001/035168.

The type of the exposure apparatus EX is not limited to the exposure apparatus, for producing the semiconductor element, which exposes the substrate P with the semiconductor element pattern. The present invention is also widely applicable, for example, to the exposure apparatus for producing the liquid crystal display device or producing the display as well as to the exposure apparatus for producing, for example, the thin film magnetic head, the micromachine, MEMS, DNA chip, the image pickup element (CCD), the reticle, or the mask.

The disclosures of various United States Patents and various United States Patent Application Publications referred to in this specification, which are not included in those having been specifically incorporated herein explicitly, are also incorporated herein by reference within a range of permission of the domestic laws and ordinances of the designated or selected state.

As described above, the exposure apparatus EX according to the embodiments of the present invention is produced by assembling the various subsystems including the respective constitutive elements as defined in claims so that the predetermined mechanical accuracy, the electric accuracy, and the optical accuracy are maintained. In order to secure the various accuracies, those performed before and after the assembling include the adjustment for achieving the optical accuracy for the various optical systems, the adjustment for achieving the mechanical accuracy for the various mechanical systems, and the adjustment for achieving the electric accuracy for the various electric systems. The steps of assembling the various subsystems into the exposure apparatus include, for example, the mechanical connection, the wiring connection of the electric circuits, and the piping connection of the air pressure circuits in correlation with the various subsystems. It goes without saying that the steps of assembling the respective individual subsystems are performed before performing the steps of assembling the various subsystems into the exposure apparatus. When the steps of assembling the various subsystems into the exposure apparatus are completed, the overall adjustment is performed to secure the various accuracies as the entire exposure apparatus. It is desirable that the exposure apparatus is produced in a clean room in which, for example, the temperature and the cleanness are managed.

Figure 19:
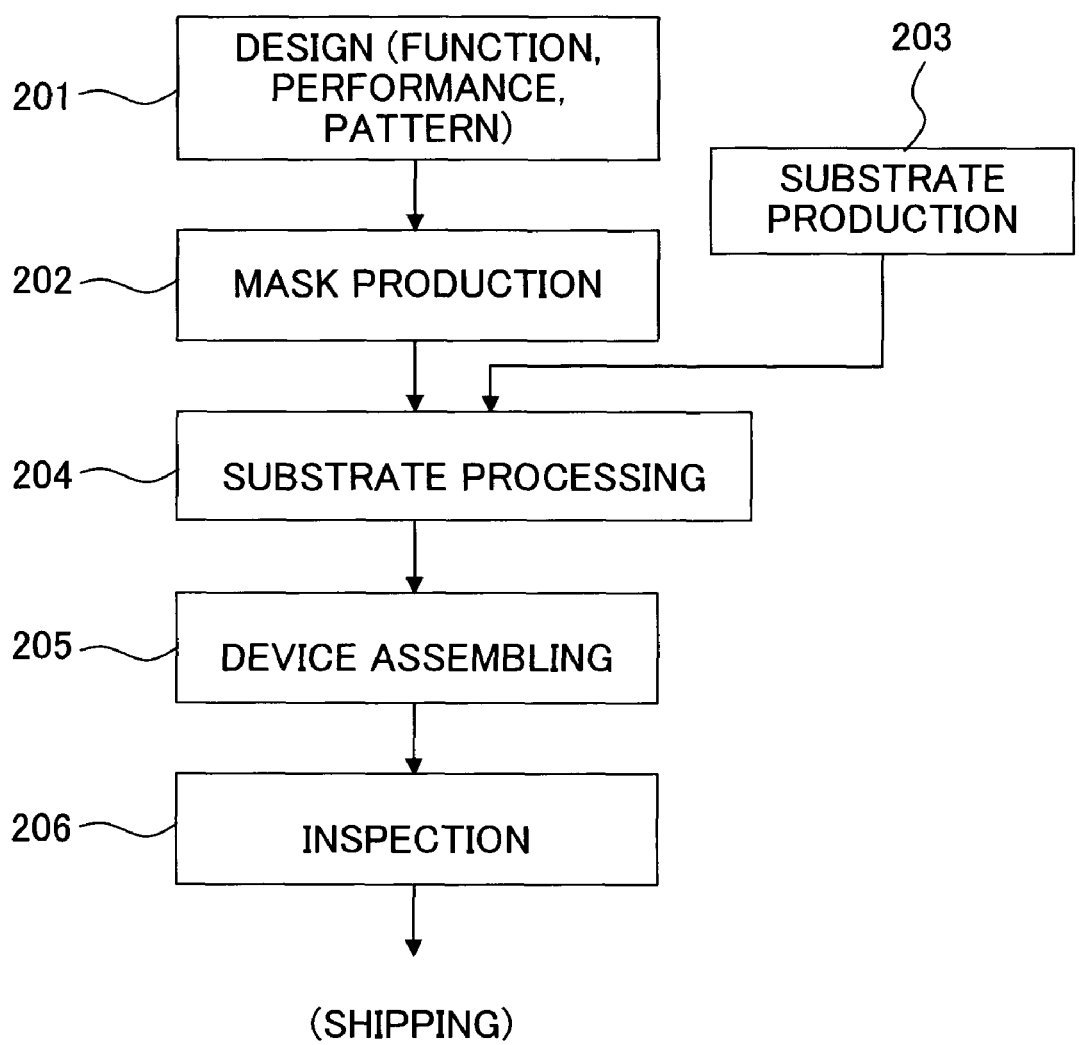
FIG. 19 shows a flow chart illustrating exemplary steps of producing a microdevice.

As shown in FIG. 19, the microdevice such as the semiconductor device is produced by performing, for example, a step 201 of designing the function and the performance of the microdevice, a step 202 of manufacturing a mask (reticle) based on the designing step, a step 203 of producing a substrate as a base material for the device, a substrate-processing step 204 including an exposure step of performing the multiple exposure for the substrate with a pattern of the mask by using the exposure apparatus EX of the embodiment described above and a development step of developing the exposed substrate, a step 205 of assembling the device (including processing processes such as a dicing step, a bonding step, and a packaging step), and an inspection step 206.

According to the present invention, the multiple exposure for the substrate can be realized correctly and highly efficiently. Therefore, it is possible to produce, at a high throughput, the device having the high density complicated circuit pattern to be used, for example, for the liquid crystal display device and the micromachine. Therefore, the present invention will extremely contribute to the development of the precision mechanical equipment industry including the semiconductor industry in our country.

What is claimed is:

1. An exposure apparatus which exposes a substrate, comprising:
    an optical unit which radiates a first exposure light beam from a first area disposed on a first predetermined surface onto a first exposure area and which radiates a second exposure light beam from a second area disposed on a second predetermined surface onto a second exposure area; and
    a detecting system having a light-receiving unit which receives a detecting light beam via the first predetermined surface and the second predetermined surface and which obtains information about a positional relationship between a first pattern arranged in the first area and a second pattern arranged in the second area based on a light-receiving result of the light-receiving unit,
    wherein the detecting light beam has an optical path that includes the first predetermined surface, the second predetermined surface and the light-receiving unit in this order;
    the light-receiving unit receives, as the detecting light beam, at least one of a light beam from a third area which is disposed on the first predetermined surface and which is different from the first area and a light beam from a fourth area which is disposed on the second predetermined surface and which is different from the second area;
    the optical unit has a first optical system into which the first exposure light beam from the first area comes and a second optical system which is different from the first optical system and into which the second exposure light beam from the second area comes;
    the first optical system is capable of supplying the light beam from the third area to the second optical system;
    the second optical system is capable of supplying the light beam from the fourth area to the first optical system; and
    the light-receiving unit receives, as the detecting light beam, at least one of the light beam from the third area and the light beam from the fourth area via the first optical system and the second optical system.

2. The exposure apparatus according to claim 1, wherein the light-receiving unit receives the detecting light beam via at least a part of the optical unit.

3. The exposure apparatus according to claim 1, wherein the optical unit has an intermediate optical member which is arranged in the vicinity of positions optically conjugate with the first exposure area and the second exposure area, respectively, to which the first exposure light beam from the first area and the second exposure light beam from the second area come, and which guides the first exposure light beam from the first area and the second exposure light beam from the second area to the first exposure area and the second exposure area respectively.

4. The exposure apparatus according to claim 3, wherein the intermediate optical member has a first reflecting surface which reflects the first exposure light beam coming from the first area and a second reflecting surface which reflects the second exposure light beam coming from the second area.

5. The exposure apparatus according to claim 3, wherein:
    the optical unit has a single optical element to which the substrate is arranged to be opposite;
    the intermediate optical member guides the first exposure light beam from the first area and the second exposure light beam from the second area to the single optical element; and
    the first exposure light beam and the second exposure light beam are radiated onto the first exposure area and the second exposure area respectively via the single optical element.

6. The exposure apparatus according to claim 3, wherein the light-receiving unit receives the detecting light beam not via the intermediate optical member.

7. The exposure apparatus according to claim 1, wherein the light-receiving unit receives, as the detecting light beam, a light beam from at least one of a first mark which is arranged in a predetermined positional relationship with respect to the first pattern and a second mark which is arranged in a predetermined positional relationship with respect to the second pattern.

8. The exposure apparatus according to claim 1, wherein the detecting system includes a radiation unit which radiates the detecting light beam onto at least one of the third area and the fourth area.

9. The exposure apparatus according to claim 8, wherein the detecting light beam has a wavelength which is different from that of the first and second exposure light beams.

10. The exposure apparatus according to claim 8, wherein the detecting light beam has a wavelength same as that of the first and second exposure light beams.

11. The exposure apparatus according to claim 1, wherein a part of at least one of the first exposure light beam and the second exposure light beam is radiated, as the detecting light beam, onto at least one of the third area and the fourth area.

12. The exposure apparatus according to claim 1, wherein the first exposure light beam and the second exposure light beam are radiated onto the first exposure area and the second exposure area respectively while adjusting the positional relationship between the first pattern and the second pattern based on the information obtained by the detecting system.

13. The exposure apparatus according to claim 1, wherein:
    the optical unit is capable of forming an image of the first pattern in the first exposure area by radiating the first exposure light beam onto the first exposure area, and the optical unit is capable of forming an image of the second pattern in the second exposure area by radiating the second exposure light beam onto the second exposure area; and
    a predetermined area on the substrate is subjected to multiple exposure with the image of the first pattern formed in the first exposure area and the image of the second pattern formed in the second exposure area.

14. A method for producing a device, comprising using the exposure apparatus as defined in claim 1.

15. An exposure method for exposing a substrate, the exposure method comprising:
    radiating with an optical unit a first exposure light beam from a first area disposed on a first predetermined surface onto a first exposure area and radiating with the optical unit a second exposure light beam from a second area disposed on a second predetermined surface onto a second exposure area;

detecting a light beam via the first predetermined surface and the second predetermined surface, the light beam having an optical path that includes the first predetermined surface and the second predetermined surface in this order; and obtaining information about a positional relationship between a first pattern arranged in the first area and a second pattern arranged in the second area based on a detection result; and receiving with a light-receiving unit, as the detecting light beam, at least one of a light beam from a third area which is disposed on the first predetermined surface and which is different from the first area and a light beam from a fourth area which is disposed on the second predetermined surface and which is different from the second area, wherein the optical unit has a first optical system into which the first exposure light beam from the first area comes and a second optical system which is different from the first optical system and into which the second exposure light beam from the second area comes, the first optical system is capable of supplying the light beam from the third area to the second optical system, the second optical system is capable of supplying the light beam from the fourth area to the first optical system, and the light-receiving unit receives, as the detecting light beam, at least one of the light beam from the third area and the light beam from the fourth area via the first optical system and the second optical system.

16. The exposure method according to claim 15, further comprising adjusting the positional relationship between the first pattern and the second pattern based on the information about the positional relationship.

17. The exposure method according to claim 16, wherein the positional relationship between the first and second patterns is adjusted at least during the radiation of the first and second exposure light beams.

18. The exposure method according to claim 16, wherein the positional relationship between the first and second patterns is adjusted at least before the substrate is exposed with the first and second exposure light beams.

19. The exposure method according to claim 15, wherein the information about the positional relationship between the first pattern and the second pattern is obtained by detecting marks arranged on the first predetermined surface and the second predetermined surface.

20. The exposure method according to claim 19, wherein the marks are arranged outside the first area and the second area.

21. The exposure method according to claim 15, wherein the light beam via the first predetermined surface and the second predetermined surface has a wavelength which is different from that of the first and second exposure light beams.

22. The exposure method according to claim 15, wherein the light beam via the first predetermined surface and the second predetermined surface has a wavelength same as that of the first and second exposure light beams.

23. The exposure method according to claim 15, wherein the substrate is subjected to multiple exposure with images of the first and second patterns formed in the first and second exposure areas by being irradiated with the first and second exposure light beams.

24. A method for producing a device, comprising:
performing multiple exposure for a substrate by using the exposure method as defined in claim 15;
developing the substrate subjected for which the multiple exposure has been performed; and
processing the developed substrate.

25. The exposure apparatus according to claim 1, wherein the detecting light beam has one optical path to the light-receiving unit.

26. The exposure method according to claim 15, wherein the detecting is performed by a detecting system that includes a light-receiving unit, and the light beam has one optical path to the light-receiving unit.

27. An exposure apparatus which exposes a substrate, comprising:
an optical unit which radiates a first exposure light beam from a first area disposed on a first predetermined surface onto a first exposure area and which radiates a second exposure light beam from a second area disposed on a second predetermined surface onto a second exposure area; and a detecting system having a light-receiving unit which receives a detecting light beam via the first predetermined surface and the second predetermined surface and which obtains information about a positional relationship between a first pattern arranged in the first area and a second pattern arranged in the second area based on a light-receiving result of the light-receiving unit, wherein the detecting light beam has one optical path, the optical path of the detecting light beam being different from optical paths of the first and second exposure light beams; and the light-receiving unit receives, as the detecting light beam, at least one of a light beam from a third area which is disposed on the first predetermined surface and which is different from the first area and a light beam from a fourth area which is disposed on the second predetermined surface and which is different from the second area;

the optical unit has a first optical system into which the first exposure light beam from the first area comes and a second optical system which is different from the first optical system and into which the second exposure light beam from the second area comes;

the first optical system is capable of supplying the light beam from the third area to the second optical system;

the second optical system is capable of supplying the light beam from the fourth area to the first optical system; and the light-receiving unit receives, as the detecting light beam, at least one of the light beam from the third area and the light beam from the fourth area via the first optical system and the second optical system.

28. The exposure apparatus according to claim 27, wherein the optical path of the detecting light beam includes the first predetermined surface, the second predetermined surface and the light-receiving unit in this order.

29. The exposure apparatus according to claim 27, wherein the light-receiving unit receives the detecting light beam via at least a part of the optical unit.

30. The exposure apparatus according to claim 27, wherein the optical unit has an intermediate optical member which is arranged in the vicinity of positions optically conjugate with the first exposure area and the second exposure area, respectively, to which the first exposure light beam from the first area and the second exposure light beam from the second area come, and which guides the first exposure light beam from the first area and the second exposure light beam from the second area to the first exposure area and the second exposure area respectively.

31. The exposure apparatus according to claim 30, wherein the intermediate optical member has a first reflecting surface which reflects the first exposure light beam coming from the first area and a second reflecting surface which reflects the second exposure light beam coming from the second area.

32. The exposure apparatus according to claim 30, wherein:
the optical unit has a single optical element to which the substrate is arranged to be opposite;
the intermediate optical member guides the first exposure light beam from the first area and the second exposure light beam from the second area to the single optical element; and
the first exposure light beam and the second exposure light beam are radiated onto the first exposure area and the second exposure area respectively via the single optical element.

33. The exposure apparatus according to claim 30, wherein the light-receiving unit receives the detecting light beam not via the intermediate optical member.

34. The exposure apparatus according to claim 27, wherein the light-receiving unit receives, as the detecting light beam, a light beam from at least one of a first mark which is arranged in a predetermined positional relationship with respect to the first pattern and a second mark which is arranged in a predetermined positional relationship with respect to the second pattern.

35. The exposure apparatus according to claim 27, wherein the detecting system includes a radiation unit which radiates the detecting light beam onto at least one of the third area and the fourth area.

36. The exposure apparatus according to claim 35, wherein the detecting light beam has a wavelength which is different from that of the first and second exposure light beams.

37. The exposure apparatus according to claim 35, wherein the detecting light beam has a wavelength same as that of the first and second exposure light beams.

38. The exposure apparatus according to claim 27, wherein a part of at least one of the first exposure light beam and the second exposure light beam is radiated, as the detecting light beam, onto at least one of the third area and the fourth area.

39. The exposure apparatus according to claim 27, wherein the first exposure light beam and the second exposure light beam are radiated onto the first exposure area and the second exposure area respectively while adjusting the positional relationship between the first pattern and the second pattern based on the information obtained by the detecting system.

40. The exposure apparatus according to claim 27, wherein:
the optical unit is capable of forming an image of the first pattern in the first exposure area by radiating the first exposure light beam onto the first exposure area, and the optical unit is capable of forming an image of the second pattern in the second exposure area by radiating the second exposure light beam onto the second exposure area; and
a predetermined area on the substrate is subjected to multiple exposure with the image of the first pattern formed in the first exposure area and the image of the second pattern formed in the second exposure area.

41. A method for producing a device, comprising using the exposure apparatus as defined in claim 27.

42. An exposure method for exposing a substrate, the exposure method comprising:

radiating with an optical unit a first exposure light beam from a first area disposed on a first predetermined surface onto a first exposure area and radiating with the optical unit a second exposure light beam from a second area disposed on a second predetermined surface onto a second exposure area;
detecting a light beam via the first predetermined surface and the second predetermined surface, the light beam having one optical path, the optical path of the light beam being different from optical paths of the first and second exposure light beams; and
obtaining information about a positional relationship between a first pattern arranged in the first area and a second pattern arranged in the second area based on a detection result; and
receiving with a light-receiving unit, as the detecting light beam, at least one of a light beam from a third area which is disposed on the first predetermined surface and which is different from the first area and a light beam from a fourth area which is disposed on the second predetermined surface and which is different from the second area,
wherein the optical unit has a first optical system into which the first exposure light beam from the first area comes and a second optical system which is different from the first optical system and into which the second exposure light beam from the second area comes,
the first optical system is capable of supplying the light beam from the third area to the second optical system,
the second optical system is capable of supplying the light beam from the fourth area to the first optical system, and
the light-receiving unit receives, as the detecting light beam, at least one of the light beam from the third area and the light beam from the fourth area via the first optical system and the second optical system.

43. The exposure method according to claim 42, wherein the optical path of the light beam includes the first predetermined surface and the second predetermined surface in this order.

44. The exposure method according to claim 42, further comprising adjusting the positional relationship between the first pattern and the second pattern based on the information about the positional relationship.

45. The exposure method according to claim 44, wherein the positional relationship between the first and second patterns is adjusted at least during the radiation of the first and second exposure light beams.

46. The exposure method according to claim 44, wherein the positional relationship between the first and second patterns is adjusted at least before the substrate is exposed with the first and second exposure light beams.

47. The exposure method according to claim 42, wherein the information about the positional relationship between the first pattern and the second pattern is obtained by detecting marks arranged on the first predetermined surface and the second predetermined surface.

48. The exposure method according to claim 47, wherein the marks are arranged outside the first area and the second area.

49. The exposure method according to claim 42, wherein the light beam via the first predetermined surface and the second predetermined surface has a wavelength which is different from that of the first and second exposure light beams.

50. The exposure method according to claim 42, wherein the light beam via the first predetermined surface and the second predetermined surface has a wavelength same as that of the first and second exposure light beams.

51. The exposure method according to claim 42, wherein the substrate is subjected to multiple exposure with images of the first and second patterns formed in the first and second exposure areas by being irradiated with the first and second exposure light beams.

52. A method for producing a device, comprising:
performing multiple exposure for a substrate by using the exposure method as defined in claim 42;
developing the substrate subjected for which the multiple exposure has been performed; and
processing the developed substrate.

* * * * *